US012635400B2

(12) United States Patent
Yan et al.

(10) Patent No.: US 12,635,400 B2
(45) Date of Patent: May 19, 2026

(54) ORGANOMETALLIC COMPOUND AND APPLICATION THEREOF

(71) Applicant: GUANGDONG AGLAIA OPTOELECTRONIC MATERIALS CO., LTD., Foshan (CN)

(72) Inventors: Liangliang Yan, Foshan (CN); Lei Dai, Foshan (CN); Lifei Cai, Foshan (CN)

(73) Assignee: GUANGDONG AGLAIA OPTOELECTRONIC MATERIALS CO., LTD., Foshan (CN)

( * ) Notice: Subject to any disclaimer, the term of this patent is extended or adjusted under 35 U.S.C. 154(b) by 367 days.

(21) Appl. No.: 18/289,437

(22) PCT Filed: Feb. 26, 2022

(86) PCT No.: PCT/CN2022/078116

§ 371 (c)(1),
(2) Date: Nov. 3, 2023

(87) PCT Pub. No.: WO2022/233178

PCT Pub. Date: Nov. 10, 2022

(65) Prior Publication Data

US 2024/0292731 A1 Aug. 29, 2024

(30) Foreign Application Priority Data

May 6, 2021 (CN) ......................... 202110487685.7

(51) Int. Cl.
*H05B 33/14* (2006.01)
*C07F 15/00* (2006.01)
*C09K 11/00* (2006.01)
*C09K 11/06* (2006.01)
*H10K 50/11* (2023.01)
*H10K 50/12* (2023.01)
*H10K 85/00* (2023.01)
*H10K 85/30* (2023.01)

(52) U.S. Cl.
CPC ......... *H10K 85/00* (2023.02); *C07F 15/0033* (2013.01); *C09K 11/06* (2013.01); *H10K 85/342* (2023.02); *C09K 2211/1044* (2013.01); *C09K 2211/185* (2013.01); *H10K 50/12* (2023.02)

(58) Field of Classification Search
None
See application file for complete search history.

(56) References Cited

U.S. PATENT DOCUMENTS

| | | | |
|---|---|---|---|
| 6,687,266 | B1 | 2/2004 | Ma et al. |
| 8,367,223 | B2 | 2/2013 | Xia et al. |
| 9,837,622 | B2 | 12/2017 | Stoessel et al. |
| 10,211,413 | B2 | 2/2019 | Ma et al. |
| 10,312,458 | B2 | 6/2019 | Kottas et al. |
| 2017/0040552 | A1 | 2/2017 | Xia et al. |
| 2019/0157575 | A1 | 5/2019 | Xia |

FOREIGN PATENT DOCUMENTS

| | | | |
|---|---|---|---|
| CN | 1726606 | A | 1/2006 |
| CN | 101186624 | A | 5/2008 |
| CN | 102272261 | A | 12/2011 |
| CN | 102898477 | A | 1/2013 |
| CN | 103254238 | A | 8/2013 |
| CN | 103396455 | A | 11/2013 |
| CN | 104428392 | A | 3/2015 |
| CN | 107098938 | A | 8/2017 |
| CN | 108774266 | A | 11/2018 |
| CN | 109796499 | A | 5/2019 |

OTHER PUBLICATIONS

English translation of International Written Opinion for PCT/CN2022/078116, obtained from global dossier ip5, 2026.*

Wen, et al., "Highly Phosphorescent Bis-Cyclometalated Iridium Complexes Containing Benzoimidazole-Based Ligands," Chem. Mater., vol. 16, Issue 12, pp. 2480-2488 (May 21, 2004).

* cited by examiner

*Primary Examiner* — Sun Jae Yoo
(74) *Attorney, Agent, or Firm* — Maschoff Brennan

(57) ABSTRACT

The present invention relates to an organometallic compound and application thereof. The organometallic compound has a general formula of Ir(La)(Lb)(Lc), where La is a structure represented by Formula (1). The compound provided by the present invention has the advantages of high optical and electrical stability, narrow emission half-peak width, high color saturation, high luminous efficiency, long device service life and the like, and can be used in organic electroluminescent devices. In particular, the compound has the potential for application in the AMOLED industry as a green light-emitting dopant.

(1)

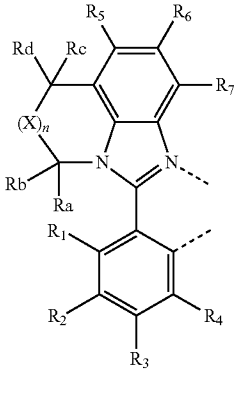

16 Claims, 2 Drawing Sheets

ORGANOMETALLIC COMPOUND AND APPLICATION THEREOF

TECHNICAL FIELD

The present invention relates to the technical field of organic electroluminescence, in particular to an organic light-emitting material applicable to organic electroluminescent devices, and specially relates to an organometallic compound and application thereof in an organic electroluminescent device.

BACKGROUND

At present, as a new-generation display technology, an organic electroluminescent device (OLED) has attracted more and more attention in display and lighting technologies, thus having a wide application prospect. However, compared with market application requirements, properties, such as luminous efficiency, driving voltage and service life, of the OLED still need to be strengthened and improved.

In generally, the OLED includes various organic functional material films with different functions sandwiched between metal electrodes as a basic structure, which is similar to a sandwich structure. Under the driving of a current, holes and electrons are injected from a cathode and an anode, respectively. After moving to a certain distance, the holes and the electrons are compounded in a light-emitting layer, and then released in the form of light or heat to achieve luminescence of the OLED.

However, organic functional materials are core components of the OLED, and the thermal stability, photochemical stability, electrochemical stability, quantum yield, film forming stability, crystallinity, color saturation and the like of the materials are main factors affecting properties of the device.

Generally, the organic functional materials include fluorescent materials and phosphorescent materials. The fluorescent materials are usually organic small-molecule materials, which can only utilize 25% of a singlet state for luminescence, so that the luminous efficiency is relatively low. Meanwhile, due to an earth-spin orbit coupling effect caused by a heavy atom effect, the phosphorescent materials can utilize 25% of a singlet state and can also utilize 75% of the energy of triplet excitons, so that the luminous efficiency can be improved. However, compared with the fluorescent materials, the phosphorescent materials are developed later, and the thermal stability, service life, color saturation and the like of the materials need to be improved. Thus, the 5 phosphorescent materials have become a challenging topic. Various organometallic compounds have been developed to serve as the phosphorescent materials. For example, an invention patent (CN1726606) discloses an arylbenzimidazole iridium compound. However, the luminous efficiency of the compound is far from enough to meet market demands. A non-patent document published by Wen et al. in 2004 (Chem. Mater. 2004, 10 16, 2480-2488) discloses a benzimidazole-aromatic ring metallic iridium complex, which has certain luminous efficiency. However, due to too large half-peak width and short device service life, especially short T95, of the material, market application demands are difficult to meet, and the material needs to be further improved. An invention patent document (CN102272261) discloses an iridium compound connected 15 with aryl-substituted benzimidazole having steric hindrance on N. However, the color saturation, the emission spectrum half-peak width and device properties, especially the luminous efficiency and the device service life, of the compound need to be improved. An invention patent document (CN103396455) discloses a substituted benzimidazole iridium compound connected with alkyl on N. Similarly, the compound also has the 20 problems of poor color saturation, too large emission spectrum half-peak width, low device efficiency, short device service life and the like, which need to be solved. An invention patent document (CN103254238) discloses an iridium compound connected with aryl-substituted benzimidazole-dibenzoheterocyclic ring having steric hindrance on N. However, the compound also has the problems of too large emission spectrum 25 half-peak width, low device efficiency, short device service life and the like, which need to be solved. An invention patent document (CN102898477) discloses an iridium compound shown as

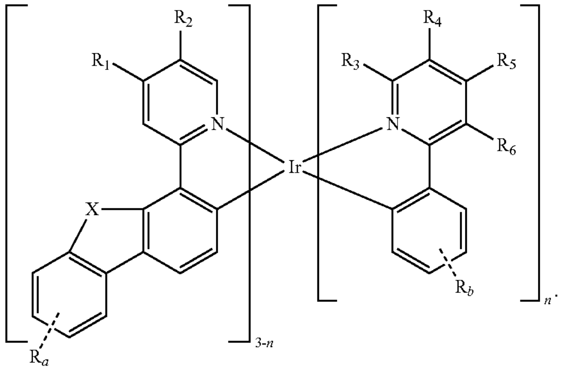

However, the compound also has the problems of too large emission spectrum half-peak width, low device efficiency, short device service life and the like, which need to be solved.

SUMMARY

In order to overcome the above disadvantages, the present invention provides an organic electroluminescent device with high properties and an organometallic compound material capable of realizing the organic electroluminescent device.

An organometallic compound of the present invention has a general formula of Ir(La)(Lb)(Lc), where La is a structure represented by Formula (1). The iridium complex provided by the present invention has the advantages of high optical and electrical stability, narrow emission half-peak width, high color saturation, high luminous efficiency, long device service life and the like, and can be used in organic electroluminescent devices. In particular, the compound has the potential for application in the AMOLED industry as a green light-emitting phosphorescent material.

An organometallic compound has a general formula of Ir(La)(Lb)(Lc), where La is a structure represented by Formula (1):

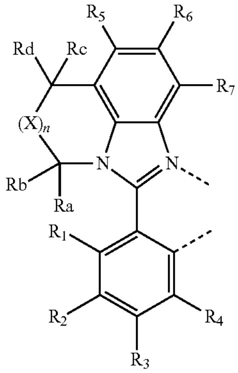

(1)

where dotted lines refer to positions connected to the metal Ir;

X is O, S, Se, CRpRq, SiRrRs or NRt;

n is an integer from 0 to 3, and when the n is equal to or greater than 2, multiple X groups are present at the same time and are the same or different;

Ra, Rb, Rc, Rd, Rp, Rq, Rr, Rs and Rt are independently selected from hydrogen, deuterium, halogen, substituted or unsubstituted $C_1$-$C_{10}$ alkyl, substituted or unsubstituted $C_3$-$C_{20}$ cycloalkyl, substituted or unsubstituted $C_6$-$C_{18}$ aryl, and substituted or unsubstituted $C_2$-$C_{17}$ heteroaryl;

$R_1$-$R_7$ are independently selected from hydrogen, deuterium, halogen, hydroxyl, sulfhydryl, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_2$-$C_{10}$ alkenyl, substituted or unsubstituted $C_2$-$C_{10}$ alkynyl, substituted or unsubstituted $C_6$-$C_{18}$ aryl, substituted or unsubstituted $C_2$-$C_{17}$ heteroaryl, substituted or unsubstituted tri-$C_1$-$C_{10}$ alkyl silyl, substituted or unsubstituted tri-$C_6$-$C_{12}$ aryl silyl, substituted or unsubstituted di-$C_1$-$C_{10}$ alkyl mono-$C_6$-$C_{30}$ aryl silyl, and substituted or unsubstituted mono-$C_1$-$C_{10}$ alkyl di-$C_6$-$C_{30}$ aryl silyl, or any two adjacent groups of the $R_1$-$R_7$ are connected to each other to form an aliphatic ring structure or an aromatic ring structure;

the heteroalkyl and the heteroaryl at least contain one O, N or S heteroatom;

both Lb and Lc are a monoanionic bidentate ligand, the La, the Lb and the Lc are the same or at least one is different, and the different indicates different parent nuclear structures, a same parent nuclear structure with different substituents, or a same parent nuclear structure with different substituent positions;

and the "substituted" refers to substitution with deuterium, F, Cl, Br, $C_1$-$C_6$ alkyl, $C_3$-$C_6$ cycloalkyl, amino substituted with $C_1$-$C_6$ alkyl, cyano, isocyano, or phosphino, and the substitution ranges from a single substitution number to a maximum substitution number.

Optionally, the X is CRpRq; the Ra, the Rb, the Rc, the Rd, the Rp and the Rq are independently selected from hydrogen, deuterium, halogen, substituted or unsubstituted $C_1$-$C_{10}$ alkyl, and substituted or unsubstituted $C_3$-$C_{20}$ cycloalkyl;

and the "substituted" refers to substitution with deuterium, F, Cl, Br, $C_1$-$C_6$ alkyl, and $C_3$-$C_6$ cycloalkyl, and the substitution ranges from a single substitution number to a maximum substitution number.

More optionally, the $R_4$ and the $R_7$ are independently selected from hydrogen, the $R_1$-$R_3$ and the $R_5$-$R_6$ are independently selected from hydrogen, deuterium, halogen, hydroxyl, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_6$-$C_{18}$ aryl, and substituted or unsubstituted $C_2$-$C_{17}$ heteroaryl, or any two adjacent groups of the $R_1$-$R_2$ are connected to each other to form an aliphatic ring.

Further optionally, the Ra, the Rb, the Rc, the Rd, the Rp and the Rq are independently selected from hydrogen, deuterium, and substituted or unsubstituted $C_1$-$C_{10}$ alkyl;

the $R_4$ and the $R_7$ are independently selected from hydrogen; the $R_3$, the $R_5$ and the $R_6$ are independently selected from hydrogen, deuterium, halogen, substituted or unsubstituted $C_1$-$C_{10}$ alkyl, substituted or unsubstituted $C_3$-$C_{20}$ cycloalkyl, and substituted or unsubstituted $C_6$-$C_{18}$ aryl; and the $R_1$ and the $R_2$ are selected from hydrogen, deuterium, halogen, hydroxyl, substituted or unsubstituted $C_1$-$C_{10}$ alkyl, substituted or unsubstituted $C_1$-$C_{10}$ heteroalkyl, substituted or unsubstituted $C_6$-$C_{18}$ aryl, and substituted or unsubstituted $C_2$-$C_{17}$ heteroaryl, or any two adjacent groups are connected to each other to form an aliphatic ring.

As a optional organometallic compound, the Lb is a structure represented by Formula (2):

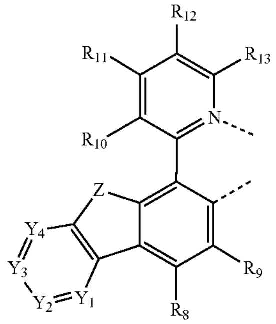

(2)

where dotted lines refer to positions connected to the metal Ir;

$Y_1$-$Y_4$ are independently selected from $CR_0$ or N;

Z is O, S, Se, CRpRq, SiRrRs or NRt;

$R_0$ and $R_8$-$R_{13}$ are independently selected from hydrogen, deuterium, halogen, hydroxyl, sulfhydryl, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_2$-$C_{10}$ alkenyl, substituted or unsubstituted $C_2$-$C_{10}$ alkynyl, substituted or unsubstituted $C_6$-$C_{18}$ aryl, substituted or unsubstituted $C_2$-$C_{17}$ heteroaryl, substituted or unsubstituted tri-$C_1$-$C_{10}$ alkyl silyl, substituted or unsubstituted tri-$C_6$-$C_{12}$ aryl silyl, substituted or unsubstituted di-$C_1$-$C_{10}$ alkyl mono-$C_6$-$C_{30}$ aryl silyl, and substituted or unsubstituted mono-$C_1$-$C_{10}$ alkyl di-$C_6$-$C_{30}$ aryl silyl, or any two adjacent groups of the $R_8$-$R_{13}$ may be connected to each other to form an aliphatic ring structure or an aromatic ring structure;

the heteroalkyl and the heteroaryl at least contain one O, N or S heteroatom;

Rp, Rq, Rr, Rs and Rt are defined the same as above;

and the "substituted" refers to substitution with deuterium, F, Cl, Br, $C_1$-$C_6$ alkyl, $C_3$-$C_6$ cycloalkyl, amino substituted with $C_1$-$C_6$ alkyl, cyano, isocyano, or phosphino, and the substitution ranges from a single substitution number to a maximum substitution number.

Optionally, the $Y_1$-$Y_3$ are independently selected from $CR_0$; the $Y_4$ is independently selected from $CR_0$ or N;

the Z is O;

the $R_0$ and the $R_8$-$R_{13}$ are independently selected from hydrogen, deuterium, halogen, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_6$-$C_{18}$ aryl, and substituted or unsubstituted $C_2$-$C_{17}$ heteroaryl, or any two adjacent groups of the $R_8$-$R_{13}$ may be connected to each other to form an aliphatic ring structure or an aromatic ring structure;

and the "substituted" refers to substitution with deuterium, F, Cl, Br, $C_1$-$C_6$ alkyl, and $C_3$-$C_6$ cycloalkyl, and the substitution ranges from a single substitution number to a maximum substitution number.

Further optionally, the $R_0$, the $R_9$ and the $R_{10}$ are independently selected from hydrogen, the $R_{11}$-$R_{13}$ are independently selected from hydrogen, deuterium, halogen, substituted or unsubstituted $C_1$-$C_{10}$ alkyl, substituted or unsubstituted $C_1$-$C_{10}$ heteroalkyl, and substituted or unsubstituted $C_3$-$C_{20}$ cycloalkyl, or any two adjacent groups of the $R_8$-$R_{13}$ may be connected to each other to form an aliphatic ring structure or an aromatic ring structure.

As a optional organometallic compound, the Lc is the same as the La or the Lb, and the La is different from the Lb.

As a optional organometallic compound, the Lc is a structure represented by Formula (3):

(3)

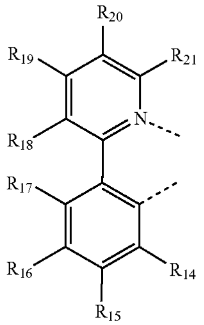

where dotted lines refer to positions connected to the metal Ir;

$R_{14}$-$R_{21}$ are independently selected from hydrogen, deuterium, halogen, hydroxyl, sulfhydryl, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_2$-$C_{10}$ alkenyl, substituted or unsubstituted $C_2$-$C_{10}$ alkynyl, substituted or unsubstituted $C_6$-$C_{18}$ aryl, substituted or unsubstituted $C_2$-$C_{17}$ heteroaryl, substituted or unsubstituted tri-$C_1$-$C_{10}$ alkyl silyl, substituted or unsubstituted tri-$C_6$-$C_{12}$ aryl silyl, substituted or unsubstituted di-$C_1$-$C_{10}$ alkyl mono-$C_6$-$C_{30}$ aryl silyl, and substituted or unsubstituted mono-$C_1$-$C_{10}$ alkyl di-$C_6$-$C_{30}$ aryl silyl, or any two adjacent groups of the $R_{14}$-$R_{21}$ may be connected to each other to form an aliphatic ring structure or an aromatic ring structure;

the heteroalkyl and the heteroaryl at least contain one O, N or S heteroatom;

and the "substituted" refers to substitution with deuterium, F, Cl, Br, $C_1$-$C_6$ alkyl, $C_3$-$C_6$ cycloalkyl, amino substituted with $C_1$-$C_6$ alkyl, cyano, isocyano, or phosphino, and the substitution ranges from a single substitution number to a maximum substitution number.

Optionally, the $R_{14}$-$R_{21}$ are independently selected from hydrogen, deuterium, halogen, hydroxyl, sulfhydryl, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_6$-$C_{18}$ aryl, and substituted or unsubstituted $C_2$-$C_{17}$ heteroaryl, or any two adjacent groups of the $R_{14}$-$R_{21}$ may be connected to each other to form an aliphatic ring structure or an aromatic ring structure;

the heteroalkyl and the heteroaryl at least contain one O, N or S heteroatom;

and the "substituted" refers to substitution with deuterium, F, Cl, Br, $C_1$-$C_6$ alkyl, and $C_3$-$C_6$ cycloalkyl, and the substitution ranges from a single substitution number to a maximum substitution number.

Optionally, the $R_{17}$ and the $R_{18}$ are connected to each other to form a five-membered or six-membered aliphatic ring or aromatic ring structure.

As a optional organometallic compound, the La optionally has one of the following structural formulas, or is partially or completely deuterated or fluorinated correspondingly, La001

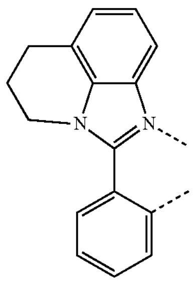

La002

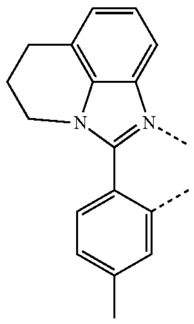

-continued
La003
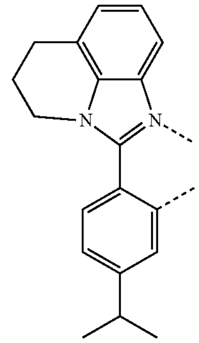
La004
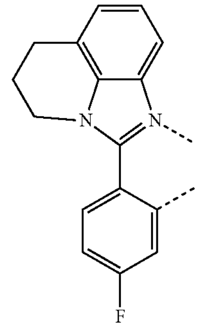
La005
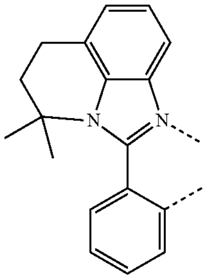
La006
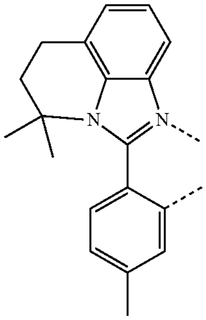
La007
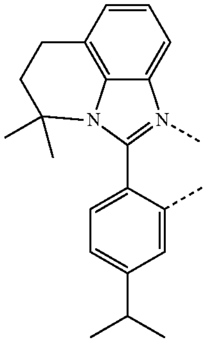
-continued
La008
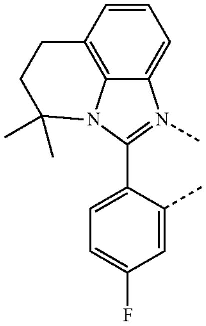
La009
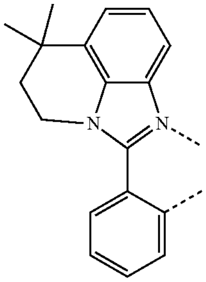
La010
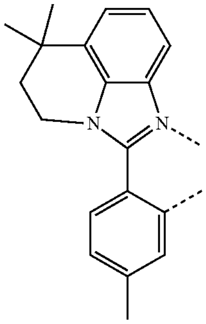
La011
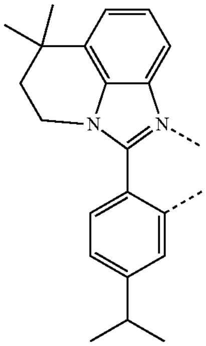
La012
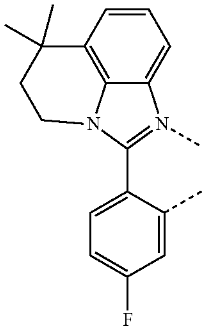

-continued
La013
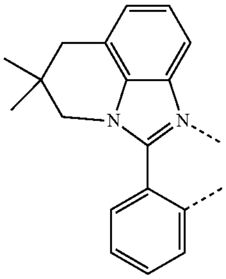
La014
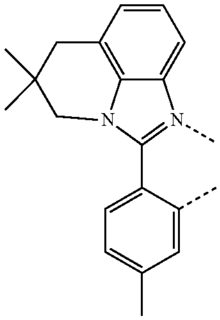
La015
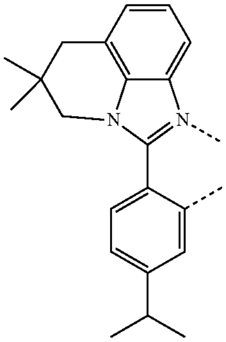
La016
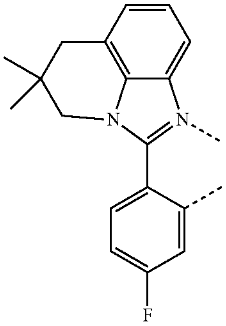
La017
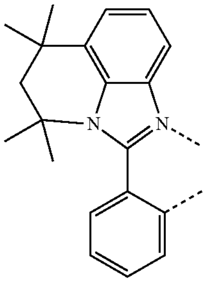
-continued
La018
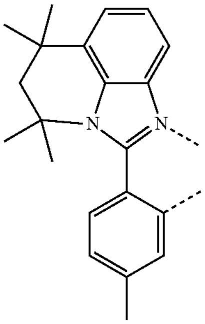
La019
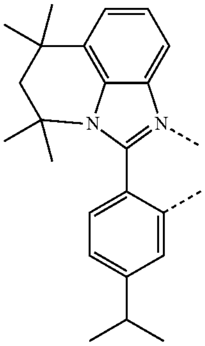
La020
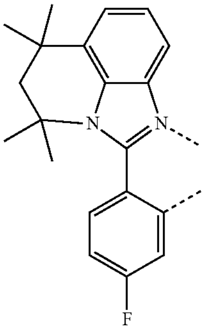
La021
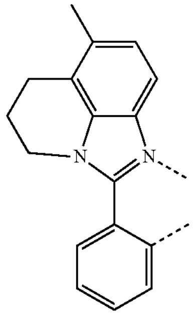

-continued
La022
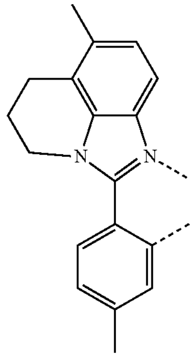
La023
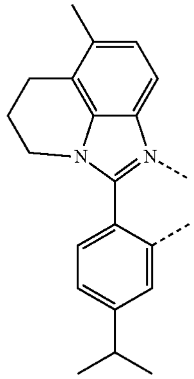
La024
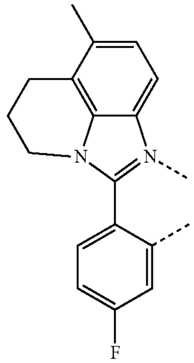
La025
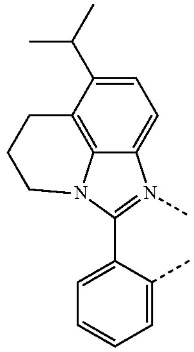
-continued
La026
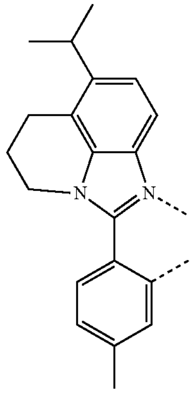
La027
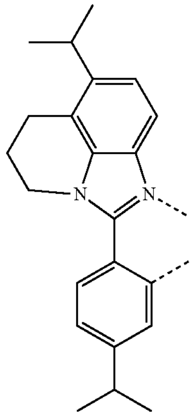
La028
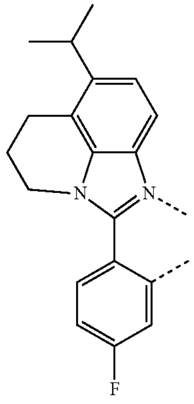
La029
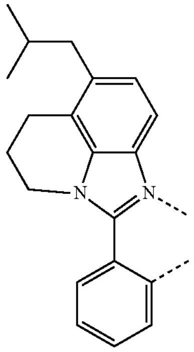

-continued
La030
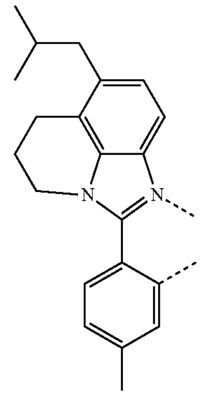
La031
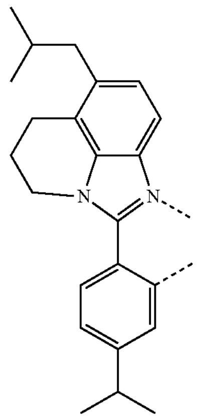
La032
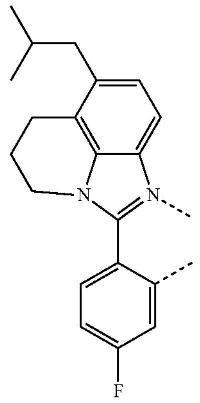
La033
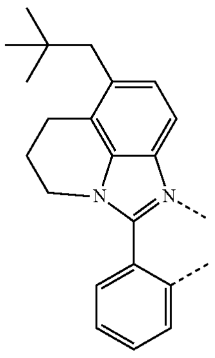
-continued
La034
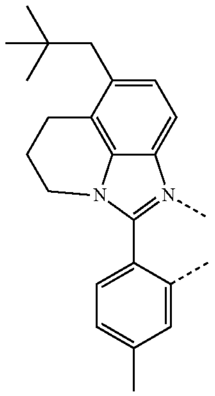
La035
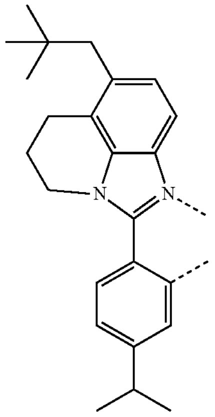
La036
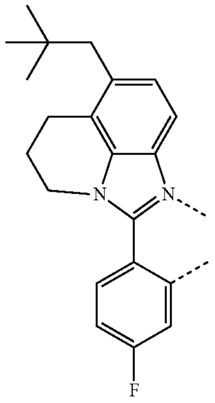
La037
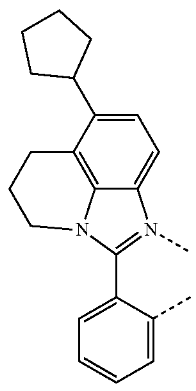

-continued
La038
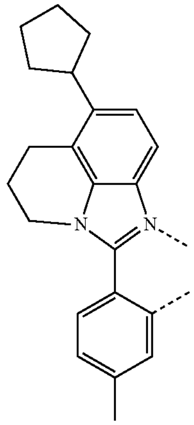
La039
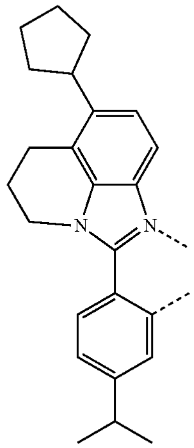
La040
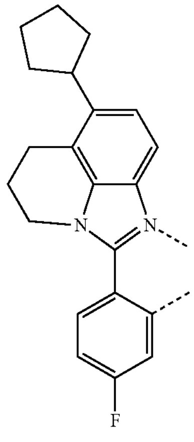
-continued
La041
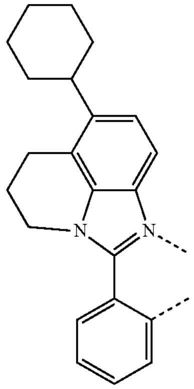
La042
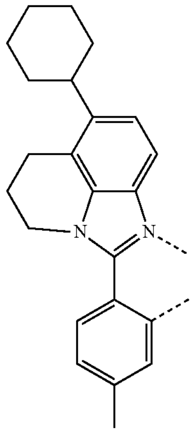
La043
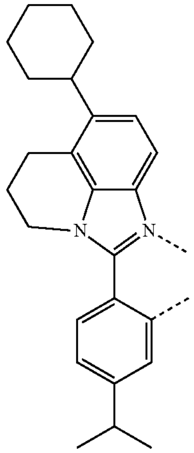

-continued
La044
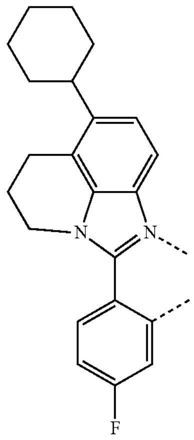
La045
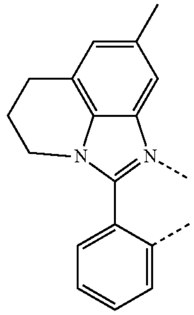
La046
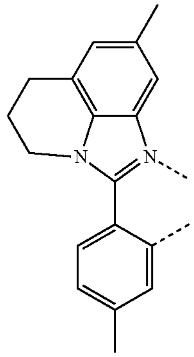
La047
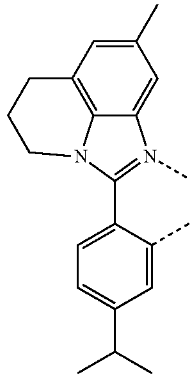
-continued
La048
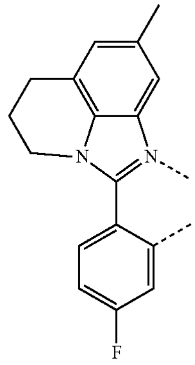
La049
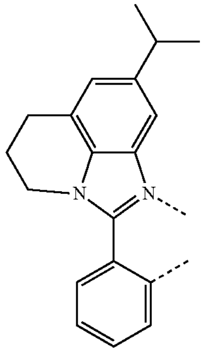
La050
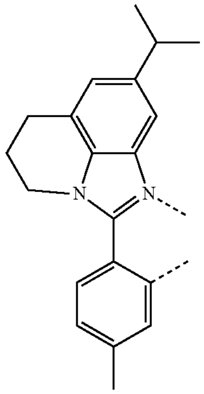
La051
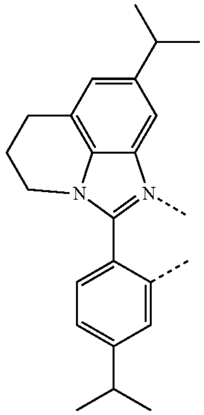

-continued
La052
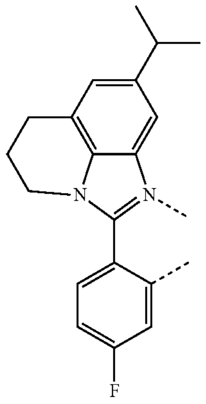
La053
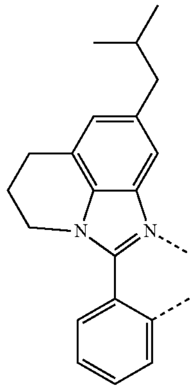
La054
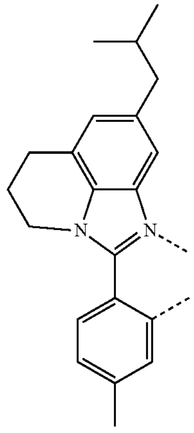
-continued
La055
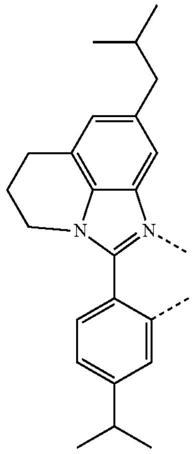
La056
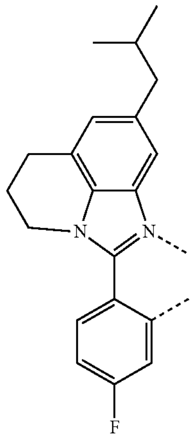
La057
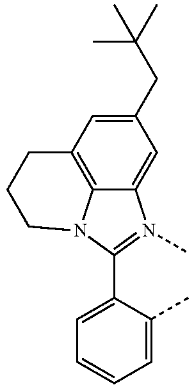

-continued
La058
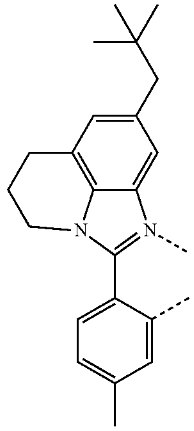
La059
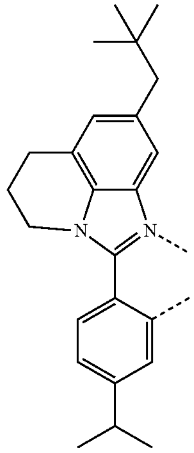
La060
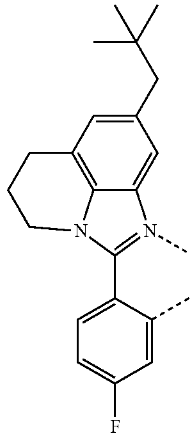
-continued
La061
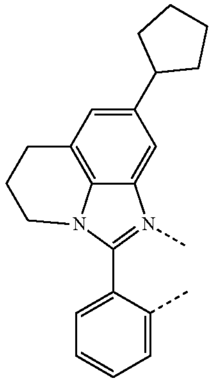
La062
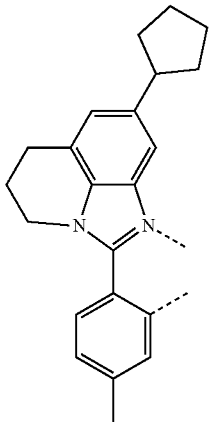
La063
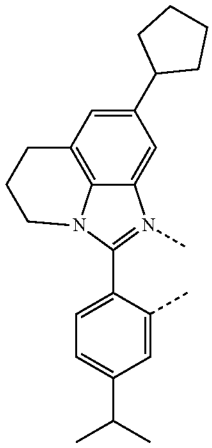

-continued
La064
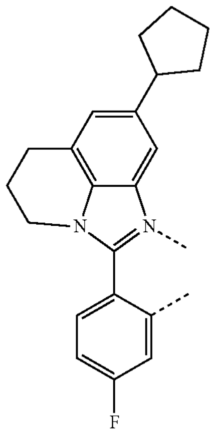
La065
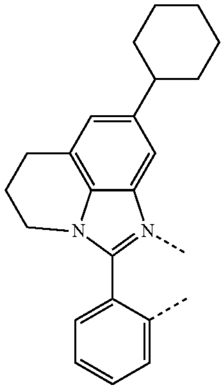
La066
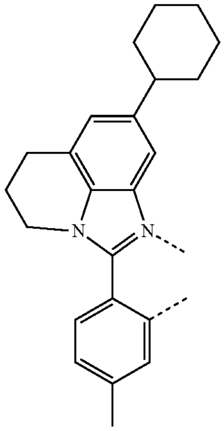
-continued
La067
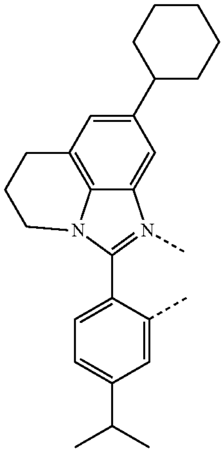
La068
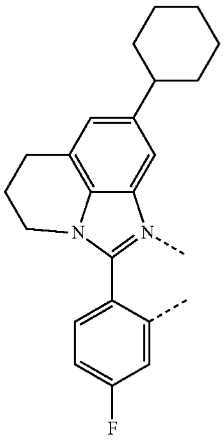
La069
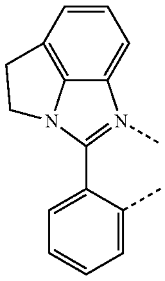
La070
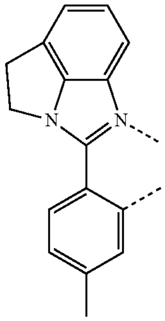

-continued
La071
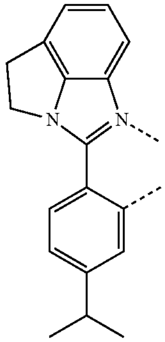
La072
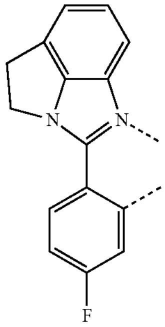
La073
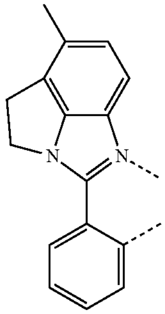
La074
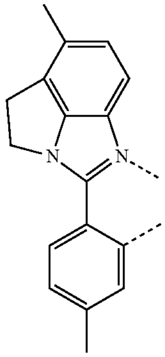
-continued
La075
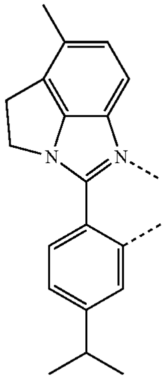
La076
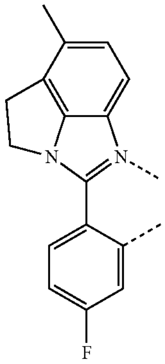
La077
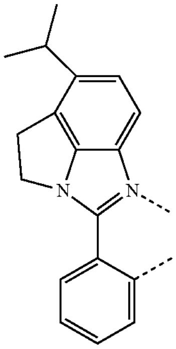
La078
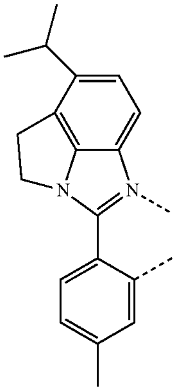

-continued
La079
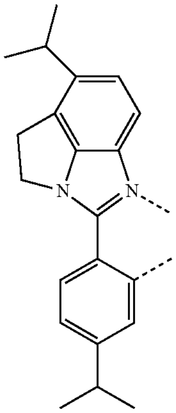
La080
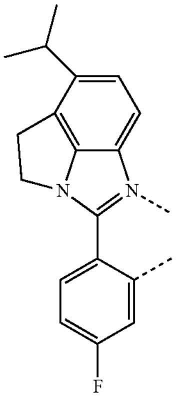
La081
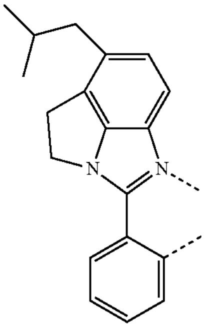
La082
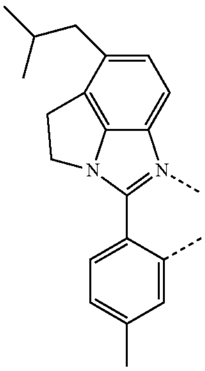
-continued
La083
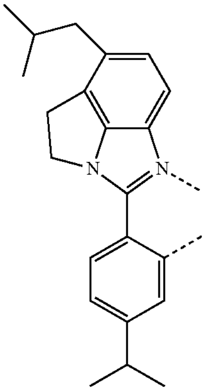
La084
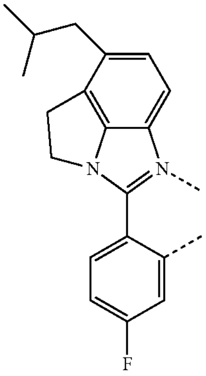
La085
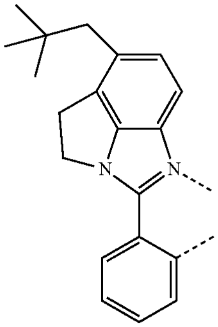
La086
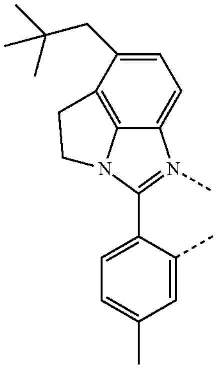

-continued
La087
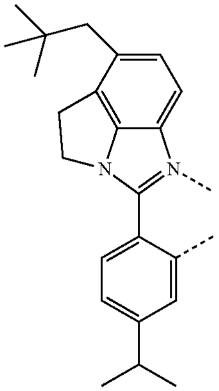
La088
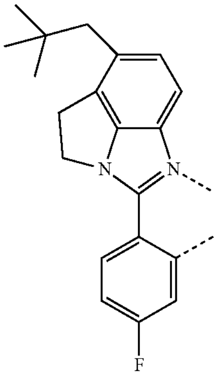
La089
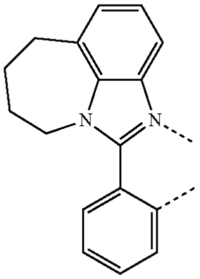
La090
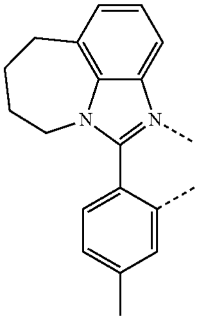
-continued
La091
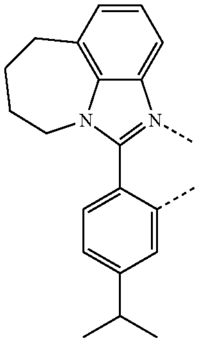
La092
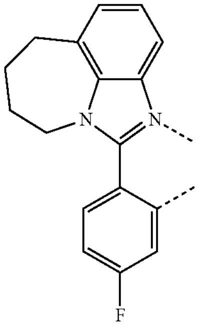
La093
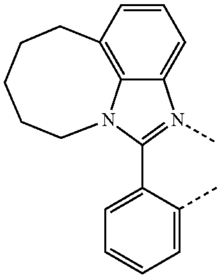
La094
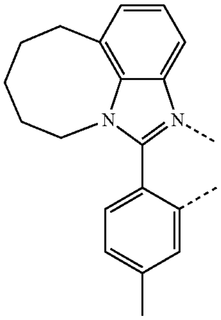
La095
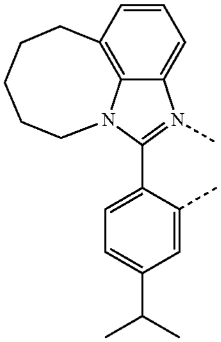

-continued
La096
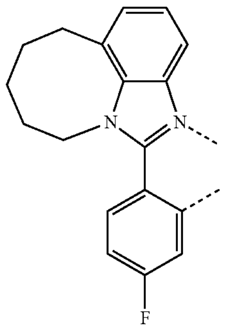
La097
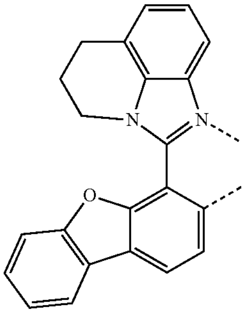
La098
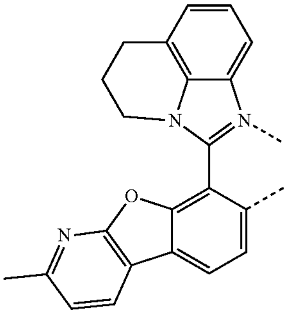
La099
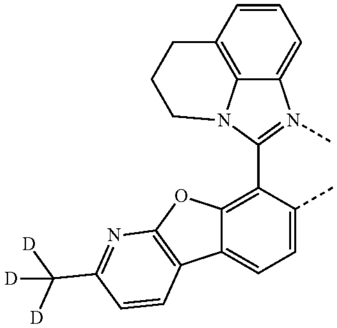
-continued
La100
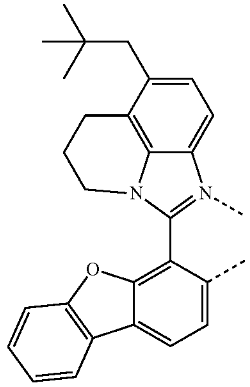
La101
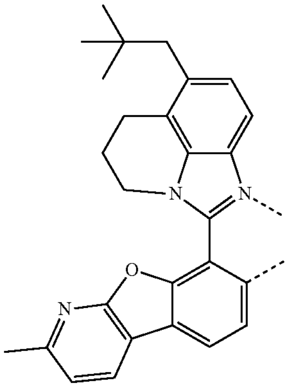
La102
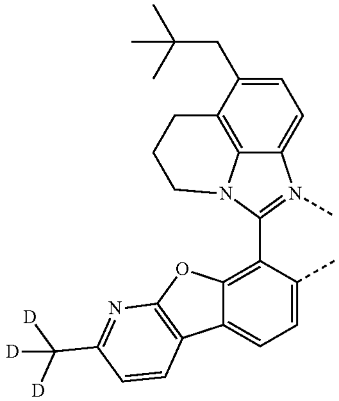
La103
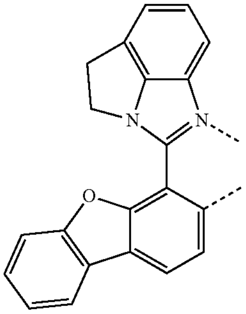

-continued
La104
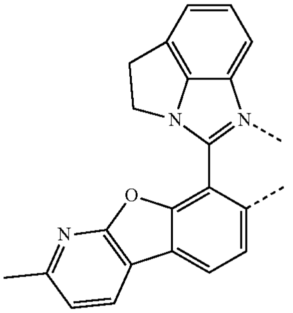
La105
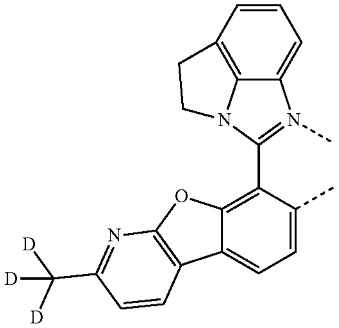
La106
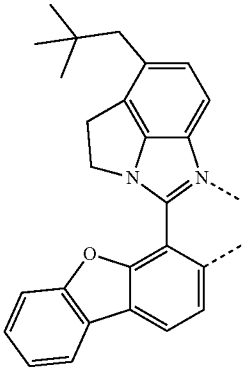
La107
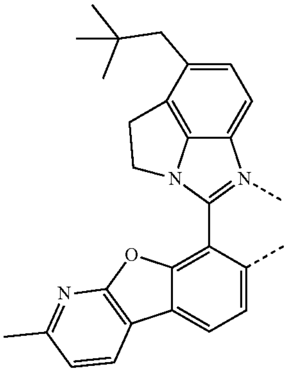
-continued
La108
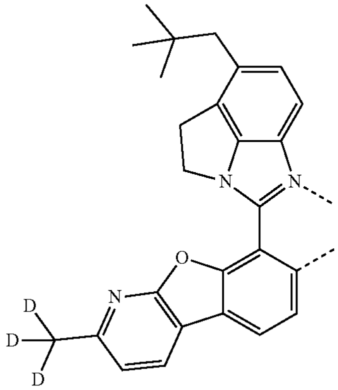
La109
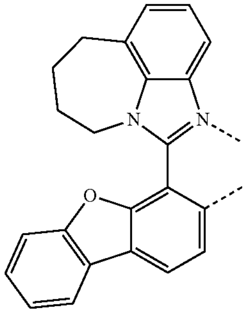
La110
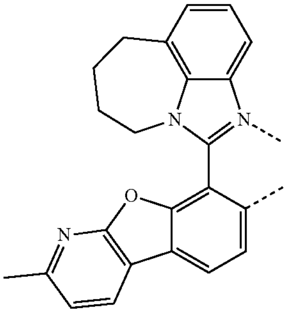
La111
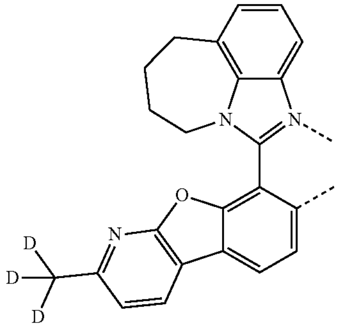

-continued
La112
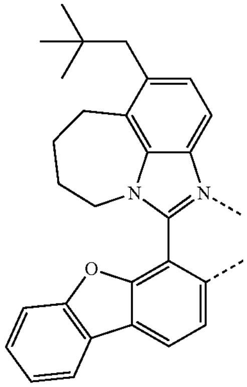
La113
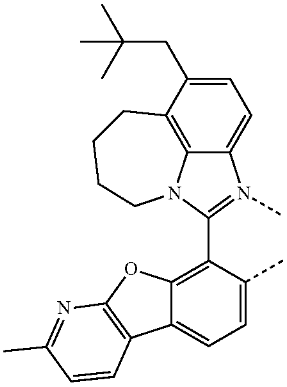
La114
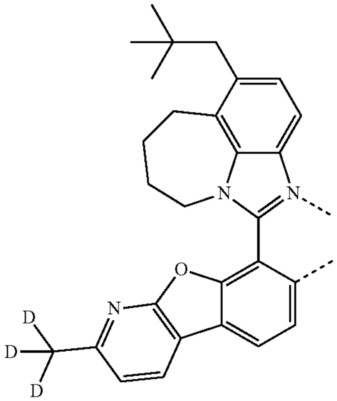
La115
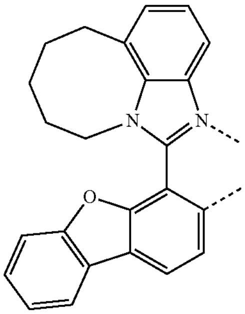
-continued
La116
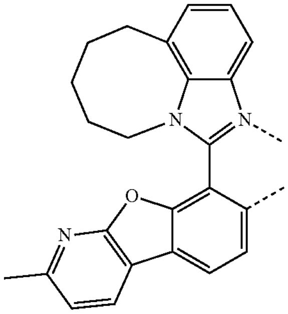
La117
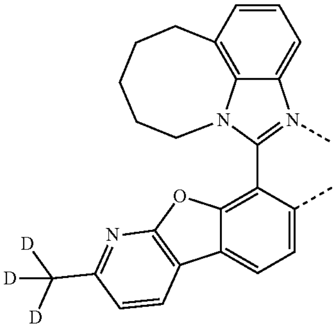
La118
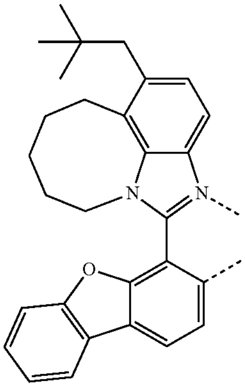
La119
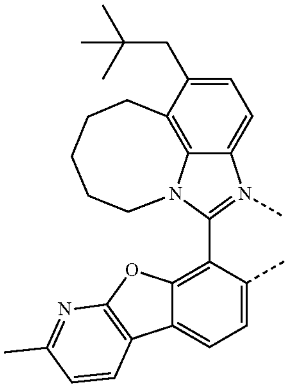

-continued
La120
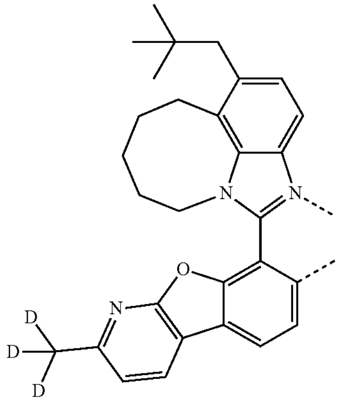
As a optional organometallic compound, the Lb optionally has one of the following structural formulas, or is partially or completely deuterated or fluorinated correspondingly,
Lb001
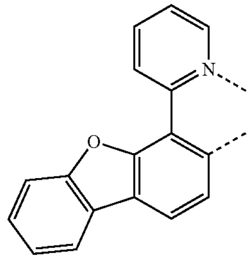
Lb002
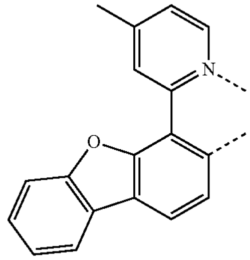
Lb003
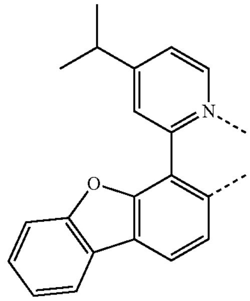
-continued
Lb004
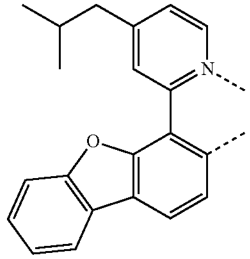
Lb005
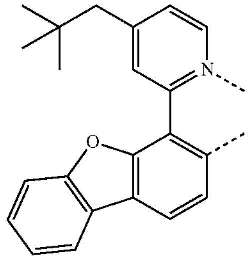
Lb006
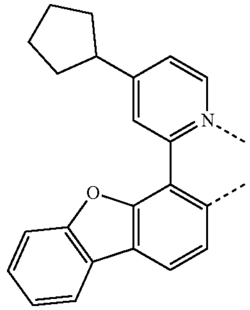
Lb007
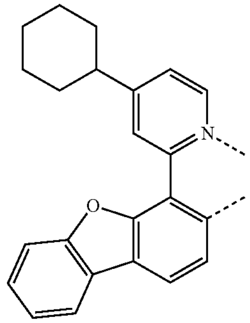
Lb008
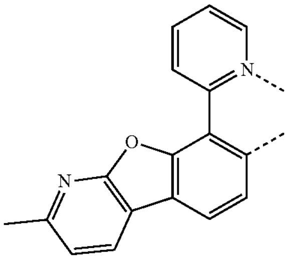

-continued
Lb009
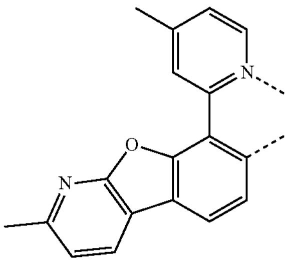
Lb010
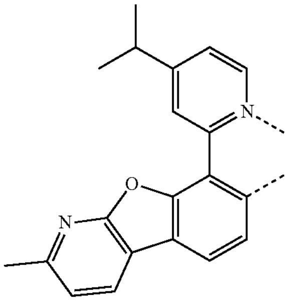
Lb011
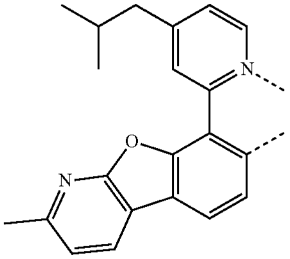
Lb012
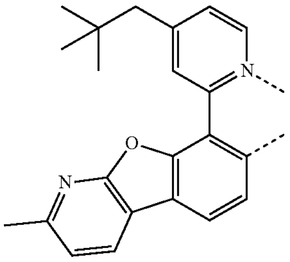
Lb013
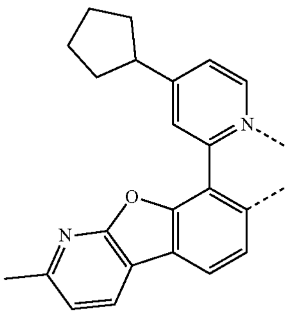
-continued
Lb014
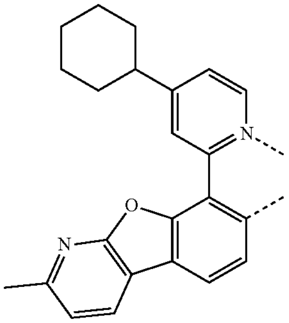
Lb015
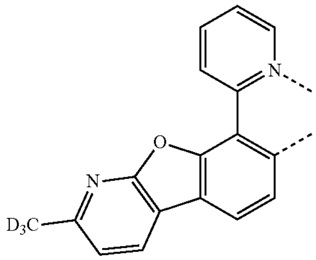
Lb016
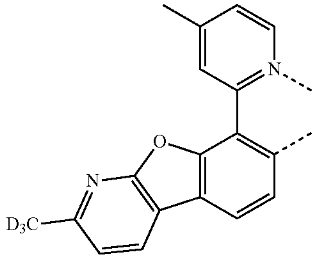
Lb017
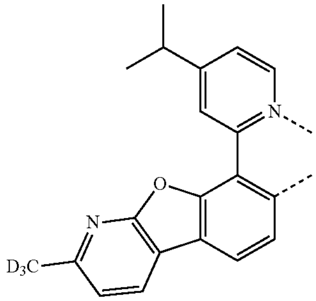
Lb018
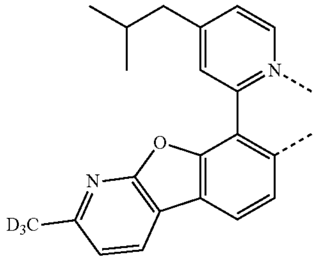

-continued
Lb019
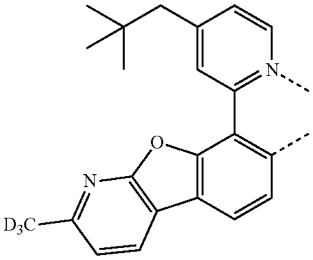
Lb020
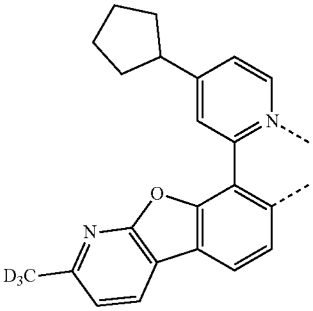
Lb021
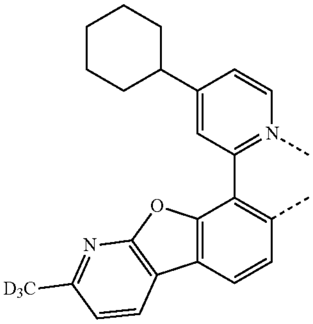
Lb022
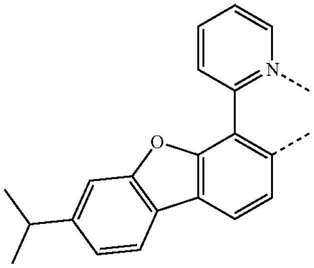
Lb023
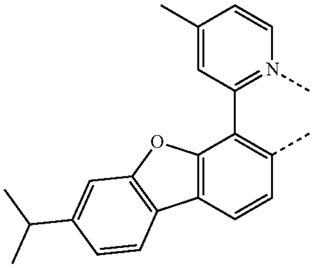
-continued
Lb024
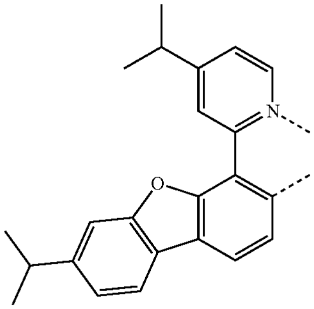
Lb025
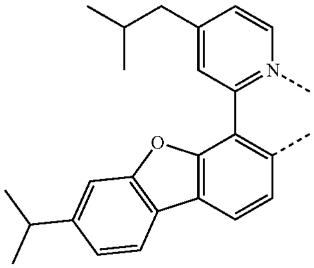
Lb026
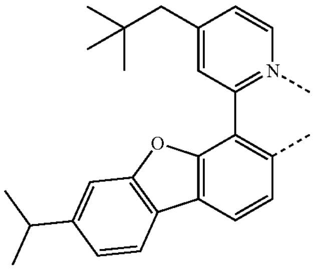
Lb027
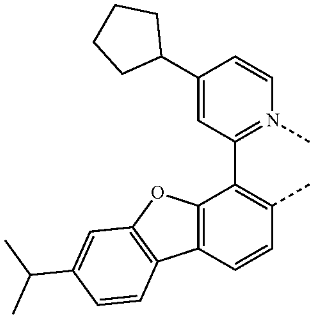
Lb028
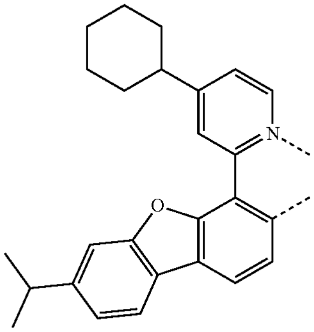

Lb029
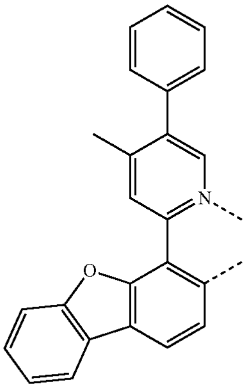
Lb030
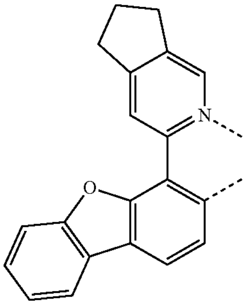
Lb031
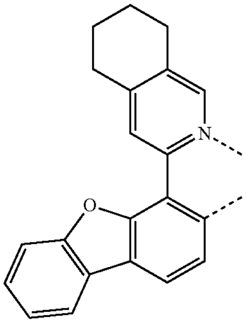
Lb032
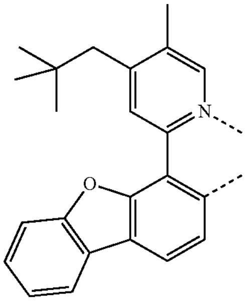
Lb033
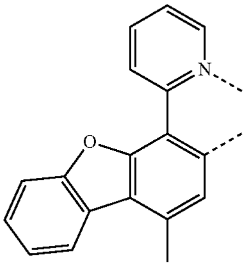
Lb034
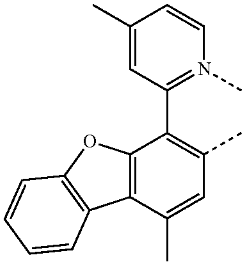
Lb035
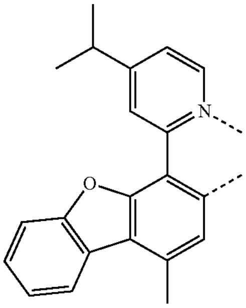
Lb036
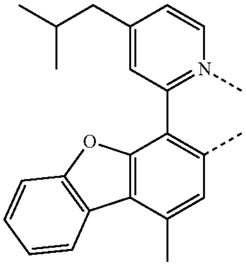
Lb037
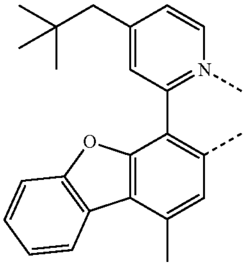
Lb038
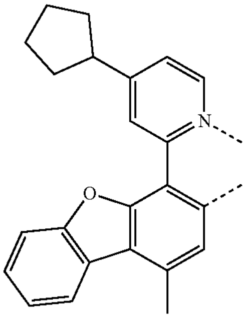

-continued
Lb039
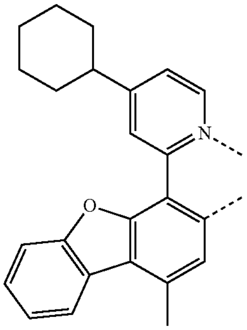
Lb040
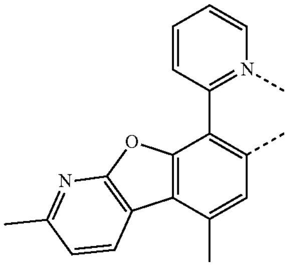
Lb041
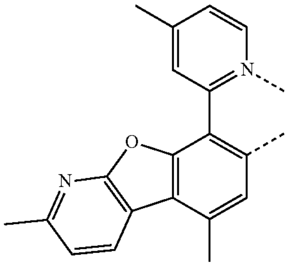
Lb042
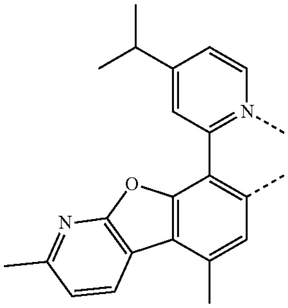
Lb043
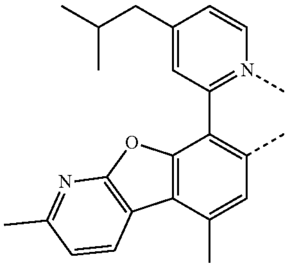
-continued
Lb044
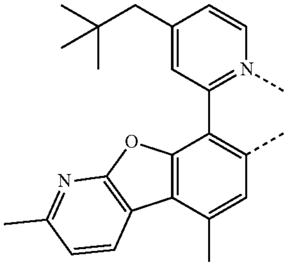
Lb045
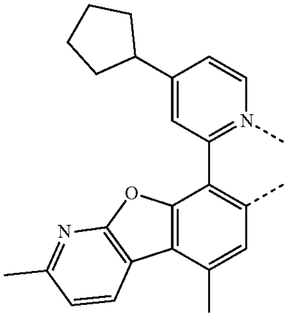
Lb046
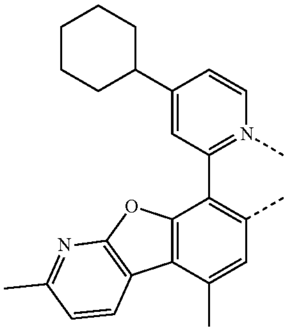
Lb047
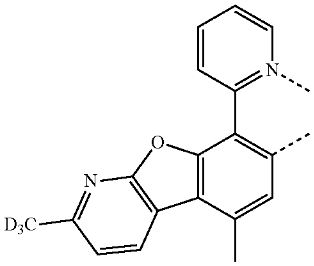
Lb048
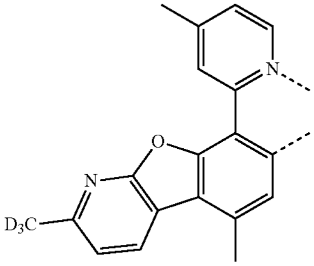

-continued
Lb049
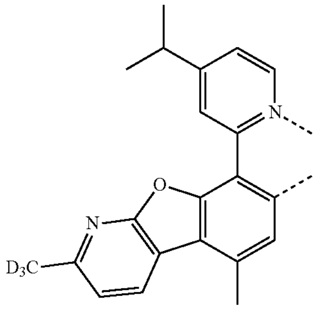
Lb050
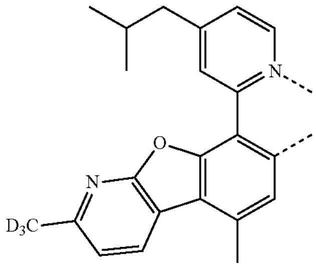
Lb051
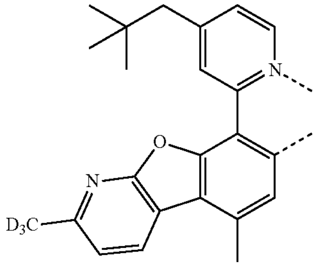
Lb052
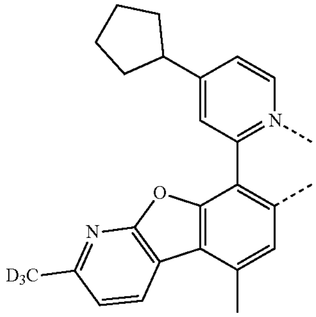
Lb053
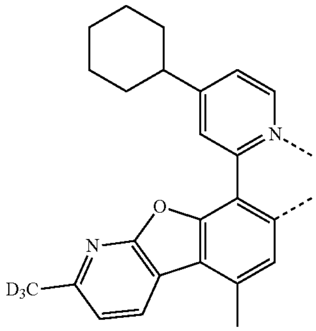
-continued
Lb054
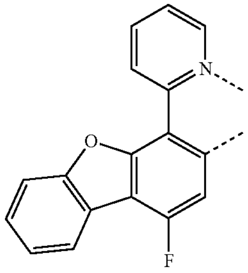
Lb055
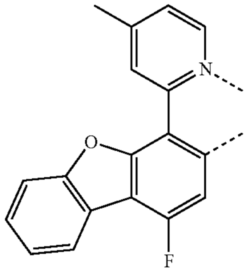
Lb056
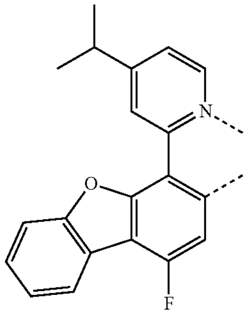
Lb057
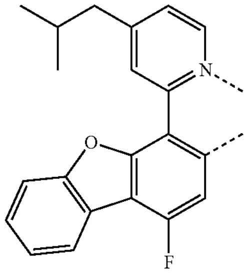
Lb058
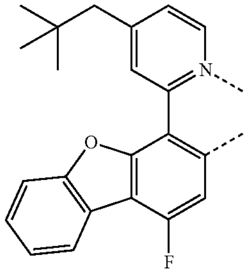

Lb059
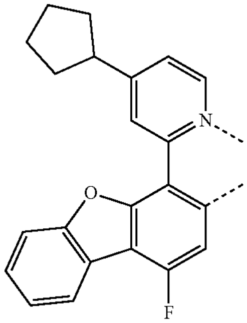
Lb060
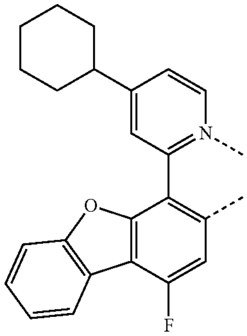
Lb061
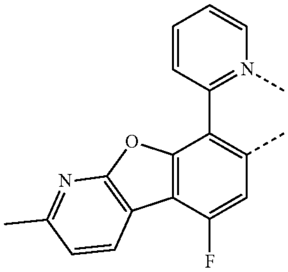
Lb062
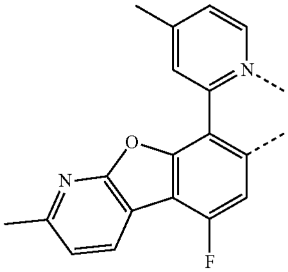
Lb063
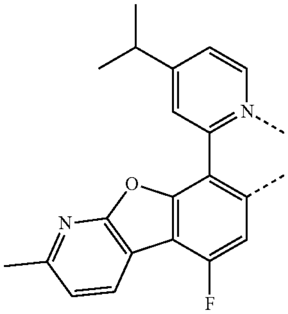
Lb064
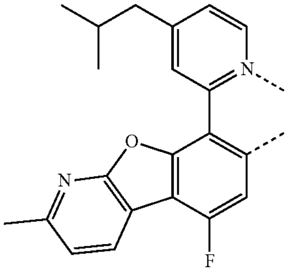
Lb065
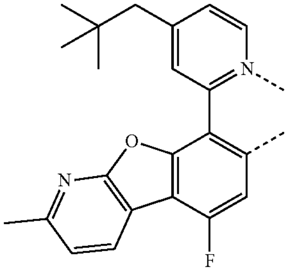
Lb066
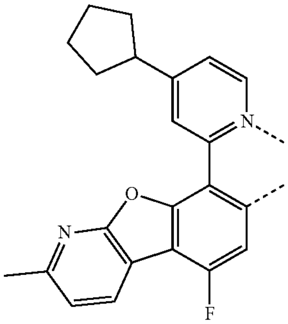
Lb067
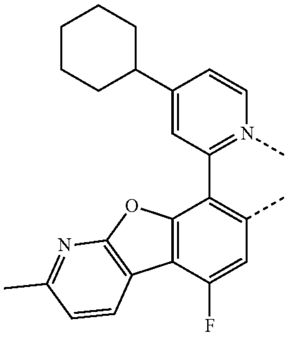
Lb068
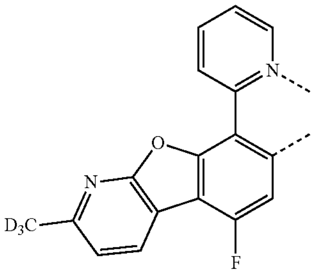

-continued
Lb069
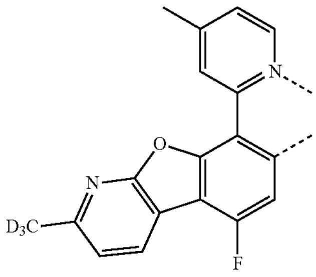
Lb070
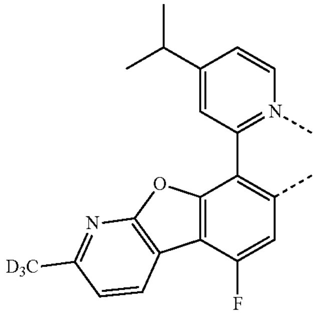
Lb071
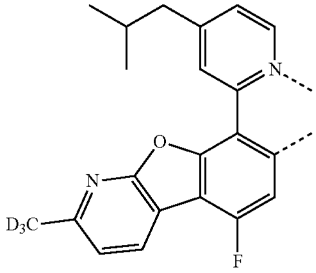
Lb072
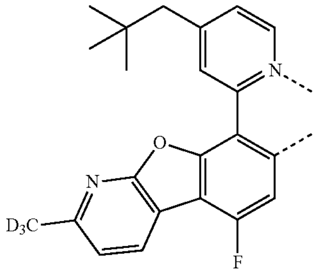
Lb073
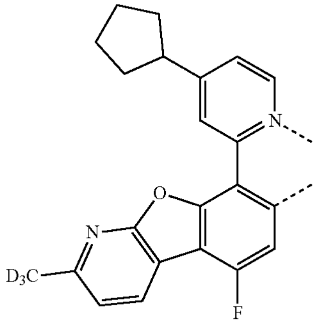
-continued
Lb074
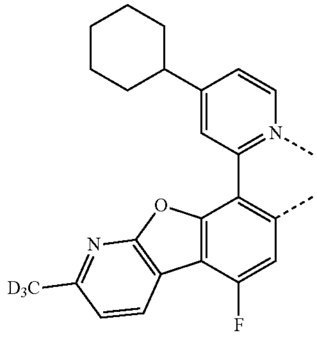
Lb075
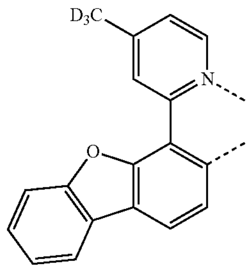
Lb076
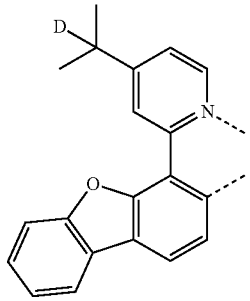
Lb077
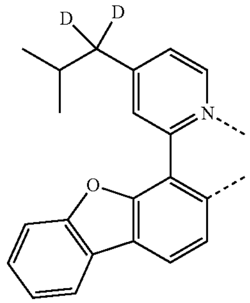
Lb078
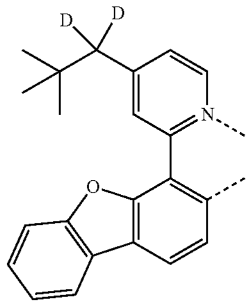

-continued
Lb079
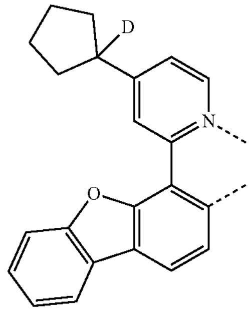
Lb080
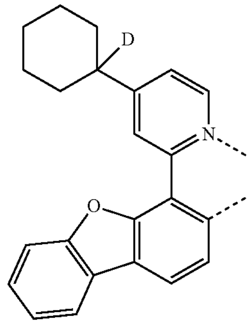
Lb081
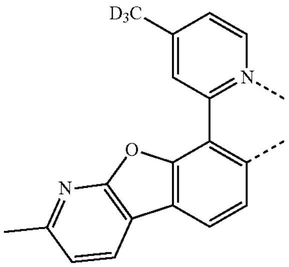
Lb082
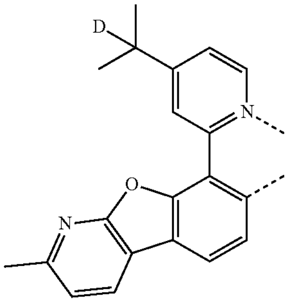
Lb083
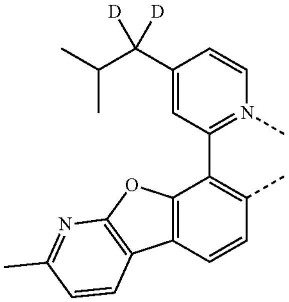
-continued
Lb084
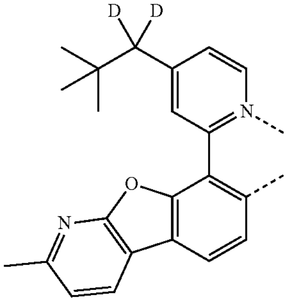
Lb085
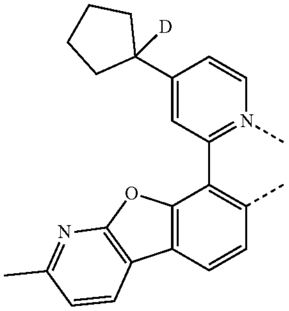
Lb086
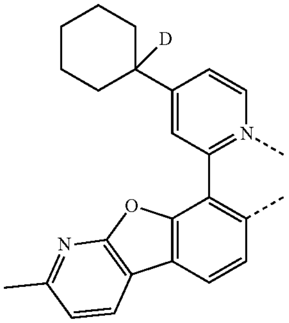
Lb087
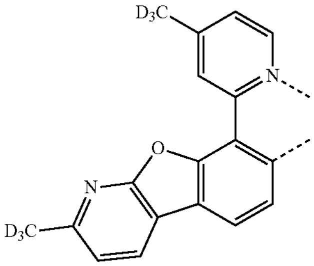
Lb088
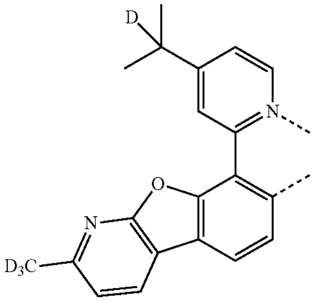

-continued
Lb089
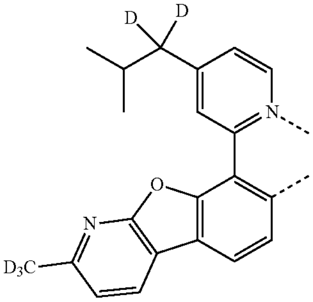
Lb090
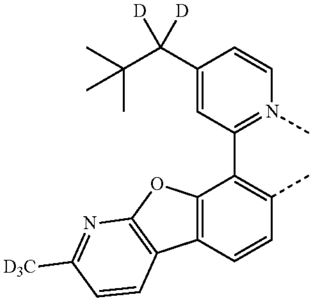
Lb091
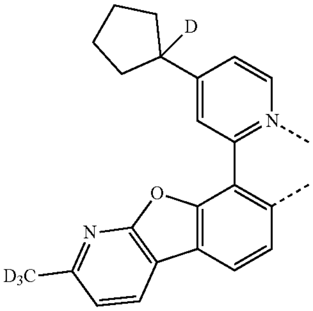
Lb092
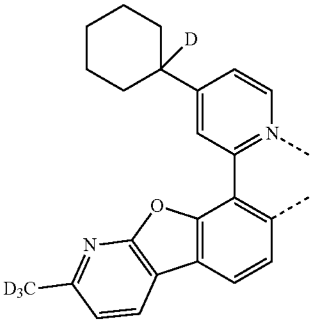
As a optional organometallic compound, the Lc optionally has one of the following structural formulas, or is partially or completely deuterated or fluorinated correspondingly.
Lc001
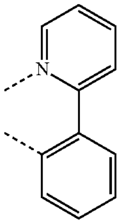
Lc002
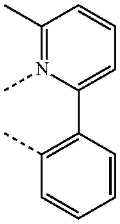
Lc003
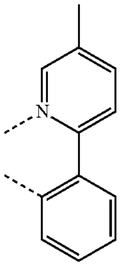
Lc004
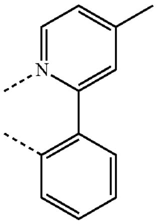
Lc005
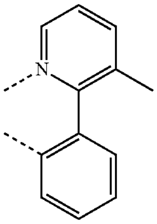
Lc006
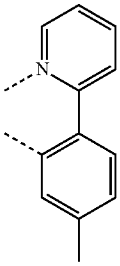

-continued
Lc007
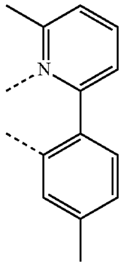
Lc008
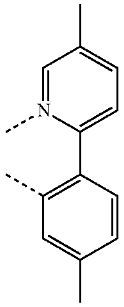
Lc009
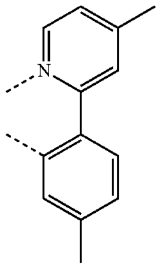
Lc010
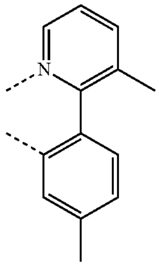
Lc011
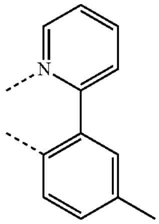
Lc012
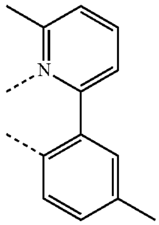
-continued
Lc013
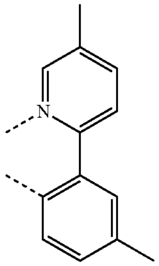
Lc014
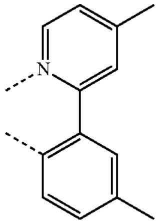
Lc015
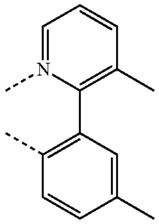
Lc016
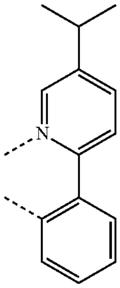
Lc017
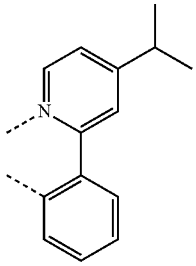
Lc018
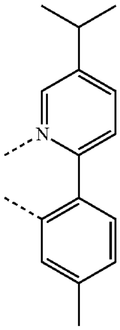

-continued
Lc019
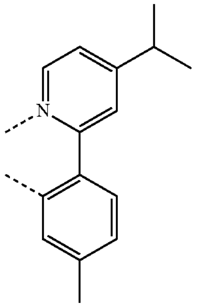
Lc020
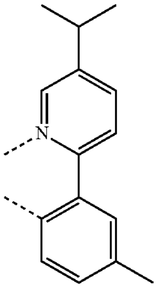
Lc021
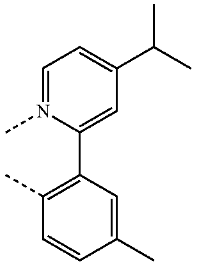
Lc022
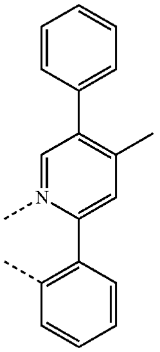
Lc023
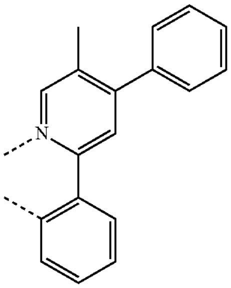
-continued
Lc024
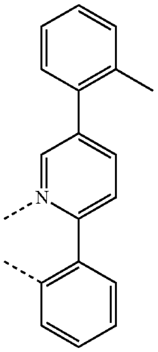
Lc025
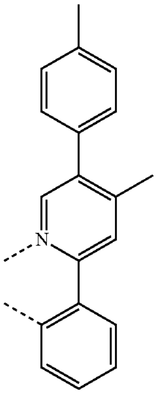
Lc026
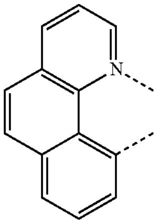
Lc027
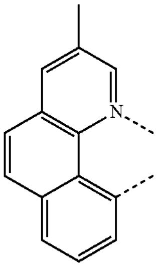
Lc028
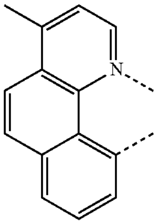

-continued
Lc029
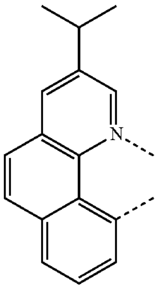
Lc030
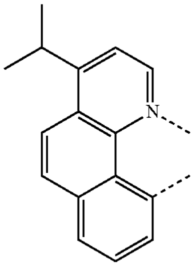
Lc031
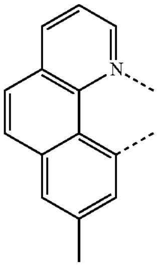
Lc032
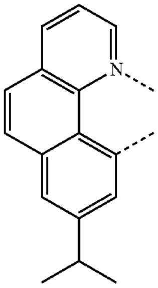
Lc033
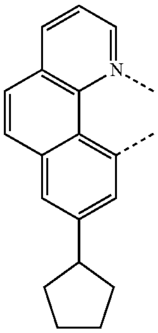
-continued
Lc034
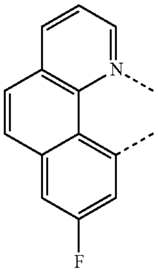
Lc035
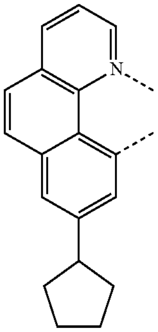
Lc036
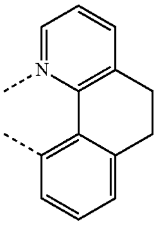
Lc037
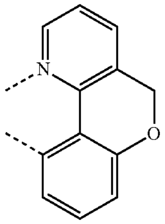
Lc038
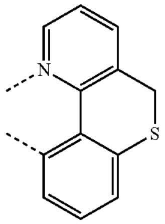
Lc039
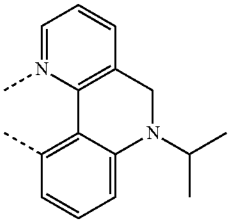

-continued
Lc040
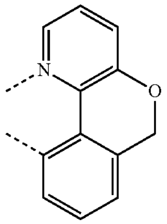
Lc041
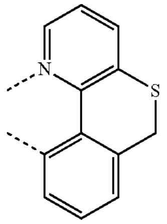
Lc042
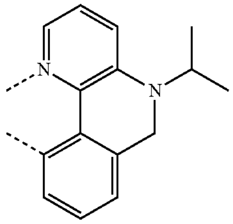
Lc043
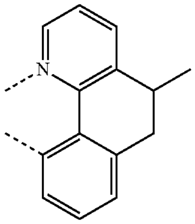
Lc044
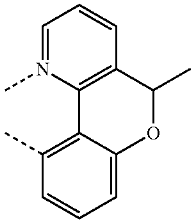
Lc045
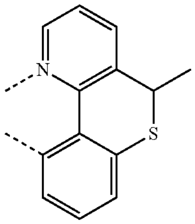
Lc046
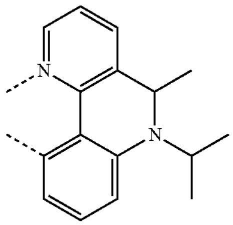
-continued
Lc047
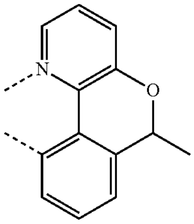
Lc048
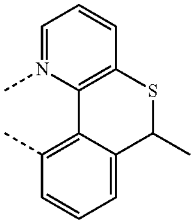
Lc049
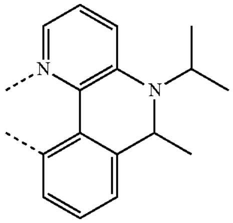
Lc050
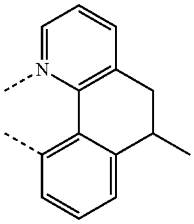
Lc051
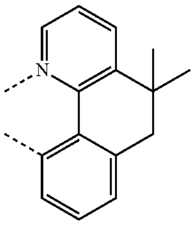
Lc052
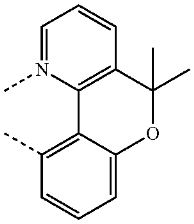
Lc053
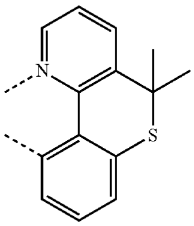

-continued

Lc054

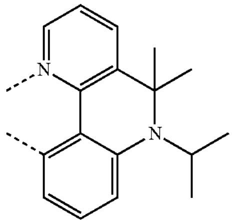

Lc055

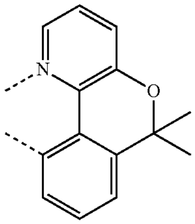

Lc056

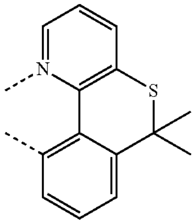

Lc057

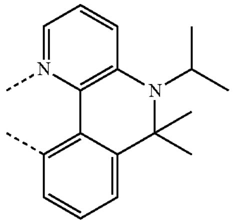

Lc058

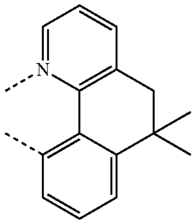

Lc059

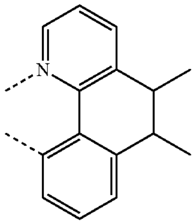

Lc060

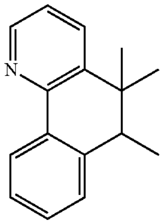

-continued

Lc061

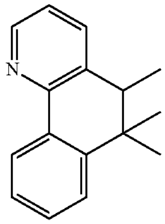

Lc062

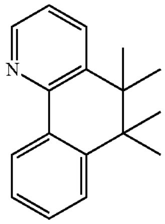

One of objectives of the present invention is to provide an OLED phosphorescent material containing the compound.

One of objectives of the present invention is to provide an OLED containing the compound.

The material of the present invention has the advantages of high optical and electrical stability, narrow emission half-peak width, high color saturation, high luminous efficiency, long device service life and the like. As a phosphorescent material, the material of the present invention can convert a triplet state into light, thereby improving the luminous efficiency of organic electroluminescent devices and reducing energy consumption. In particular, the compound has the potential for application in the AMOLED industry as a green light-emitting dopant.

DETAILED DESCRIPTION OF EMBODIMENTS

Figure 1:
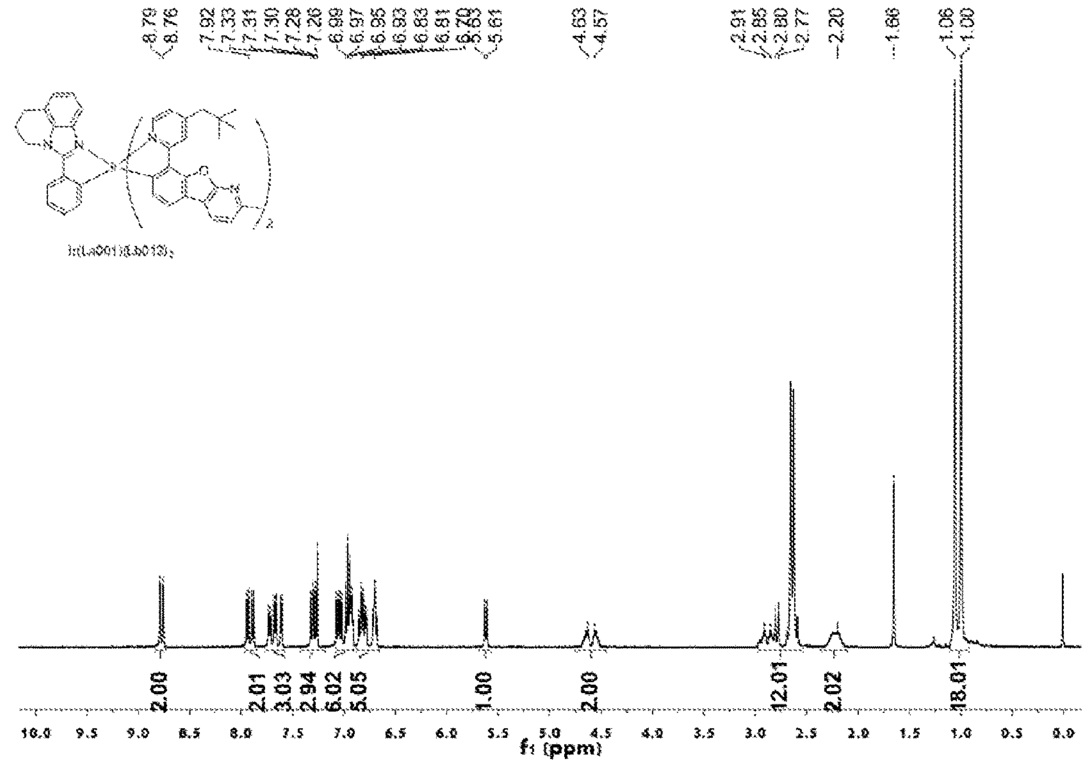
FIG. 1 shows the 1HNMR spectrum of a compound $Ir(La001)(Lb012)_2$ of the present invention in a deuterated chloroform solution.
Figure 2:
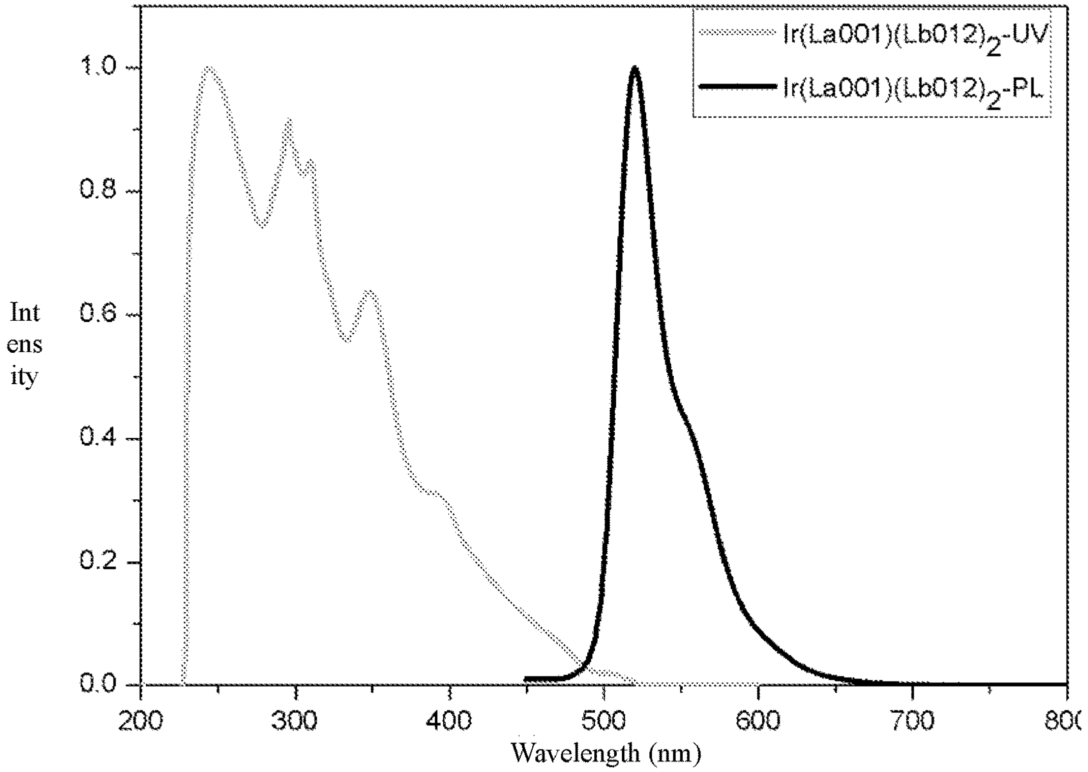
FIG. 2 shows the ultraviolet absorption spectrum and emission spectrum of a compound $Ir(La001)(Lb012)_2$ of the present invention in a dichloromethane solution.
Figure 3:
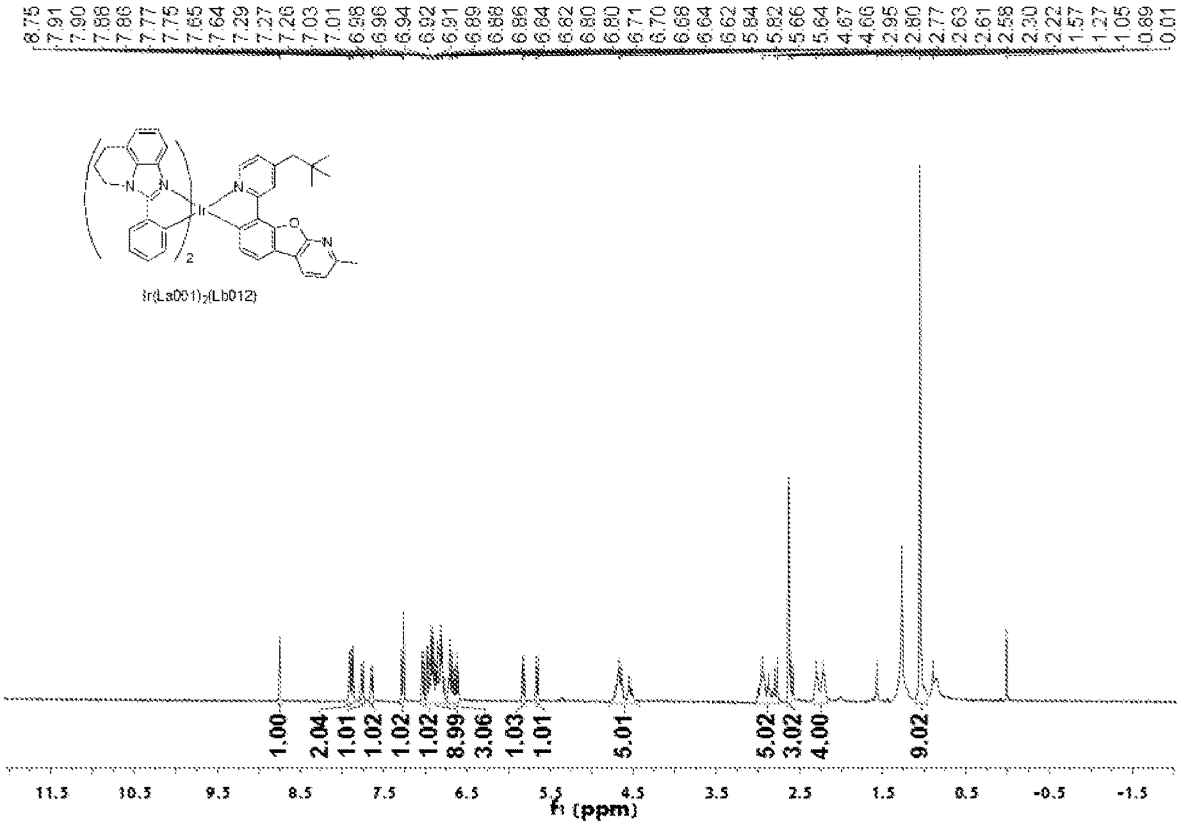
FIG. 3 shows the 1HNMR spectrum of a compound $Ir(La001)_2(Lb012)$ of the present invention in a deuterated chloroform solution.
Figure 4:
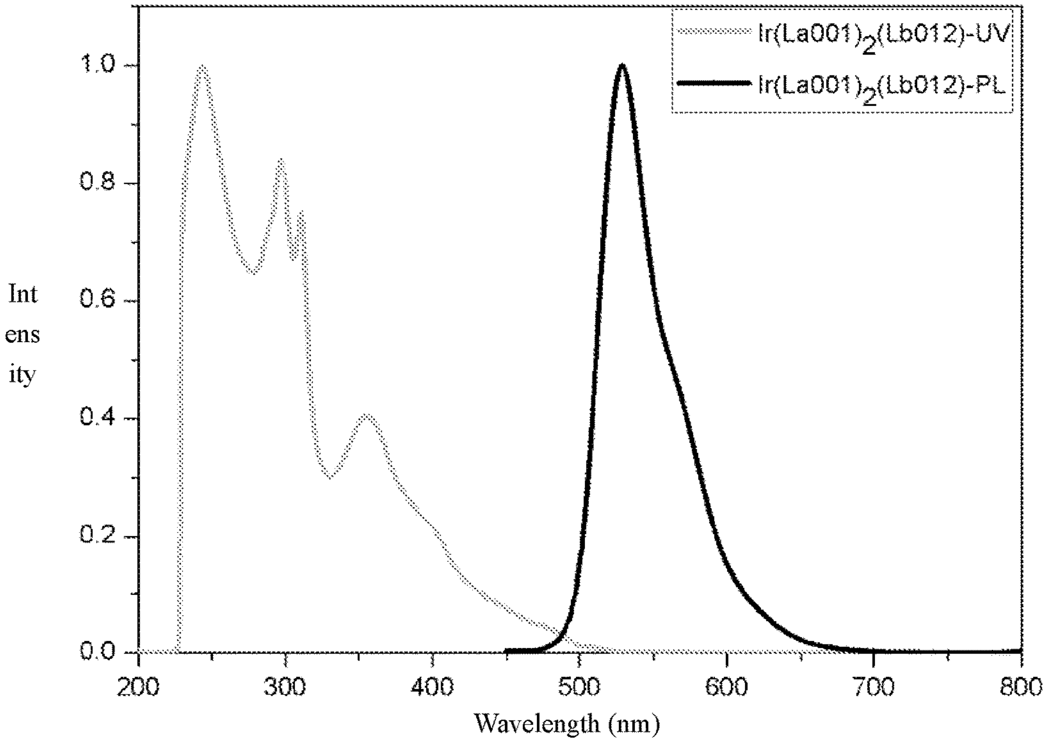
FIG. 4 shows the ultraviolet absorption spectrum and emission spectrum of a compound $Ir(La001)_2(Lb012)$ of the present invention in a dichloromethane solution.

A compound of the present invention is an organometallic compound having a general formula of Ir(La)(Lb)(Lc), where La is a structure represented by Formula (1):

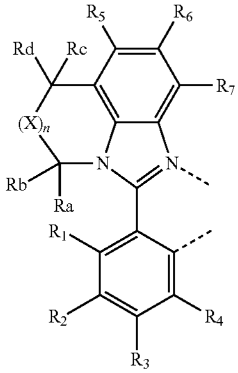

(1)

where dotted lines refer to positions connected to the metal Ir;

X is O, S, Se, CRpRq, SiRrRs or NRt;

n is an integer from 0 to 3, and when the n is equal to or greater than 2, multiple X groups are present at the same time and may be the same or different;

Ra, Rb, Rc, Rd, Rp, Rq, Rr, Rs and Rt are independently selected from hydrogen, deuterium, halogen, substituted or unsubstituted $C_1$-$C_{10}$ alkyl, substituted or unsubstituted $C_3$-$C_{20}$ cycloalkyl, substituted or unsubstituted $C_6$-$C_{18}$ aryl, and substituted or unsubstituted $C_2$-$C_{17}$ heteroaryl;

$R_1$-$R_7$ are independently selected from hydrogen, deuterium, halogen, hydroxyl, sulfhydryl, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_2$-$C_{10}$ alkenyl, substituted or unsubstituted $C_2$-$C_{10}$ alkynyl, substituted or unsubstituted $C_6$-$C_{18}$ aryl, substituted or unsubstituted $C_2$-$C_{17}$ heteroaryl, substituted or unsubstituted tri-$C_1$-$C_{10}$ alkyl silyl, substituted or unsubstituted tri-$C_6$-$C_{12}$ aryl silyl, substituted or unsubstituted di-$C_1$-$C_{10}$ alkyl mono-$C_6$-$C_{30}$ aryl silyl, and substituted or unsubstituted mono-$C_1$-$C_{10}$ alkyl di-$C_6$-$C_{30}$ aryl silyl, or any two adjacent groups of the $R_1$-$R_7$ may be connected to each other to form an aliphatic ring structure or an aromatic ring structure;

the heteroalkyl and the heteroaryl at least contain one O, N or S heteroatom;

both Lb and Lc are a monoanionic bidentate ligand, the La, the Lb and the Lc may be the same or different, and the different indicates different parent nuclear structures, a same parent nuclear structure with different substituents, or a same parent nuclear structure with different substituent positions;

any two or three of the La, the Lb and the Lc may be connected to each other to form a polydentate ligand;

and the "substituted" refers to substitution with deuterium, F, Cl, Br, $C_1$-$C_6$ alkyl, $C_3$-$C_6$ cycloalkyl, amino substituted with $C_1$-$C_6$ alkyl, cyano, isocyano, or phosphino, and the substitution ranges from a single substitution number to a maximum substitution number.

In Formula (1), in a case of 2 or more substituents, the multiple substituents may be the same or different, respectively.

Examples of various groups of compounds represented by Formula (1) to Formula (3) are described below.

It is to be noted that in the specification, "$C_a$-$C_b$" in the term "substituted or unsubstituted $C_a$-$C_b$ X group" refers to the number of carbons when the X group is unsubstituted, excluding the number of carbons of a substituent when the X group is substituted.

As a linear or branched alkyl, the $C_1$-$C_{10}$ alkyl specifically includes methyl, ethyl, propyl, isopropyl, n-butyl, isobutyl, sec-butyl, tert-butyl, n-pentyl and isomers thereof, n-hexyl and isomers thereof, n-heptyl and isomers thereof, n-octyl and isomers thereof, n-nonyl and isomers thereof, and n-decyl and isomers thereof, optionally includes methyl, ethyl, propyl, isopropyl, n-butyl, isobutyl, sec-butyl, and tert-butyl, and more optionally includes propyl, isopropyl, isobutyl, sec-butyl, and tert-butyl.

The $C_3$-$C_{20}$ cycloalkyl may include cyclopropyl, cyclobutyl, cyclopentyl, cyclohexyl, 1-adamantyl, 2-adamantyl, 1-norbornyl, and 2-norbornyl, and optionally includes cyclopentyl and cyclohexyl.

The $C_2$-$C_{10}$ alkenyl may include vinyl, propenyl, allyl, 1-butadienyl, 2-butadienyl, 1-hexatrienyl, 2-hexatrienyl, and 3-hexatrienyl, and optionally includes propenyl and allyl.

As a linear or branched alkyl or cycloalkyl consisting of atoms other than carbon and hydrogen, the $C_1$-$C_{10}$ heteroalkyl may include mercaptomethyl methyl, methoxymethyl, ethoxymethyl, tert-butoxyl methyl, N,N-dimethyl methyl, epoxy butyl, epoxy pentyl, and epoxy hexyl, and optionally includes methoxymethyl and epoxy pentyl.

Specific examples of the aryl include phenyl, naphthyl, anthracyl, phenanthryl, tetracenyl, pyrenyl, chrysenyl, benzo[c]phenanthryl, benzo[g]chrysenyl, fluorenyl, benzofluorenyl, dibenzofluorenyl, biphenyl, triphenyl, tetraphenyl, and fluoranthracyl, and optionally include phenyl and naphthyl.

Specific examples of the heteroaryl may include pyrrolyl, pyrazinyl, pyridyl, pyrimidinyl, triazinyl, indolyl, isoindolyl, imidazolyl, furyl, benzofuryl, isobenzofuryl, dibenzofuryl, dibenzothienyl, azodibenzofuryl, azodibenzothienyl, diazodibenzofuryl, diazodibenzothienyl, quinolyl, isoquinolyl, quinoxalinyl, carbazolyl, phenanthridinyl, acridinyl, phenanthrolinyl, phenazinyl, phenothiazinyl, phenoxazinyl, oxazolinyl, oxadiazolyl, furzanyl, thienyl, benzothienyl, dihydroacridinyl, azocarbazolyl, diazocarbazolyl, and quinazolinyl, and optionally include pyridyl, pyrimidinyl, triazinyl, dibenzofuryl, dibenzothienyl, azodibenzofuryl, azodibenzothienyl, diazodibenzofuryl, diazodibenzothienyl, carbazolyl, azocarbazolyl, and diazocarbazolyl.

The following embodiments are merely described to facilitate the understanding of the technical invention, and should not be considered as specific limitations of the present invention.

All raw materials, solvents and the like involved in the synthesis of compounds in the present invention are purchased from Alfa, Acros, and other suppliers known to persons skilled in the art.

Synthesis of a Ligand La001

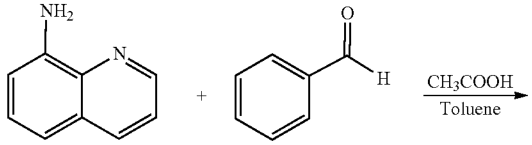

La001-1 La001-2

-continued

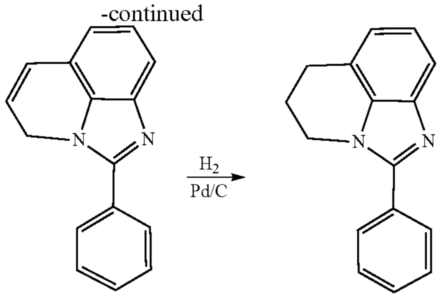

La001-3 La001

Synthesis of a compound La001-3

A compound La001-1 (80.0 g, 0.55 mol, 1.0 eq), La001-2 (70.66 g, 0.66 mol, 1.20 eq), acetic acid (49.9 g, 0.83 mol, 1.5 eq) and toluene (400 ml) were added into a 1 L three-necked flask, vacuumization was performed for nitrogen replacement for 3 times, and stirring was performed at 110° C. for reflux for 18 hours under the protection of nitrogen. According to monitoring by thin-layer chromatography (TLC), the raw material La001-1 was completely reacted. Cooling was performed to room temperature, and 250 ml of deionized water was added for water washing and liquid separation. An organic phase on an upper layer was collected, concentrated to remove an organic solvent, spin-dried and separated by column chromatography (with an eluting agent including ethyl acetate and n-hexane at a ratio of 1:20), followed by drying to obtain 77.4 g of a grayish white solid compound La001-3 with a yield of 60.1%. The mass spectrum was: 233.28 (M+H).

Synthesis of a Compound La001

The compound La001-3 (60.0 g, 0.25 mol, 1.0 eq), 10% Pd/C (3 g, 5% of the weight of the La001-3) and ethyl acetate (480 ml) were added into a 1 L one-necked flask, a hydrogen balloon was introduced after the flask was sealed, and stirring was performed to carry out a reaction at room temperature for 2.5 hours. According to monitoring by TLC, the raw material La001-3 was completely reacted. Cooling was performed to room temperature, and filtration was performed with diatomite. A filtrate was collected, concentrated to remove an organic solvent, spin-dried and separated by column chromatography (with an eluting agent including ethyl acetate and n-hexane at a ratio of 1:20), followed by drying to obtain a grayish white solid. Then, the solid was crystallized with dichloromethane (150 ml) and n-hexane (300 ml) to obtain 38.3 g of a compound La001 with a yield of 63.4%. The mass spectrum was: 235.3 (M+H).

Synthesis of a Compound Ir(La001)(Lb002)$_2$

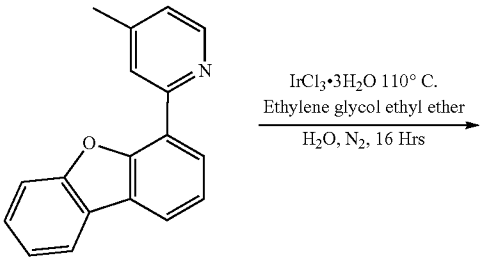

Lb002

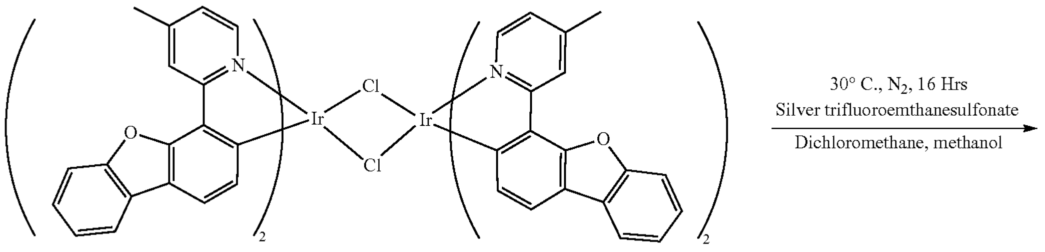

Ir(Lb002)-1

-continued

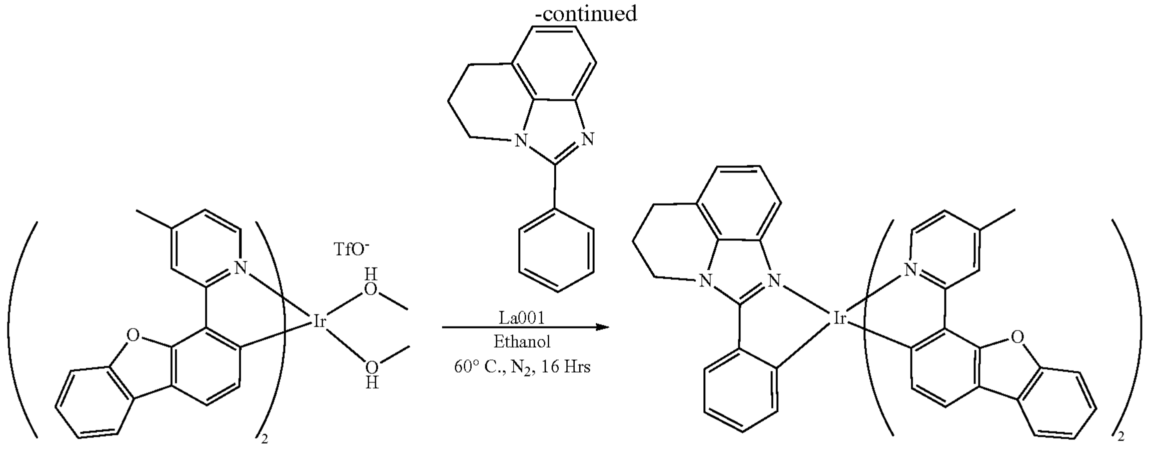

Ir(Lb002)-2

Ir(La001)(Lb002)2

Synthesis of a Compound Ir(Lb002)-1

A compound Lb002 (10.4 g, 40.1 mmol, 3.0 eq) and $IrCl_3\cdot 3H_2O$ (4.5 g, 13.37 mmol, 1.0 eq) were added into a 1 L one-necked flask, ethylene glycol ethyl ether (100 ml) and deionized water (30 ml) were added, vacuumization was performed for replacement for 3 times, and a mixture was stirred at 110° C. for reflux for 16 hours under the protection of $N_2$. After cooling was performed to room temperature, filtration was performed. A filter reside was sequentially washed with methanol (50 ml*3) and n-hexane (50 ml*3), and a solid was collected and dried to obtain 7.98 g of a compound Ir(Lb002)-1 with a yield of 80.2%. The obtained compound was directly used in the next step without purification.

Synthesis of a compound Ir(Lb002)-2

The dimer Ir (Lb002)-1 (7.98 g, 10.7 mmol, 1.0 eq) and dichloromethane (700 ml) were added into a 3 L three-necked flask and stirred for dissolution. Silver trifluoromethanesulfonate (5.51 g, 21.4 mmol, 2.0 eq) was dissolved in methanol (510 ml) and then added into the original reaction solution flask, vacuumization was performed for replacement for 3 times, and a mixture was stirred at room temperature for 16 hours under the protection of $N_2$. Then, a reaction solution was filtered with diatomite. A filter residue was rinsed with dichloromethane (100 ml), and a filtrate was spin-dried to obtain 7.57 g of a compound Ir(Lb002)-2 with a yield of 79.2%. The obtained compound was directly used in the next step without purification.

Synthesis of a Compound Ir(La001)(Lb002)$_2$

The compound Ir(Lb002)-2 (6.5 g, 7.29 mmol, 1.0 eq) and the La001 (4.27 g, 18.22 mmol, 2.5 eq) were added into a 250 ml three-necked flask, ethanol (65 ml) was added, vacuumization was performed for replacement for 3 times, and stirring was performed for reflux for 16 hours under the protection of $N_2$. After cooling was performed to room temperature, filtration was performed. A solid was collected, dissolved in dichloromethane (150 ml) and filtered with silica gel. Then, a filter cake was rinsed with dichloromethane (50 ml), and a filtrate was spin-dried, recrystallized with tetrahydrofuran/methanol for 2 times (the ratio of the product to the tetrahydrofuran to the methanol was 1:7:10) and beaten with n-hexane (60 ml) for 1 time, followed by drying to obtain 3.10 g of a compound Ir(La001)(Lb002)$_2$ with a yield of 45.1%. 3.1 g of the crude product Ir(La001)(Lb002)$_2$ was sublimated and purified to obtain 1.84 g of sublimated and purified Ir(La001)(Lb002)$_2$ with a yield of 59.35%. The mass spectrum was: 943.09 (M+H). $^1H$ NMR (400 MHZ, $CDCl_3$) δ 8.61 (d, J=12.6 Hz, 2H), 7.98 (dd, J=18.2, 7.1 Hz, 2H), 7.84 (m, 3H), 7.77 (m, 2H), 7.69 (m, 2H), 7.60-7.18 (m, 11H), 7.05 (dd, J=16.6, 6.4 Hz, 2H), 3.99 (t, 2H), 2.97 (t, 2H), 2.42 (s, 6H), 2.26 (dt, 2H).

Synthesis of a Compound Ir(La001)(Lb005)$_2$

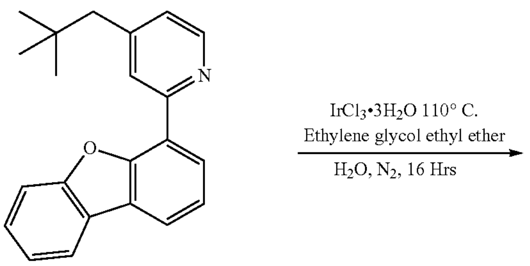

Lb005

-continued

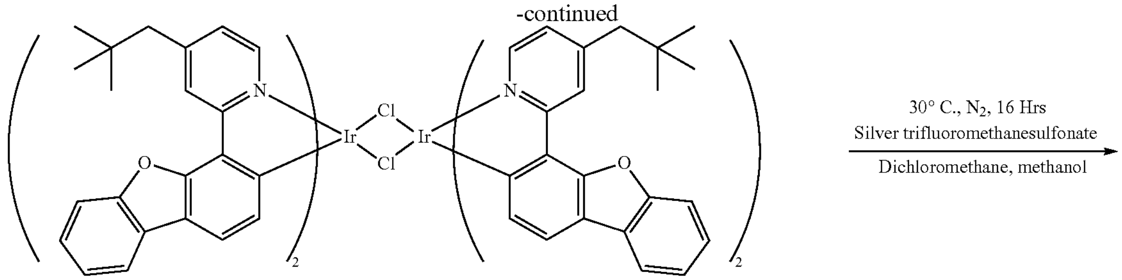

Ir(Lb005)-1

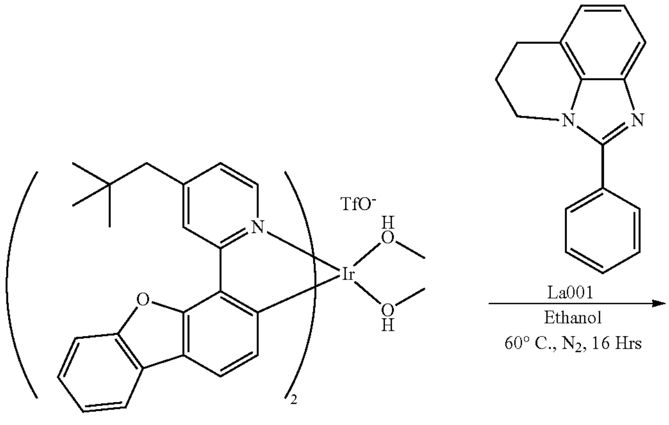

Ir(Lb005)-2

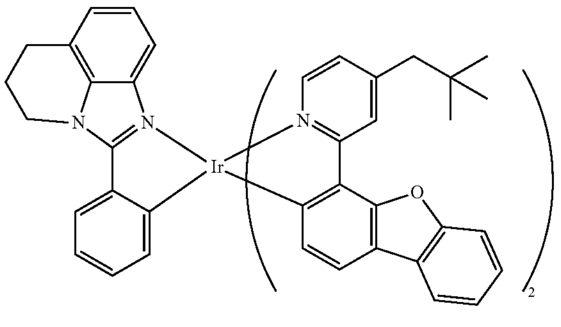

Ir(La001)(Lb005)$_2$

Synthesis of a Compound Ir(Lb005)-1

With reference to synthesis and purification methods of the compound Ir(Lb002)-1, only the corresponding raw materials were required to be changed, and an obtained compound was directly used in the next step without purification.

Synthesis of a Compound Ir(Lb005)-2

With reference to synthesis and purification methods of the compound Ir(Lb002)-2, only the corresponding raw materials were required to be changed, and an obtained compound was directly used in the next step without purification.

Synthesis of a Compound Ir(La001)(Lb005)$_2$

With reference to synthesis and purification methods of the compound Ir(La001)(Lb002)$_2$, only the corresponding raw materials were required to be changed, and 4.32 g of a target compound Ir(La001)(Lb005)$_2$ with a yield of 51.8% was obtained. 4.32 g of the crude product Ir(La001)(Lb005)$_2$ was sublimated and purified to obtain 2.89 g of sublimated and purified Ir(La001)(Lb005)$_2$ with a yield of 66.89%. The mass spectrum was: 1055.43 (M+H). $^1$H NMR (400 MHZ, $CDCl_3$) δ 8.65 (d, J=13.1 Hz, 2H), 7.88 (dd, J=17.2, 7.6 Hz, 2H), 7.84 (d, 2H), 7.77 (m, 2H), 7.69 (m, 3H), 7.60-7.47 (m, 4H), 7.46-7.36 (m, 4H), 7.31 (m, 2H), 7.22 (d, 2H), 7.05 (d, 2H), 3.99 (t, J=5.5 Hz, 2H), 3.21 (s, 4H), 2.97 (t, J=5.9 Hz, 2H), 2.31-2.21 (m, 2H), 0.85 (s, 18H).

Synthesis of a Compound Ir(La001)(Lb012)$_2$

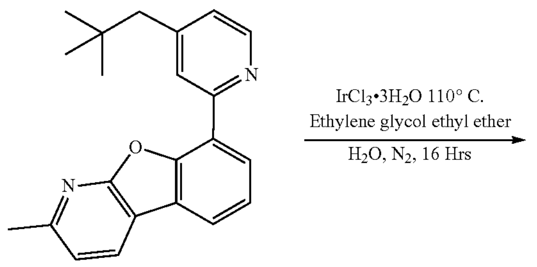

Lb012

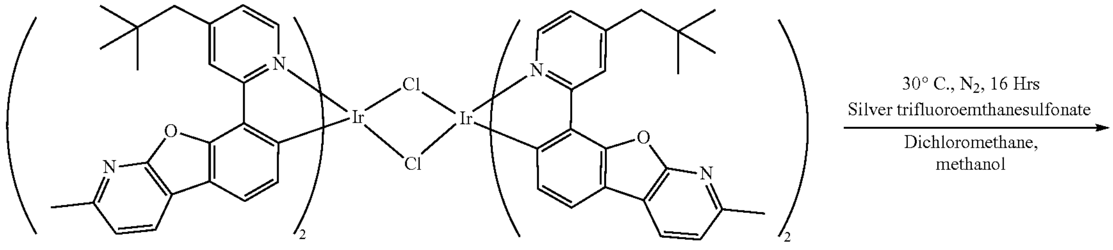

Ir(Lb012)-1

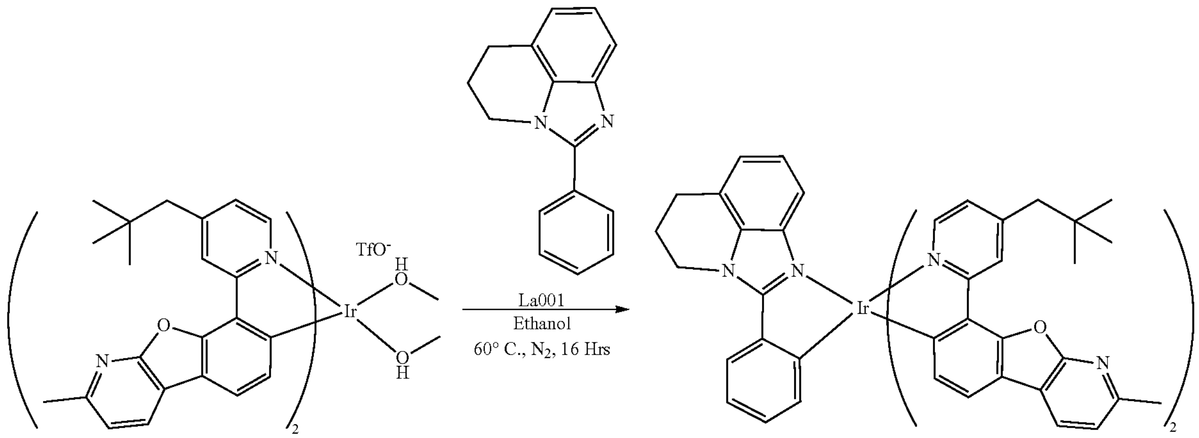

Ir(Lb012)-2

Ir(La001)(Lb012)$_2$

Synthesis of a Compound Ir(Lb012)-1

With reference to synthesis and purification methods of the compound Ir(Lb002)-1, only the corresponding raw materials were required to be changed, and an obtained compound was directly used in the next step without purification.

Synthesis of a Compound Ir(Lb012)-2

With reference to synthesis and purification methods of the compound Ir(Lb002)-2, only the corresponding raw materials were required to be changed, and an obtained compound was directly used in the next step without purification.

Synthesis of a Compound Ir(La001)(Lb012)$_2$

With reference to synthesis and purification methods of the compound Ir(La001)(Lb002)$_2$, only the corresponding raw materials were required to be changed, and 4.14 g of a target compound Ir(La001)(Lb012)$_2$ with a yield of 48.9% was obtained. 4.14 g of the crude product Ir(La001)(Lb012)$_2$ was sublimated and purified to obtain 2.71 g of sublimated and purified Ir(La001)(Lb012)$_2$ with a yield of 65.45%. The mass spectrum was: 1085.33 (M+H). $^1$H NMR (400 MHZ, $CDCl_3$) δ 8.78 (d, J=12.9 Hz, 2H), 7.91 (dd, J=19.3, 7.7 Hz, 2H), 7.77-7.58 (m, 3H), 7.43-7.19 (m, 3H), 7.00 (ddd, J=23.3, 14.6, 7.7 Hz, 6H), 6.77 (ddd, J=41.2, 15.7, 7.8 Hz, 5H), 5.62 (d, J=8.1 Hz, 1H), 4.60 (d, J=25.0 Hz, 2H), 2.83 (dd, J=36.7, 17.4 Hz, 12H), 2.20 (s, 2H), 1.03 (d, J=25.1 Hz, 18H).

Synthesis of a Compound Ir(La001)$_2$(Lb012)

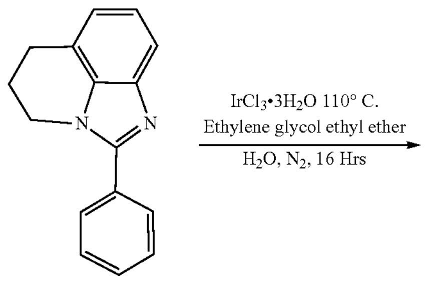

La001

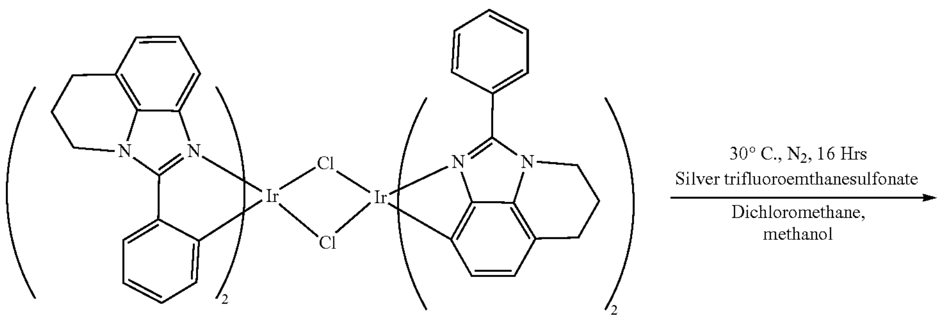

Ir(La001)-1

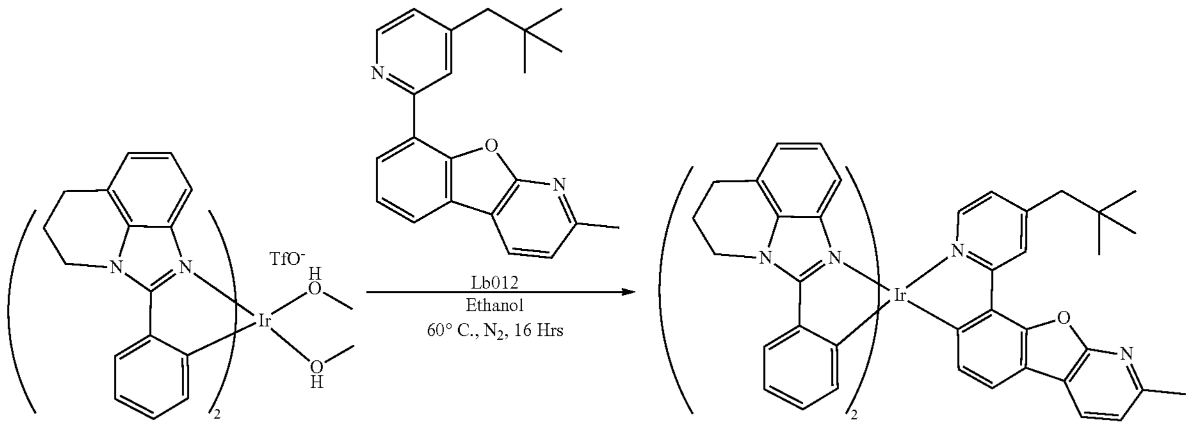

Ir(La001)-2

Ir(La001)$_2$(Lb012)

Synthesis of a Compound Ir(La001)-1

With reference to synthesis and purification methods of the compound Ir(Lb002)-1, only the corresponding raw materials were required to be changed, and an obtained compound was directly used in the next step without purification.

Synthesis of a Compound Ir(La001)-2

With reference to synthesis and purification methods of the compound Ir(Lb002)-2, only the corresponding raw materials were required to be changed, and an obtained compound was directly used in the next step without purification.

Synthesis of a Compound Ir(La001)$_2$(Lb012)

With reference to synthesis and purification methods of the compound Ir(La001)(Lb002)$_2$, only the corresponding raw materials were required to be changed, and 3.36 g of a target compound Ir(La001)$_2$(Lb012) with a yield of 42.7% was obtained. 3.36 g of the crude product Ir(La001)$_2$(Lb012) was sublimated and purified to obtain 2.29 g of sublimated and purified Ir(La001)$_2$(Lb012) with a yield of 68.15%. The mass spectrum was: 989.21 (M+H). $^1H$ NMR (400 MHZ, $CDCl_3$) δ 8.75 (s, 1H), 7.89 (dd, J=13.2, 6.6 Hz, 2H), 7.76 (d, J=7.3 Hz, 1H), 7.64 (d, J=6.1 Hz, 1H), 7.28 (d, J=8.0 Hz, 1H), 7.02 (d, J=7.7 Hz, 1H), 6.99-6.74 (m, 9H), 6.72-6.60 (m, 3H), 5.83 (d, J=8.2 Hz, 1H), 5.65 (d, J=8.1 Hz, 1H), 4.78-4.42 (m, 5H), 2.85 (dd, J=51.3, 22.0 Hz, 5H), 2.62 (d, J=7.5 Hz, 3H), 2.26 (d, J=31.6 Hz, 4H), 1.05 (s, 9H).

Synthesis of a Compound Ir(La001)(Lb012)(Lc003)
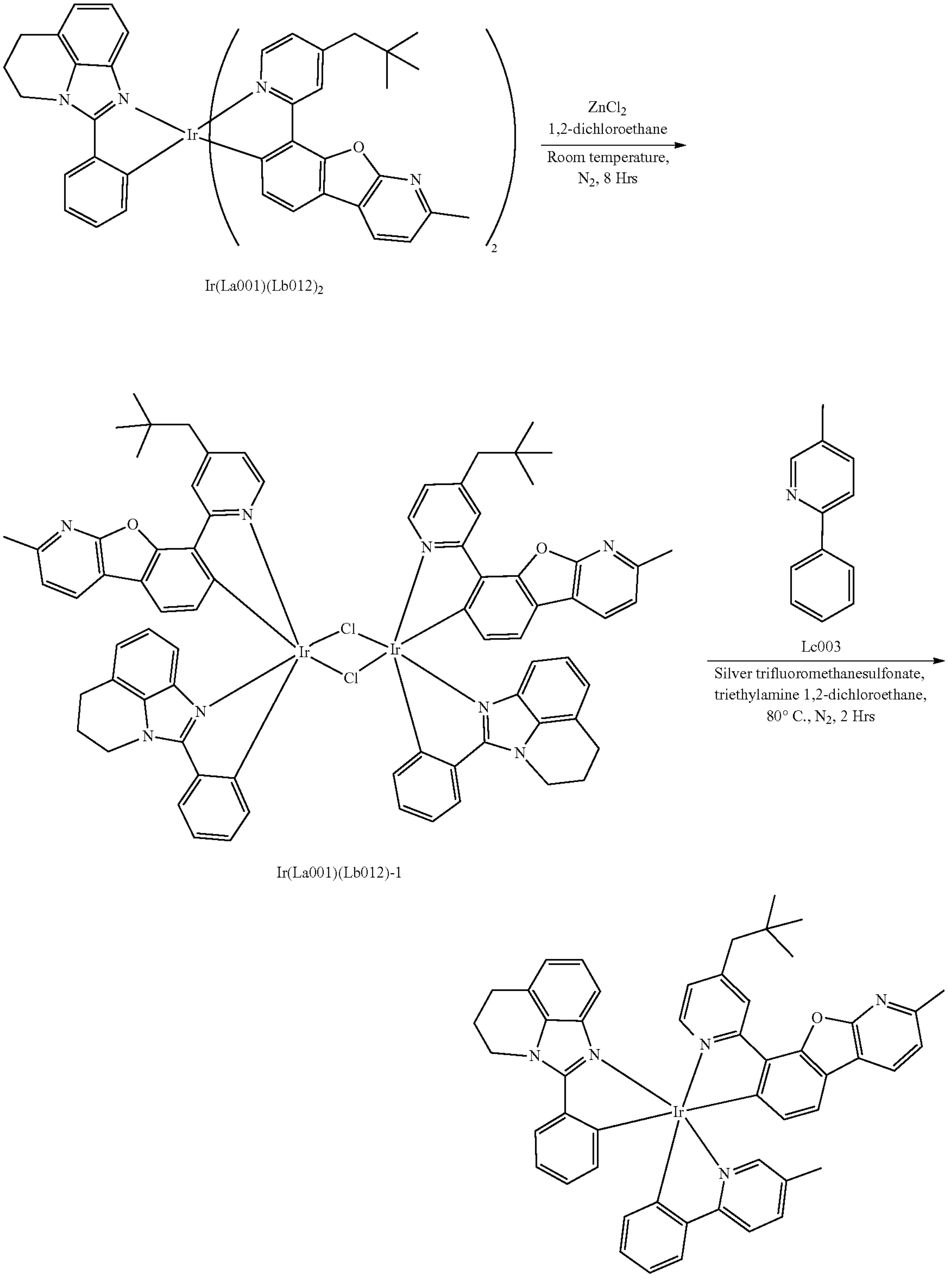
$Ir(La001)(Lb012)_2$
Ir(La001)(Lb012)-1
Ir(La001)(Lb012)(Lc003)

Synthesis of a Compound Ir(La001)(Lb012)-1

The compound Ir(La001)$(Lb012)_2$ (5.42 g, 5.0 mmol, 1.0 eq) and zinc chloride (34.06 g, 249.9 mmol, 50 eq) were added into a 1 L one-necked flask, 1,2-dichloroethane (352 ml) was added, vacuumization was performed for replacement for 3 times, and stirring was performed to carry out a reflux reaction for 18 hours under the protection of $N_2$. According to point-plate monitoring by TLC, the raw material Ir(La001)$(Lb012)_2$ was basically completely reacted. After cooling was performed to room temperature, deionized water (150 ml) was added for washing for 3 times, and a filtrate was spin-dried to obtain 3.37 g of a compound Ir(La001)(Lb012)-1 with a yield of 85.3%. The obtained compound was directly used in the next step without purification.

Synthesis of a Compound Ir(La001)(Lb012)(Lc003)

The dimer Ir(La001)(Lb012)-1 (3.37 g, 4.26 mmol, 1.0 eq), silver trifluoromethanesulfonate (3.29 g, 12.79 mmol, 3.0 eq), Lc003 (2.16 g, 12.79 mmol, 3.0 eq), triethylamine (4.31 g, 42.64 mmol, 10 eq) and 1,2-dichloroethane (240 ml) were added into a 500 ml three-necked flask, vacuumization was performed for replacement for 3 times, and a mixture was heated and stirred to carry out a reflux reaction for 3 hours under the protection of $N_2$. According to point-plate monitoring by TLC, the dimer Ir(La001)(Lb012)-1 was completely consumed. Cooling was performed to room temperature. Then, a reaction solution was filtered with diatomite, a filter residue was rinsed with dichloromethane (100 ml), and a filtrate was spin-dried to obtain a crude product. The crude product was separated by column chromatography (with an eluting agent including dichloromethane and n-hexane at a ratio of 1:10), and a resulting product was recrystallized with tetrahydrofuran/methanol for 2 times (the ratio of the product to the tetrahydrofuran to the methanol was 1:5:5) and beaten with n-hexane (40 ml) for 1 time, followed by drying to obtain 1.32 g of a compound Ir(La001)(Lb012)(Lc003) with a yield of 33.6%. 1.32 g of the crude product Ir(La001)(Lb012)(Lc003) was sublimated and purified to obtain 0.87 g of sublimated and purified Ir(La001)(Lb012)(Lc003) with a yield of 65.9%. The mass spectrum was: 924.13 (M+H). $^1$H NMR (400 MHZ, $CDCl_3$) δ 8.72 (s, 1H), 8.32 (d, J=23.0 Hz, 2H), 8.16 (m, 2H), 7.84 (m, 2H), 7.80-7.66 (m, 3H), 7.58 (m, 2H), 7.54-7.39 (m, 5H), 7.25 (d, J=35.0 Hz, 2H), 7.03 (d, J=20.0 Hz, 2H), 3.99 (t, 2H), 3.22 (s, 2H), 2.98 (t, 2H), 2.68 (s, 3H), 2.32 (s, 3H), 2.26 (dt, 2H), 0.96 (s, 9H).

Synthesis of a Compound Ir(La001)(Lb012)(Lc008)

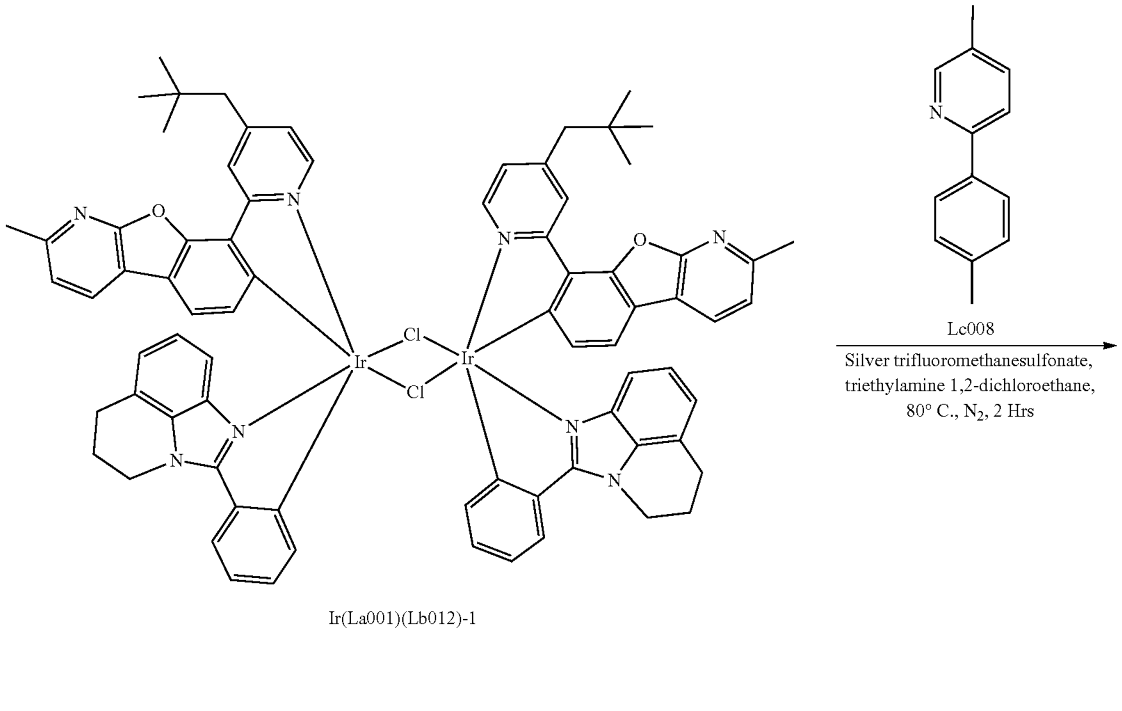

Ir(La001)(Lb012)-1

-continued

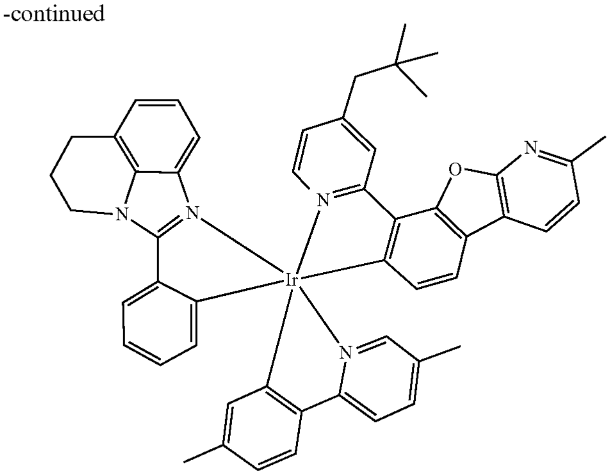

Ir(La001)(Lb012)(Lc008)

Synthesis of a Compound Ir(La001)(Lb012)(Lc008)

With reference to synthesis and purification methods of the compound Ir(La001)(Lb012)(Lc003), only the corresponding raw materials were required to be changed, and 1.47 g of a target compound Ir(La001)(Lb012)(Lc008) with a yield of 30.81% was obtained. 1.47 g of the crude product Ir(La001)(Lb012)(Lc008) was sublimated and purified to obtain 1.01 g of sublimated and purified Ir(La001)(Lb012)(Lc008) with a yield of 68.70%. The mass spectrum was: 938.16 (M+H). $^1$H NMR (400 MHZ, $CDCl_3$) δ 8.67(d, J=34.3 Hz, 2H), 8.30 (m, 2H), 8.11 (m, 2H), 7.84 (d, 2H), 7.80-7.67 (m, 3H), 7.62-7.38 (m, 4H), 7.33-7.17 (m, 3H), 7.03 (d, J=20.0 Hz, 2H), 3.89 (t, 2H), 3.21 (s, 2H), 2.99 (t, 2H), 2.68 (s, 3H), 2.31 (d, J=5.0 Hz, 6H), 2.26 (dt, 2H), 0.97 (s, 9H).

Synthesis of a Compound Ir(La001)(Lb012)(Lc026)

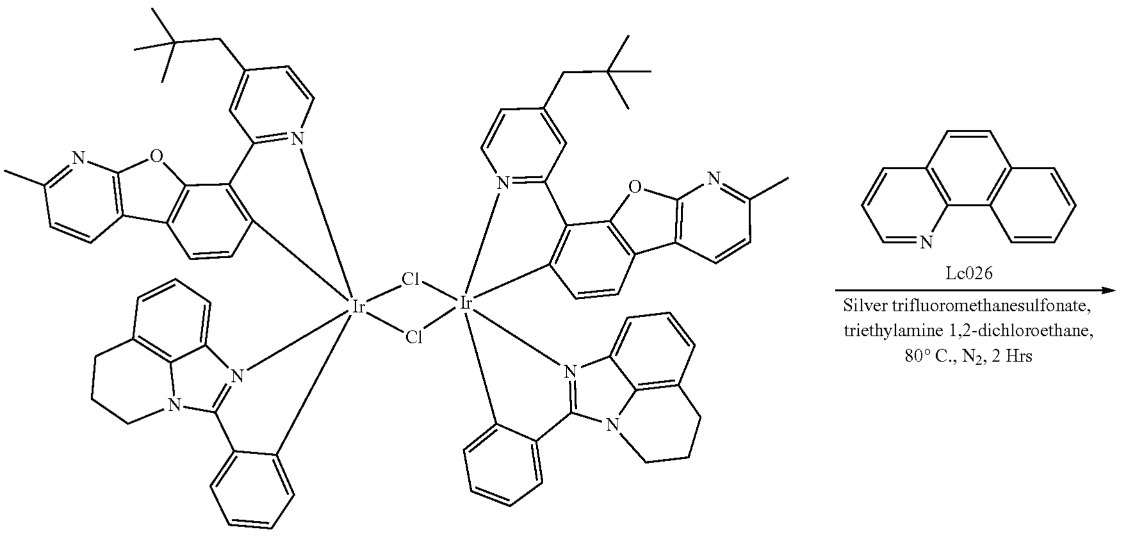

Ir(La001)(Lb012)-1

-continued

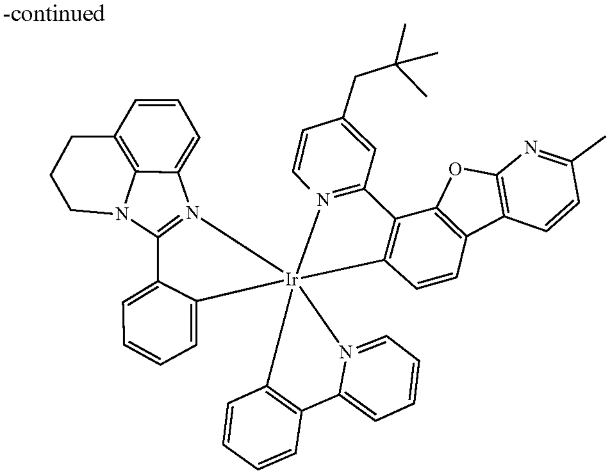

Ir(La001)(Lb012)(Lc026)

With reference to synthesis and purification methods of the compound Ir(La001)(Lb012)(Lc003), only the corresponding raw materials were required to be changed, and 1.55 g of a target compound Ir(La001)(Lb012)(Lc026) with a yield of 36.32% was obtained. 1.55 g of the crude product Ir(La001)(Lb012)(Lc026) was sublimated and purified to obtain 1.1 g of sublimated and purified Ir(La001)(Lb012)(Lc026) with a yield of 70.96%. The mass spectrum was: 934.13 (M+H). $^{1}$H NMR (400 MHZ, $CDCl_3$) δ 8.90 (s, 1H), 8.49 (d, J=5.0 Hz, 2H), 8.10 (m, 2H), 7.88-7.73 (m, 4H), 7.69 (m, 2H), 7.62-7.35 (m, 7H), 7.22 (d, 2H), 7.03 (d, J=20.0 Hz, 2H), 3.95 (t, 2H), 3.25 (s, 2H), 2.97 (t, 2H), 2.68 (s, 3H), 2.28 (dt, 2H), 0.90 (s, 9H).

Synthesis of a Compound Ir(La001)(Lb012)(Lc062)

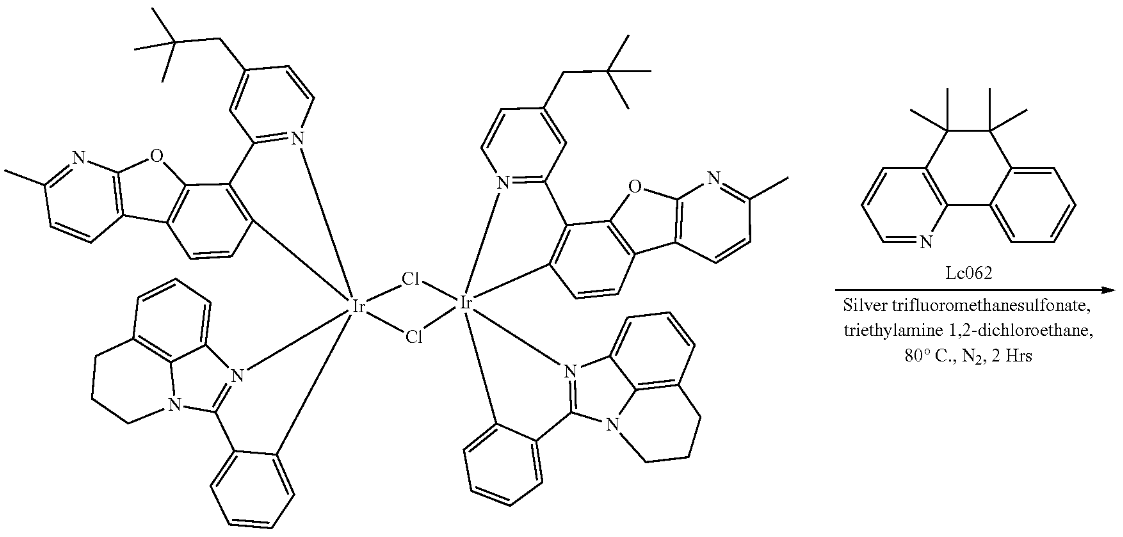

Ir(La001)(Lb012)-1

-continued

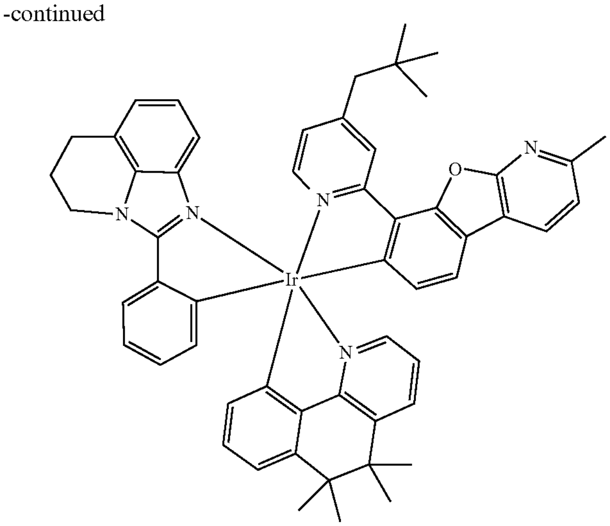

Ir(La001)(Lb012)(Lc062)

With reference to synthesis and purification methods of the compound Ir(La001)(Lb012)(Lc003), only the corresponding raw materials were required to be changed, and 1.27 g of a target compound Ir(La001)(Lb012)(Lc062) with a yield of 29.8% was obtained. 1.27 g of the crude product Ir(La001)(Lb012)(Lc062) was sublimated and purified to obtain 0.83 g of sublimated and purified Ir(La001)(Lb012)(Lc062) with a yield of 65.35%. The mass spectrum was: 992.25 (M+H). $^{1}$H NMR (400 MHZ, $CDCl_3$) δ 8.72 (d, J=17.1 Hz, 2H), 8.35 (m, 2H), 7.81 (d, J=35.0 Hz, 2H), 7.69 (m, 2H), 7.64-7.38 (m, 5H), 7.38-7.17 (m, 3H), 7.03 (d, J=20.0 Hz, 2H), 6.67 (m, 2H), 3.94 (t, 2H), 3.23 (s, 2H), 2.97 (t, 2H), 2.66 (s, 3H), 2.24 (dt, 2H), 1.35 (s, 12H), 0.88 (s, 9H).

Synthesis of a Compound Ir(La001)(Lb001)(Lb012)

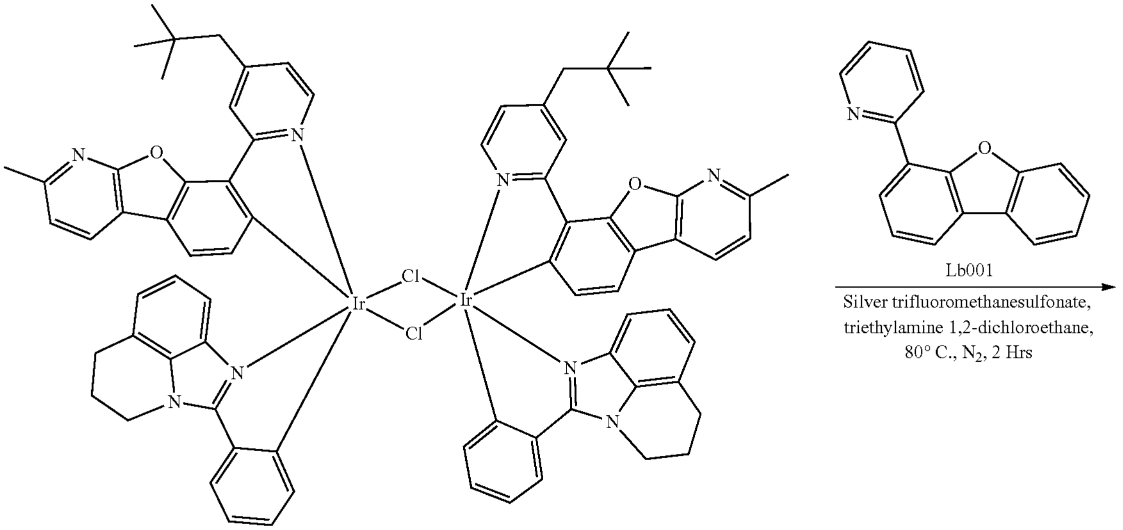

Ir(La001)(Lb012)-1

-continued

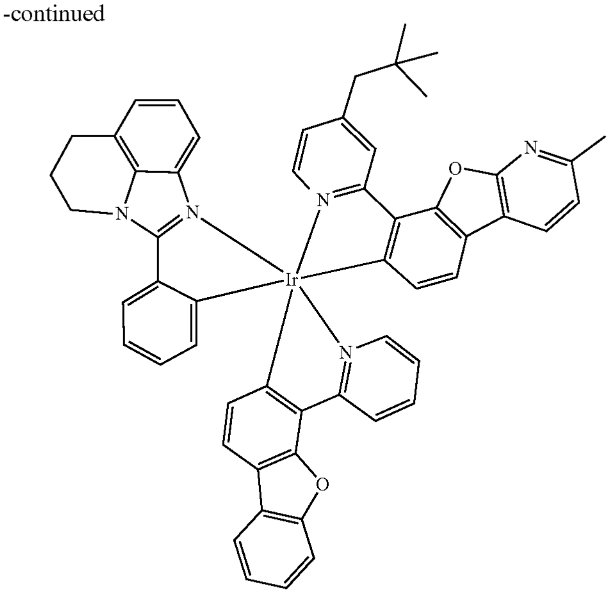

Ir(La001)(Lb001)(Lb012)

With reference to synthesis and purification methods of the compound Ir(La001)(Lb012)(Lc003), only the corresponding raw materials were required to be changed, and 1.21 g of a target compound Ir(La001)(Lb001)(Lb012) with a yield of 32.3% was obtained. 1.21 g of the crude product Ir(La001)(Lb001)(Lb012) was sublimated and purified to obtain 0.87 g of sublimated and purified Ir(La001)(Lb001)(Lb012) with a yield of 71.90%. The mass spectrum was: 1000.19 (M+H). $^1$H NMR (400 MHZ, $CDCl_3$) δ 8.67 (d, J=28.0 Hz, 2H), 8.37 (m, 2H), 7.98 (m, 2H), 7.84 (m, 2H), 7.77 (d, 1H), 7.69 (m, 2H), 7.44 (ddd, J=55.0, 40.0, 27.5 Hz, 8H), 7.26-7.10 (m, 2H), 7.03 (d, J=20.0 Hz, 2H), 6.90 (s, 1H), 3.99 (t, 2H), 3.21 (s, 2H), 2.97 (t, 2H), 2.68 (s, 3H), 2.26 (dt, 2H), 0.85 (s, 9H).

Synthesis of a Ligand La033

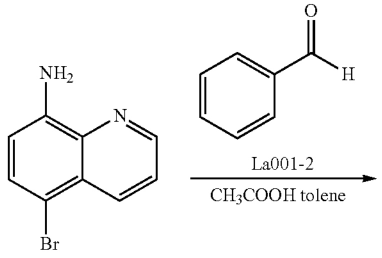

La033-1

-continued

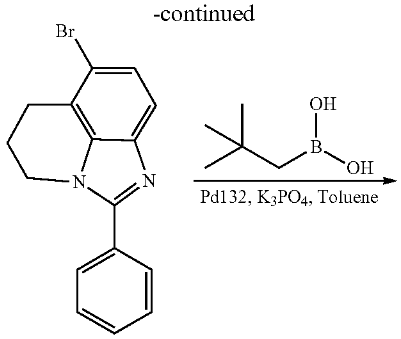

La033-2

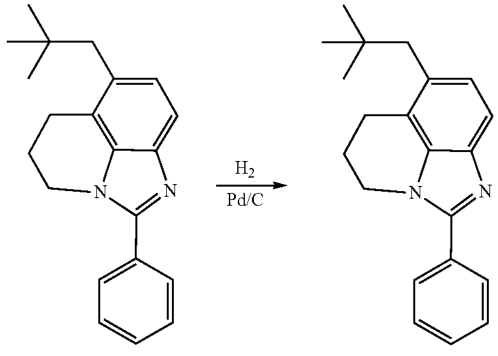

La033-3 La033

Synthesis of a Compound La033-2

With reference to synthesis and purification methods of the compound La001-3, only the corresponding raw materials were required to be changed. The mass spectrum was: 312.1 (M+H).

Synthesis of a Compound La033-3

The compound La033-2 (15 g, 48.2 mmol, 1.0 eq), isobutaneboronic acid (6.71 g, mmol, 57.85 1.2 eq), bis(ditert-butyl(4-dimethylaminophenyl)phosphine)dichloropalladium (II) (0.68 g, 0.96 mmol, 0.02 eq), $K_3PO_4$ (20.46 g, 96.41 mmol, 2.0 eq) and toluene (150 ml) were sequentially added into a 500 ml three-necked flask, vacuumization was performed for nitrogen replacement for 3 times, and the above compounds were heated to about 70° C. in an oil bath and stirred for 16 hours. According to monitoring of a sample by TLC, the raw material La033-2 was basically completely reacted. Cooling was performed to room temperature, and deionized water was added for water washing for 3 times (100 ml/time). Then, liquid separation was performed, and an organic phase was concentrated under reduced pressure to obtain a solid. The crude product was separated by column chromatography (with a mixture of ethyl acetate (EA) and n-hexane (Hex) at a ratio of 1:20), and a resulting product was dried to obtain 9.59 g of a white-like solid compound La033-3 with a yield of 65.8%. The mass spectrum was: 303.4 (M+H).

Synthesis of a Compound La033

With reference to synthesis and purification methods of the compound La001, only the corresponding raw materials were required to be changed. The mass spectrum was: 305.4 (M+H).

Synthesis of a Compound Ir(La001)(La033)(Lb012)

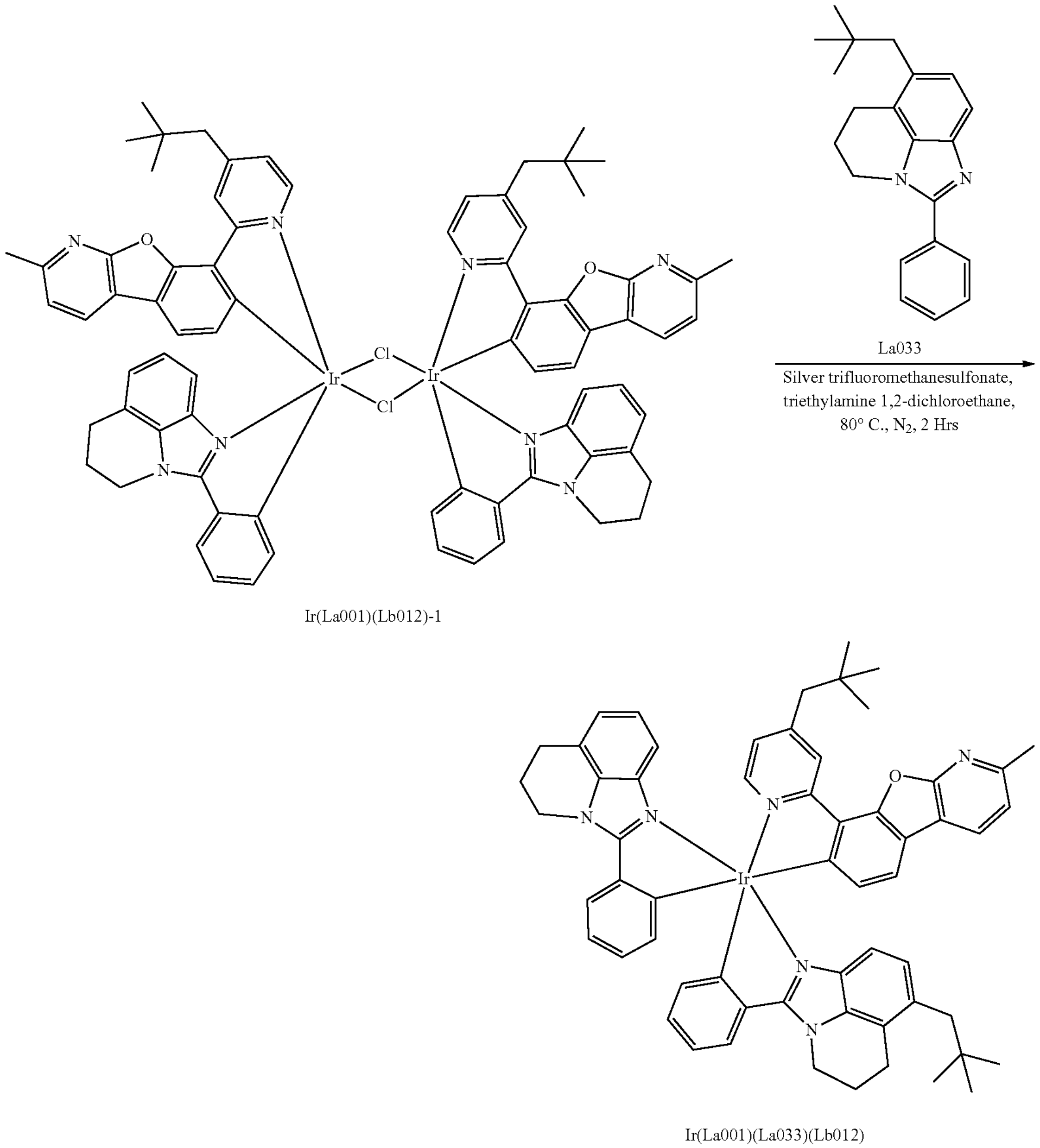

Ir(La001)(Lb012)-1

Ir(La001)(La033)(Lb012)

With reference to synthesis and purification methods of the compound Ir(La001)(Lb012)(Lc003), only the corresponding raw materials were required to be changed, and 1.42 g of a target compound Ir(La001)(La033)(Lb012) with a yield of 34.71% was obtained. 1.42 g of the crude product Ir(La001)(La033)(Lb012) was sublimated and purified to obtain 0.97 g of sublimated and purified Ir(La001)(La033)(Lb012) with a yield of 68.3%. The mass spectrum was: 1059.3 (M+H). $^1H$ NMR (400 MHZ, $CDCl_3$) δ 8.64 (d, J=10.1 Hz, 2H), 7.86-7.65 (m, 4H), 7.62-7.37 (m, 7H), 7.22 (m, 4H), 7.11-6.96 (m, 3H), 3.95 (t, 4H), 3.21 (s, 2H), 2.98 (t, 4H), 2.67 (d, J=15.0 Hz, 5H), 2.26 (dt, 4H), 0.96 (s, 18H).

Synthesis of a Ligand La005

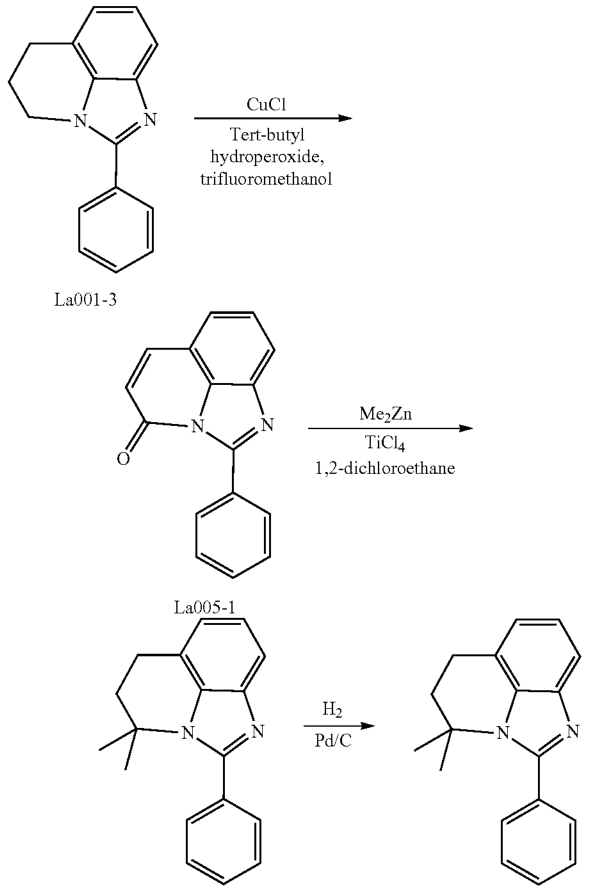

La001-3

La005-1

La005-2

La005

Synthesis of a Compound La005-1

The compound La001-3 (20 g, 86.1 mmol, 1.0 eq), cuprous chloride (0.85 g, 8.61 mmol, 0.1 eq), tert-butyl hydroperoxide (15.52 g, 172.2 mmol, 2.0 eq) and trifluoroethanol (200 ml) were sequentially added into a 1 L three-necked flask, vacuumization was performed for nitrogen replacement for 3 times, and the above compounds were heated to about 50° C. in an oil bath and stirred for 6 hours. According to monitoring of a sample by TLC, the raw material La001-3 was basically completely reacted. Cooling was performed to room temperature, and deionized water was added for water washing for 3 times (100 ml/time). Then, liquid separation was performed, and an organic phase was concentrated under reduced pressure to obtain a solid. The crude product was separated by column chromatography (with a mixture of EA and Hex at a ratio of 1:10), and a resulting product was dried to obtain 11.45 g of a white-like solid compound La005-1 with a yield of 54.0%. The mass spectrum was: 247.2 (M+H).

Synthesis of a Compound La005-2

The compound La005-1 (8 g, 32.49 mmol, 1.0 eq), dimethyl zinc (9.3 g, 97.46 mmol, 3.0 eq) and trifluoroethanol (200 ml) were sequentially added into a 1 L three-necked flask, vacuumization was performed for nitrogen replacement for 3 times, and the reaction system was cooled to −30° C. Titanium tetrachloride (18.49 g, 97.46 mmol, 3.0 eq) was slowly added dropwise, and after the dropping was completed, the above compounds were stirred at room temperature for 2 hours. According to monitoring of a sample by TLC, the raw material La005-1 was basically completely reacted. Deionized water (100 ml) was slowly added for quenching, and ethyl acetate (250 ml) was added. Then, stirring was performed for extraction and liquid separation, and an organic phase was concentrated under reduced pressure to obtain a solid. The crude product was separated by column chromatography (with a mixture of EA and Hex at a ratio of 1:20), and a resulting product was dried to obtain 6.82 g of a white-like solid compound La005-2 with a yield of 80.7%. The mass spectrum was: 261.3 (M+H).

Synthesis of a Compound La005

With reference to synthesis and purification methods of the compound La001, only the corresponding raw materials were required to be changed. The mass spectrum was: 263.3 (M+H).

Synthesis of a Compound $Ir(La005)_2(Lb012)$

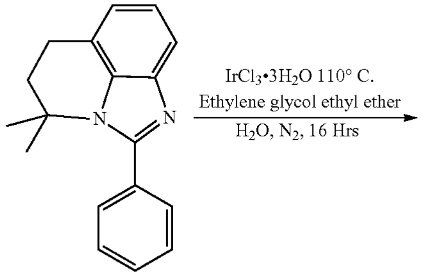

La005

-continued

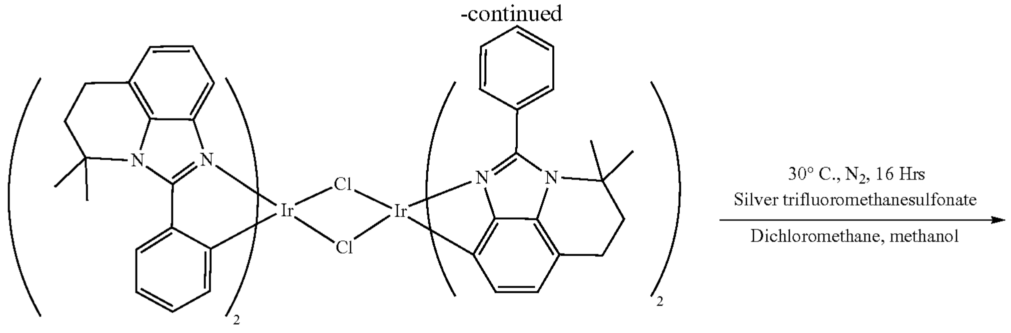

Ir(La005)-1

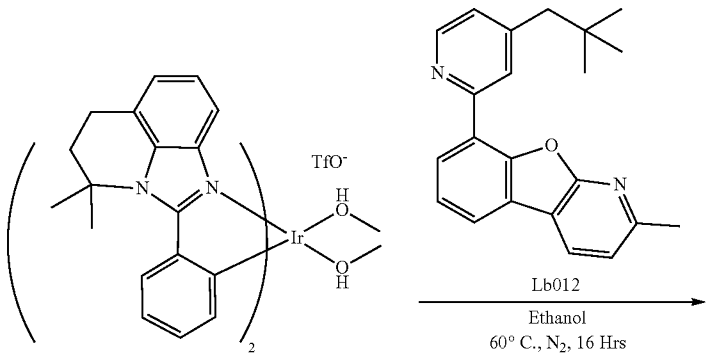

Ir(La005)-2

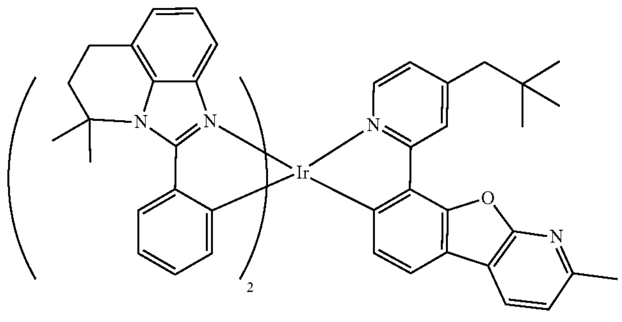

$Ir(La005)_2(Lb012)$

Synthesis of a Compound Ir(La005)-1

With reference to synthesis and purification methods of the compound Ir(Lb002)-1, only the corresponding raw materials were required to be changed, and an obtained compound was directly used in the next step without purification.

Synthesis of a Compound Ir(La005)-2

With reference to synthesis and purification methods of the compound Ir(Lb002)-2, only the corresponding raw materials were required to be changed, and an obtained compound was directly used in the next step without purification.

Synthesis of a Compound $Ir(La005)_2(Lb012)$

With reference to synthesis and purification methods of the compound $Ir(La001)(Lb002)_2$, only the corresponding raw materials were required to be changed, and 3.14 g of a target compound $Ir(La005)_2(Lb012)$ with a yield of 43.1% was obtained. 3.14 g of the crude product $Ir(La005)_2(Lb012)$ was sublimated and purified to obtain 2.03 g of sublimated and purified $Ir(La005)_2(Lb012)$ with a yield of 64.6%. The mass spectrum was: 1045.31 (M+H). $^1H$ NMR (400 MHZ, $CDCl_3$) δ 8.71 (, 1H), 8.40 (d, 1H), 7.81 (d, J=35.0 Hz, 3H), 7.69 (m, 3H), 7.62-7.38 (m, 8H), 7.22 (m, 3H), 7.03 (d, J=20.0 Hz, 2H), 3.21 (s, 2H), 2.97 (t, 4H), 2.68 (s, 3H), 2.21 (t, 4H), 1.45 (s, 12H), 0.89(s, 9H).

Synthesis of a Compound Ir(La033)(Lb012)(Lc008)
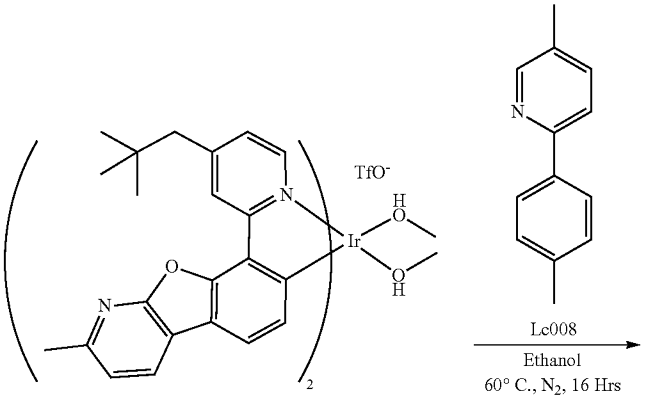
Lb012-2
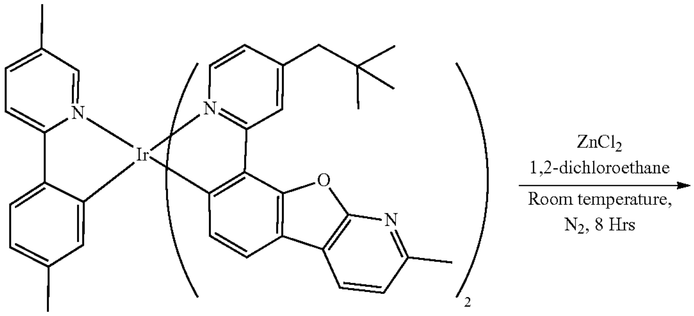
Ir$(Lb012)_2$(Lc008)
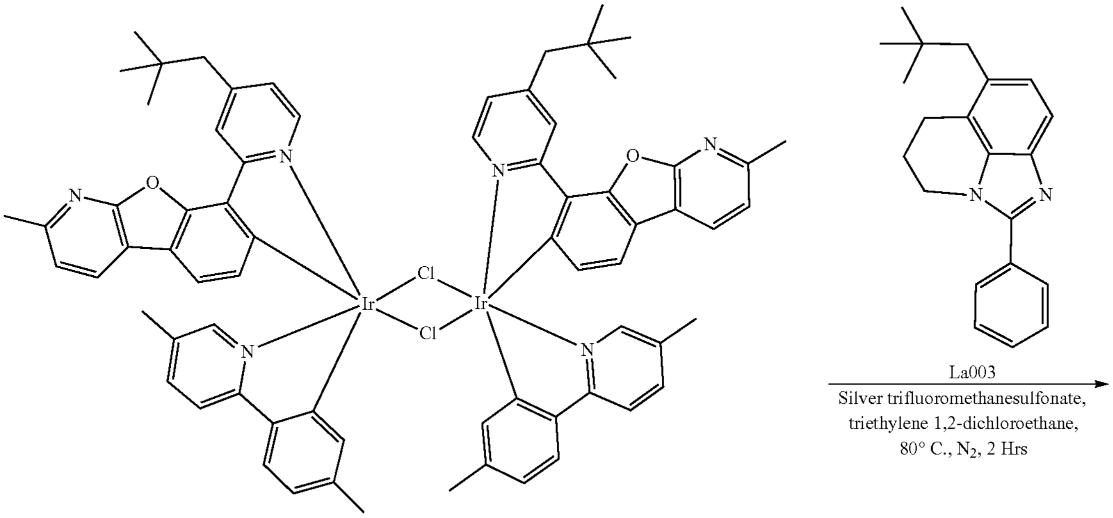
Ir(Lb012)(Lc008)-1

-continued

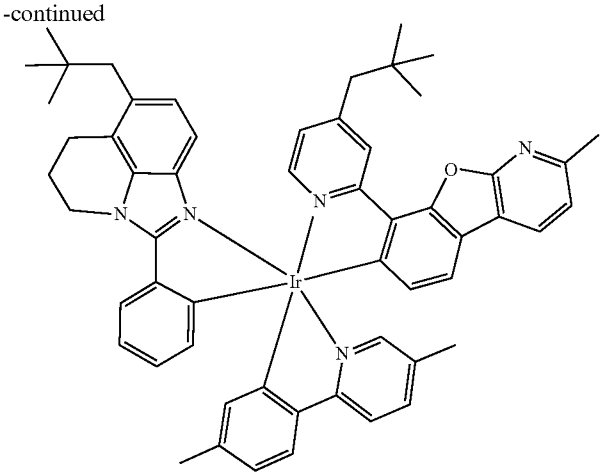

Ir(La033)(Lb012)(Lc008)

Synthesis of a Compound Ir($Lb012)_2$(Lc008)

With reference to synthesis and purification methods of the compound Ir(La001)($Lb002)_2$, only the corresponding raw materials were required to be changed, and 5.33 g of a target compound Ir($Lb012)_2$(Lc008) with a yield of 47.91% was obtained. The mass spectrum was: 887.11 (M+H).

Synthesis of a Compound Ir(Lb012)(Lc008)-1

With reference to synthesis and purification methods of the compound Ir(La001)(Lb012)-1, only the corresponding raw materials were required to be changed, and an obtained compound was directly used in the next step without purification.

Synthesis of a Compound Ir(La033)(Lb012)(Lc008)

With reference to synthesis and purification methods of the compound Ir(La001)(Lb012)(Lc003), only the corresponding raw materials were required to be changed, and 1.41 g of a target compound Ir(La033)(Lb012)(Lc008) with a yield of 31.22% was obtained. 1.41 g of the crude product Ir(La033)(Lb012)(Lc008) was sublimated and purified to obtain 0.88 g of sublimated and purified Ir(La033)(Lb012)(Lc008) with a yield of 62.41%. The mass spectrum was: 1045.31 (M+H). $^1$H NMR (400 MHZ, $CDCl_3$)8 8.67 (s, 1H), 8.34 (d, J=35.5 Hz, 2H), 8.11 (m, 2H), 7.84 (m, 2H), 7.79-7.66 (m, 3H), 7.54 (d, J=40.0 Hz, 2H), 7.42 (m, 2H), 7.28 (d, J=15.0 Hz, 2H), 7.12-6.97 (m, 3H), 3.99 (t, 2H), 3.22 (s, 2H), 2.98 (t 2H), 2.67 (d, J=15.0 Hz, 5H), 2.31 (d, J=5.0 Hz, 6H), 2.26 (dt, 2H), 0.85 (s, 18H).

Synthesis of a Ligand La034

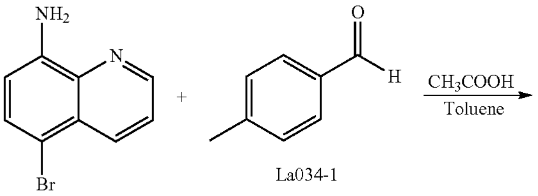

La034-1

La033-1

-continued

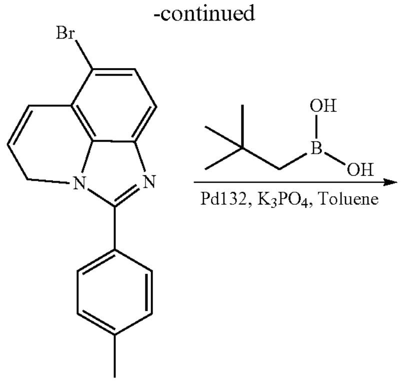

La034-2

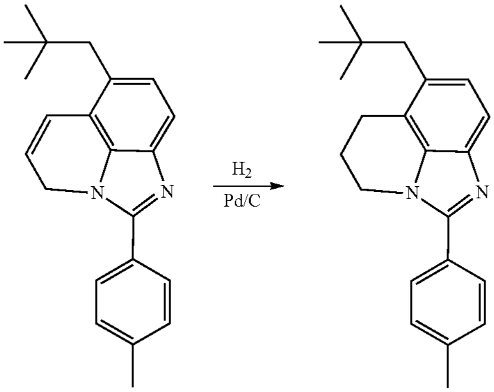

La034-3

La034

Synthesis of a Compound La034-2

With reference to synthesis and purification methods of the compound La001-3, only the corresponding raw materials were required to be changed. The mass spectrum was: 326.2 (M+H).

Synthesis of a Compound La034-3

With reference to synthesis and purification methods of the compound La033-4, only the corresponding raw materials were required to be changed. The mass spectrum was: 317.4 (M+H).

Synthesis of a Compound La034

With reference to synthesis and purification methods of the compound La001, only the corresponding raw materials were required to be changed. The mass spectrum was: 319.4 (M+H).

Synthesis of a Compound Ir(La034)(Lb012)(Lc008)

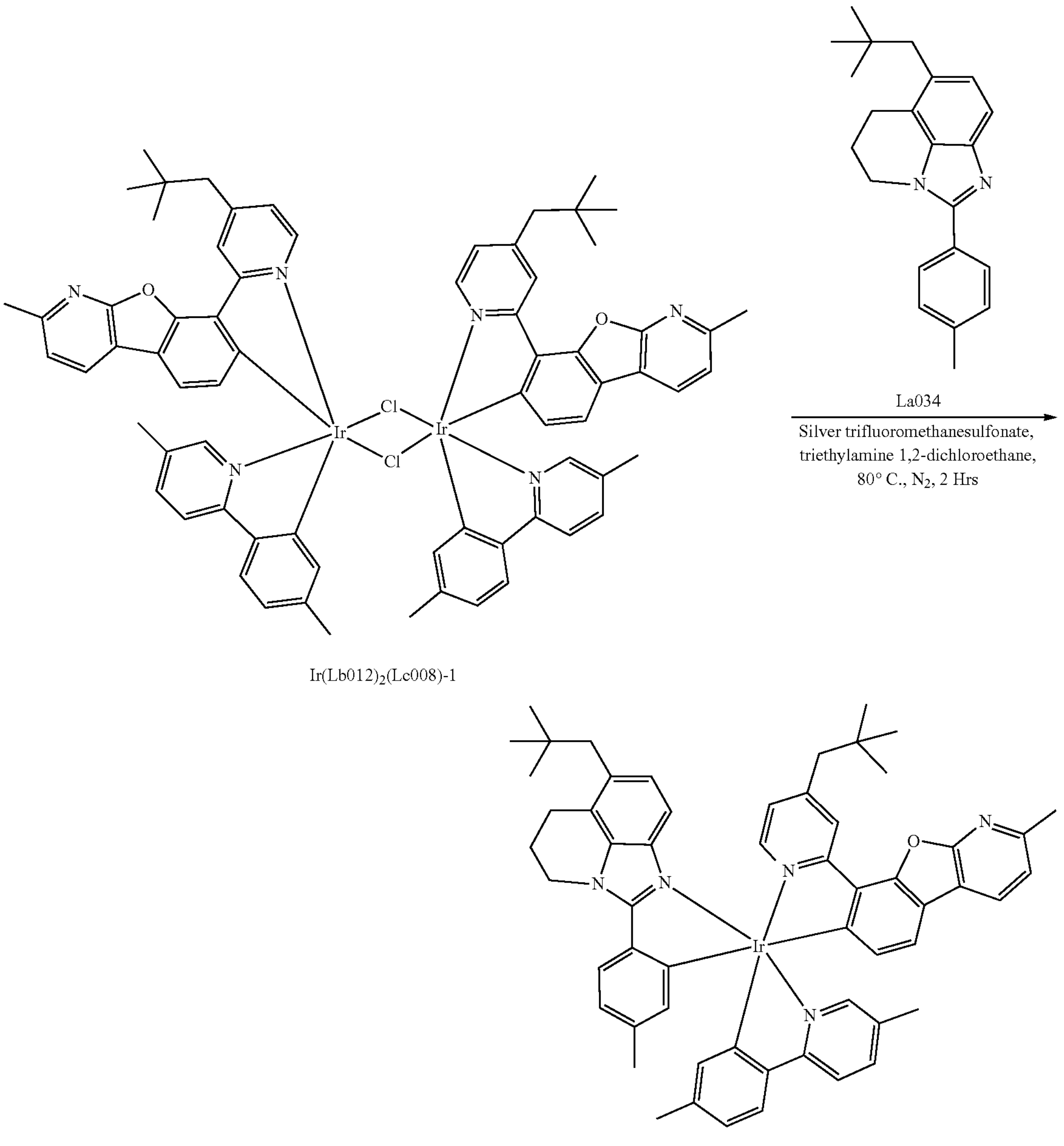

La034

Ir(Lb012)$_2$(Lc008)-1

Ir(La034)(Lb012)(Lc008)

With reference to synthesis and purification methods of the compound Ir(La001)(Lb012)(Lc003), only the corresponding raw materials were required to be changed, and 1.12 g of a target compound Ir(La034)(Lb012)(Lc008) with a yield of 26.8% was obtained. 1.12 g of the crude product Ir(La034)(Lb012)(Lc008) was sublimated and purified to obtain 0.72 g of sublimated and purified Ir(La034)(Lb012)(Lc008) with a yield of 64.28%. The mass spectrum was: 1022.32 (M+H). $^{1}$H NMR (400 MHZ, $CDCl_3$) δ 8.68 (d, J=38.5 Hz, 2H), 8.30 (m, 2H), 8.11 (m, 2H), 7.84 (m, 2H), 7.78-7.66 (m, 3H), 7.58 (d, 1H), 7.28 (d, J=15.0 Hz, 3H), 7.11-6.95 (m, 3H), 3.97 (t, 2H), 3.21 (s, 2H), 2.97 (t, 2H), 2.67 (d, J=15.0 Hz, 5H), 2.40-2.14 (m, 11H), 0.98 (s, 18H).

Synthesis of a Ligand La035

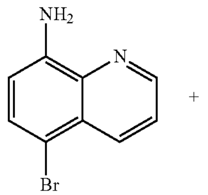

La033-1

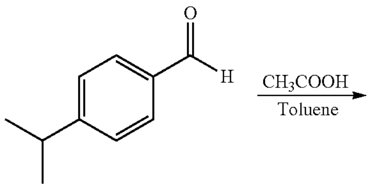

La035-1

-continued

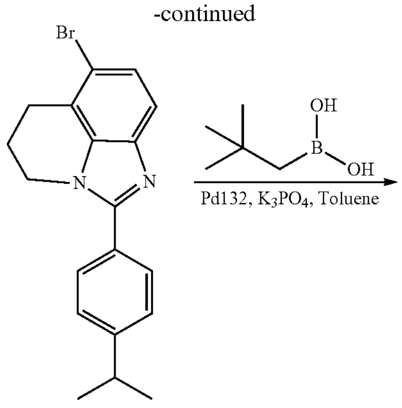

La035-2

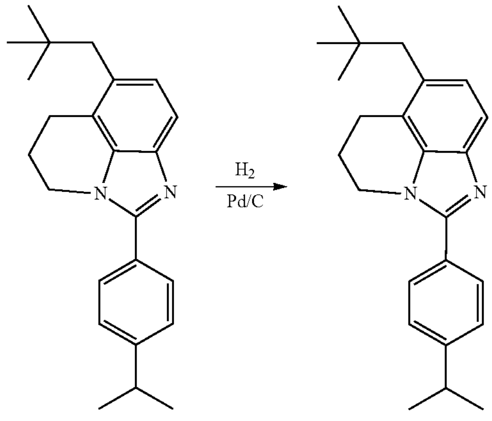

La035-3 La035

Synthesis of a Compound La035-2

With reference to synthesis and purification methods of the compound La001-3, only the corresponding raw materials were required to be changed. The mass spectrum was: 354.2 (M+H).

Synthesis of a Compound La035-3

With reference to synthesis and purification methods of the compound La033-4, only the corresponding raw materials were required to be changed. The mass spectrum was: 345.4 (M+H).

Synthesis of a Compound La035

With reference to synthesis and purification methods of the compound La001, only the corresponding raw materials were required to be changed. The mass spectrum was: 347.5 (M+H).

Synthesis of a Compound Ir(La035)(Lb012)(Lc008)

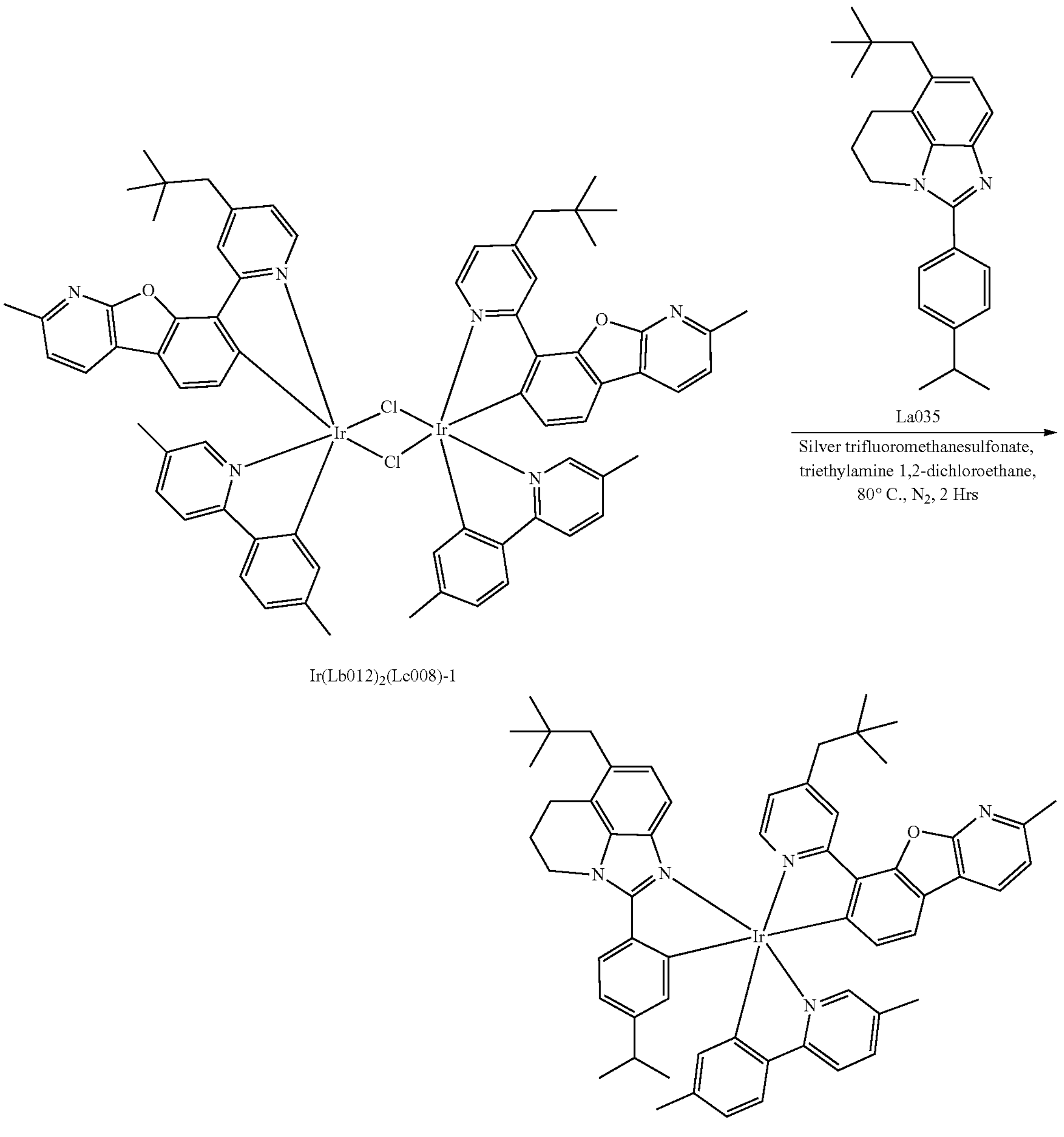

La035

$Ir(Lb012)_2(Lc008)$-1

Ir(La035)(Lb012)(Lc008)

With reference to synthesis and purification methods of the compound Ir(La001)(Lb012)(Lc003), only the corresponding raw materials were required to be changed, and 1.24 g of a target compound Ir(La035)(Lb012)(Lc008) with a yield of 26.8% was obtained. 1.24 g of the crude product Ir(La035)(Lb012)(Lc008) was sublimated and purified to obtain 0.76 g of sublimated and purified Ir(La035)(Lb012)(Lc008) with a yield of 61.29%. The mass spectrum was: 1050.37 (M+H). $^1$H NMR (400 MHZ, $CDCl_3$) δ 8.67 (s, 1H), 8.32 (d, J=22.1 Hz, 2H), 8.11 (m, 3H), 7.87-7.65 (m, 4H), 7.58 (d, J=5.0 Hz, 2H), 7.28 (d, J=15.0 Hz, 2H), 7.12-6.95 (m, 4H), 3.97 (t, 2H), 3.21 (s, 2H), 2.92 (d, J=50.0 Hz, 3H), 2.67 (d, J=15.0 Hz, 5H), 2.42-2.19 (m, 8H), 1.20 (s, 6H), 0.88 (s, 18H).

Synthesis of a Ligand La036

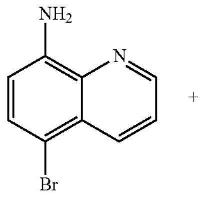

La033-1

-continued

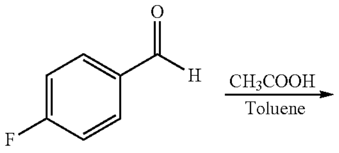

La036-1

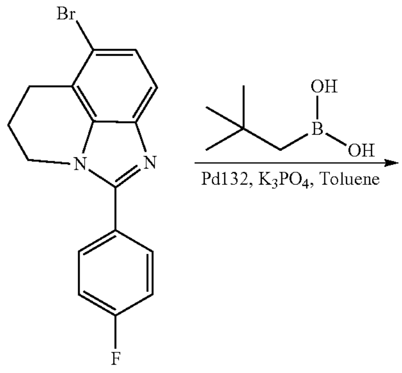

La036-2

-continued

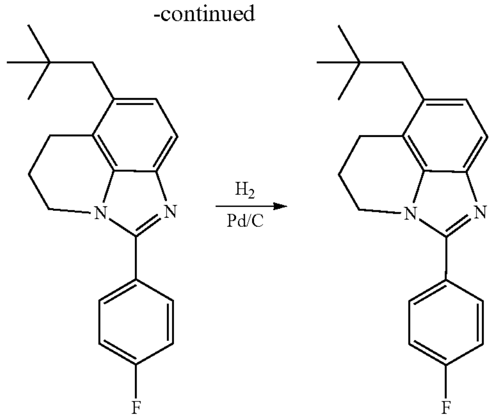

La036-3

La036

Synthesis of a Compound La036-2

With reference to synthesis and purification methods of the compound La001-3, only the corresponding raw materials were required to be changed. The mass spectrum was: 330.1 (M+H).

Synthesis of a Compound La036-3

With reference to synthesis and purification methods of the compound La033-4, only the corresponding raw materials were required to be changed. The mass spectrum was: 321.4 (M+H).

Synthesis of a Compound La036

With reference to synthesis and purification methods of the compound La001, only the corresponding raw materials were required to be changed. The mass spectrum was: 323.4 (M+H).

Synthesis of a Compound Ir(La036)(Lb012)(Lc008)

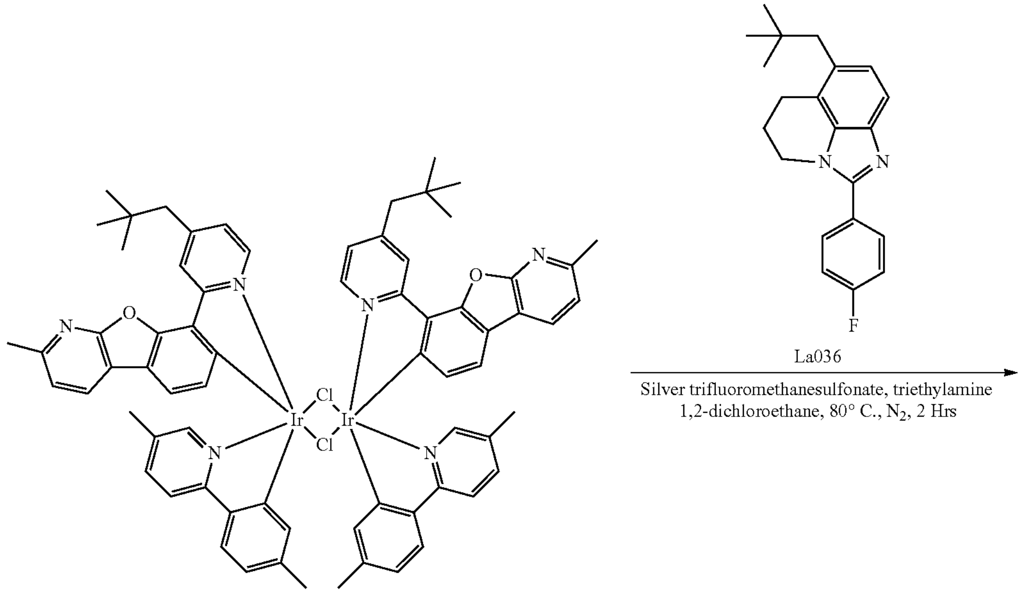

$Ir(Lb012)_2(Lc008)$-1

-continued

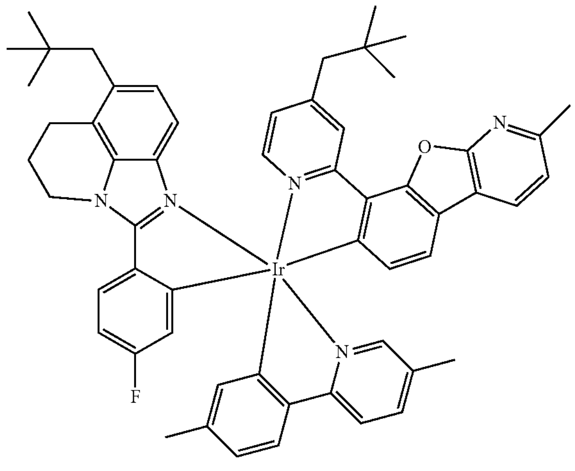

Ir(La036)(Lb012)(Lc008)

With reference to synthesis and purification methods of the compound Ir(La001)(Lb012)(Lc003), only the corresponding raw materials were required to be changed, and 1.22 g of a target compound Ir(La036)(Lb012)(Lc008) with a yield of 28.8% was obtained. 1.22 g of the crude product Ir(La036)(Lb012)(Lc008) was sublimated and purified to obtain 0.82 g of sublimated and purified Ir(La036)(Lb012)(Lc008) with a yield of 67.21%. The mass spectrum was: 1026.28 (M+H). $^1$H NMR (400 MHZ, $CDCl_3$) δ 8.65 (d, J=40.5 Hz, 2H), 8.30 (m, 2H), 8.11 (m, 2H), 7.84 (s, 1H), 7.78-7.66 (m, 3H), 7.58 (m, 2H), 7.36-7.22 (m, 3H), 7.11-6.97 (m, 3H), 3.98 (t, 2H), 3.21 (s, 2H), 2.97 (t, 2H), 2.67 (d, J=15.0 Hz, 5H), 2.40-2.19 (m, 8H), 0.89 (s, 18H).

Synthesis of a Ligand La037

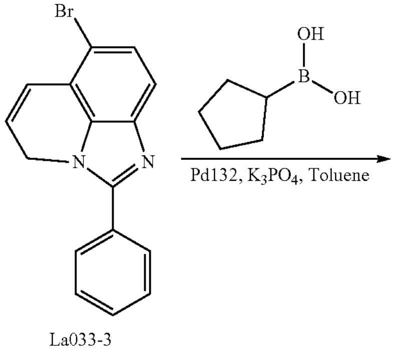

La033-3

-continued

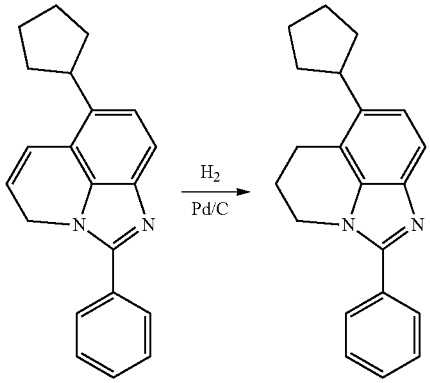

La037-1 La037

Synthesis of a Compound La037-1

With reference to synthesis and purification methods of the compound La033-4, only the corresponding raw materials were required to be changed. The mass spectrum was: 301.4 (M+H).

Synthesis of a Compound La037

With reference to synthesis and purification methods of the compound La001, only the corresponding raw materials were required to be changed. The mass spectrum was: 303.4 (M+H).

Synthesis of a Compound Ir(La037)(Lb012)(Lc008)

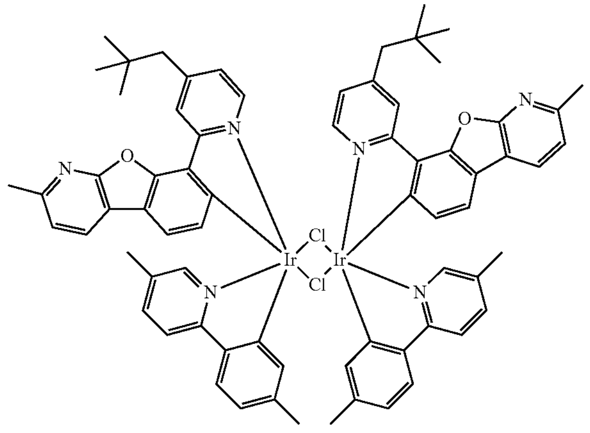

$Ir(Lb012)_2(Lc008)$-1

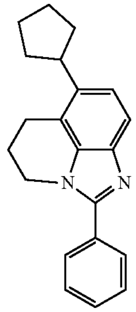

La037

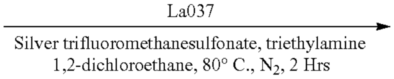

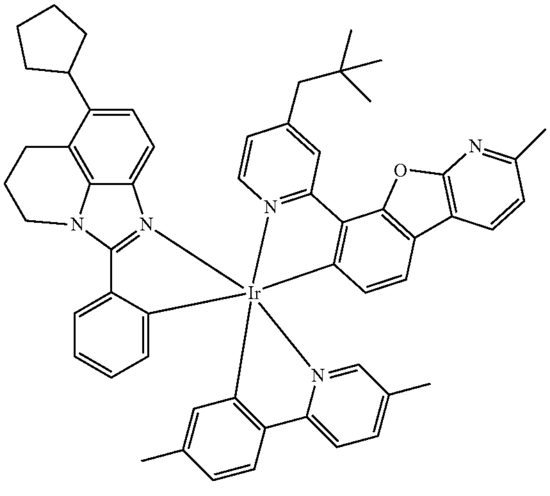

Ir(La037)(Lb012)(Lc008)

With reference to synthesis and purification methods of the compound Ir(La001)(Lb012)(Lc003), only the corresponding raw materials were required to be changed, and 1.38 g of a target compound Ir(La037)(Lb012)(Lc008) with a yield of 32.11% was obtained. 1.38 g of the crude product Ir(La037)(Lb012)(Lc008) was sublimated and purified to obtain 1.02 g of sublimated and purified Ir(La037)(Lb012)(Lc008) with a yield of 73.91%. The mass spectrum was: 1006.28 (M+H). $^1H$ NMR (400 MHZ, $CDCl_3$) δ 8.66(s, 1H), 8.32 (d, J=17.9 Hz, 2H), 8.11 (m, 4H), 7.88-7.65 (m, 5H), 7.46 (d, J=40.0 Hz, 2H), 7.28 (d, J=15.0 Hz, 2H), 7.11-6.97 (m, 4H), 3.99 (t, 2H), 3.21 (s, 2H), 2.97 (t, 2H), 2.64 (d, J=42.9 Hz, 4H), 2.41-2.19 (m, 8H), 2.00 (s, 2H), 1.71 (t, J=25.0 Hz, 6H), 0.85 (s, 9H).

Synthesis of a Ligand La057

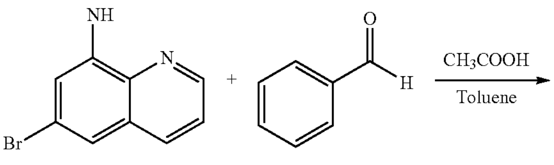

La057-1 La033-2

-continued

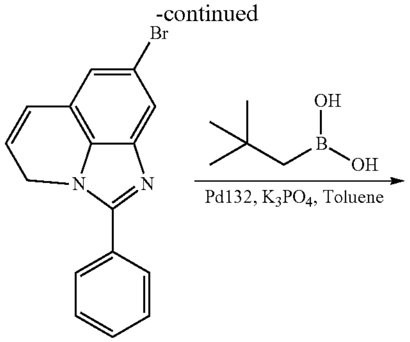

La057-2

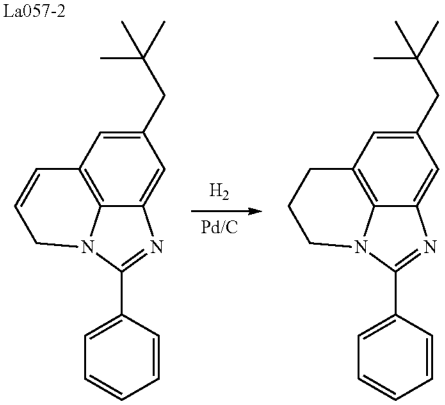

La057-3 La057

Synthesis of a Compound La057-2

With reference to synthesis and purification methods of the compound La001-3, only the corresponding raw materials were required to be changed. The mass spectrum was: 312.8 (M+H).

Synthesis of a Compound La057-3

With reference to synthesis and purification methods of the compound La033-4, only the corresponding raw materials were required to be changed. The mass spectrum was: 303.4 (M+H).

Synthesis of a Compound La057

With reference to synthesis and purification methods of the compound La001, only the corresponding raw materials were required to be changed. The mass spectrum was: 305.4 (M+H).

Synthesis of a Compound Ir(La057)(Lb012)(Lc008)

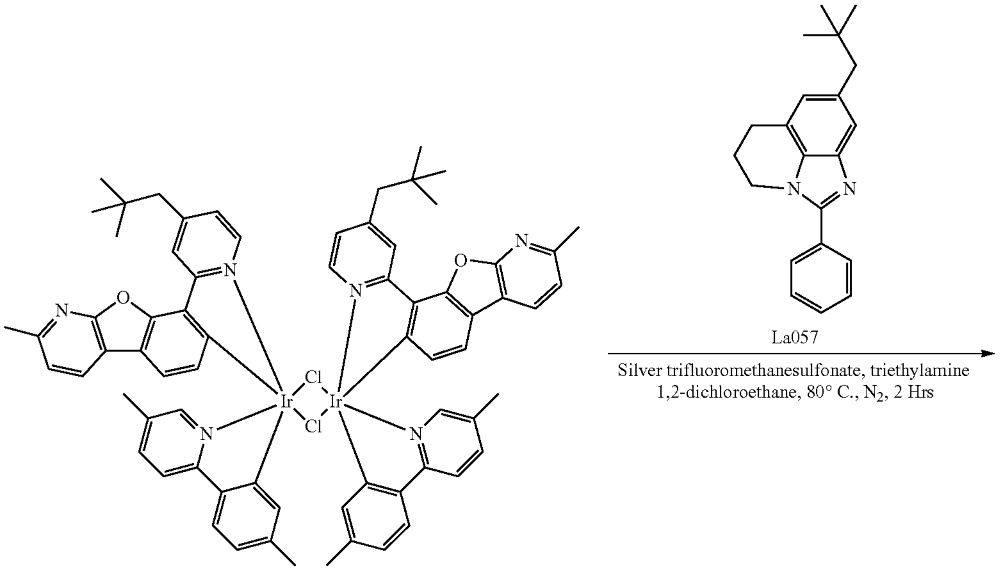

$Ir(Lb012)_2(Lc008)$-1

-continued

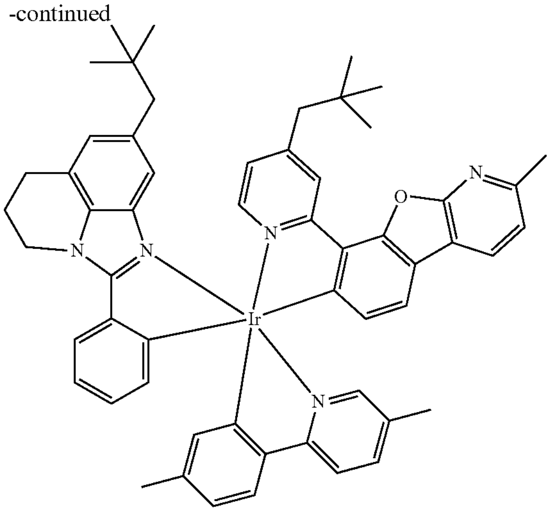

Ir(La057)(Lb012)(Lc008)

With reference to synthesis and purification methods of the compound Ir(La001)(Lb012)(Lc003), only the corresponding raw materials were required to be changed, and 1.2 g of a target compound Ir(La057)(Lb012)(Lc008) with a yield of 26.7% was obtained. 1.2 g of the crude product Ir(La057)(Lb012)(Lc008) was sublimated and purified to obtain 0.83 g of sublimated and purified Ir(La057)(Lb012)(Lc008) with a yield of 69.16%. The mass spectrum was: 1008.29 (M+H). $^1$H NMR (400 MHZ, $CDCl_3$) δ 8.65 (s, 1H), 8.31 (d, J=15.0 Hz, 2H), 8.11 (m, 4H), 7.88-7.65 (m, 4H), 7.46 (d, J=40.0 Hz, 2H), 7.37-7.21 (m, 4H), 7.11-6.89 (m, 3H), 3.98(t, 2H), 3.21 (s, 2H), 2.97 (t, 2H), 2.68 (s, 3H), 2.43 (s, 2H), 2.37-2.21 (m, 8H), 0.88 (s, 18H).

Synthesis of a Ligand La085

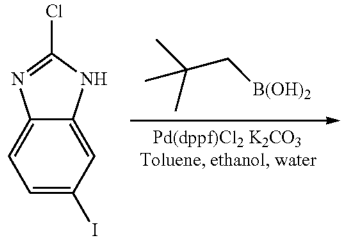

La085-1

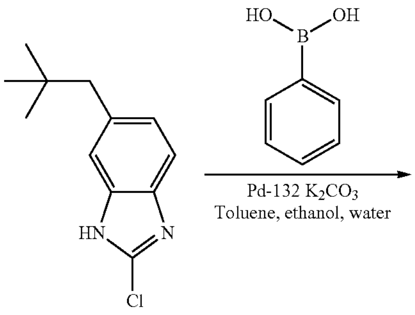

La085-2

-continued

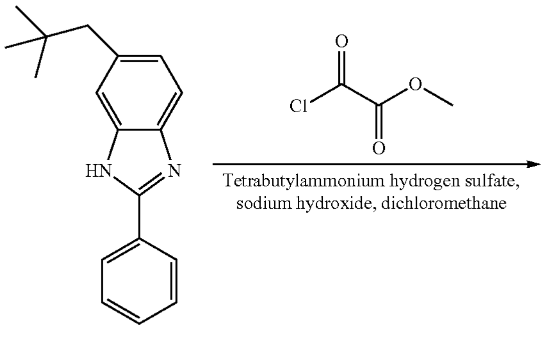

La085-3

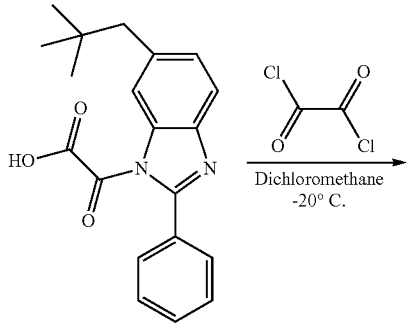

La085-4

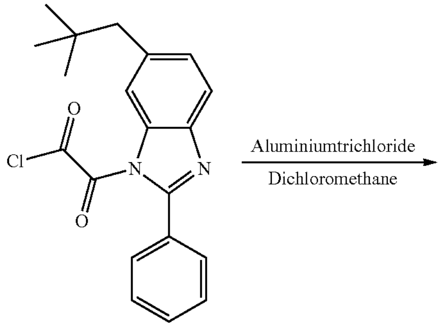

La085-5

-continued

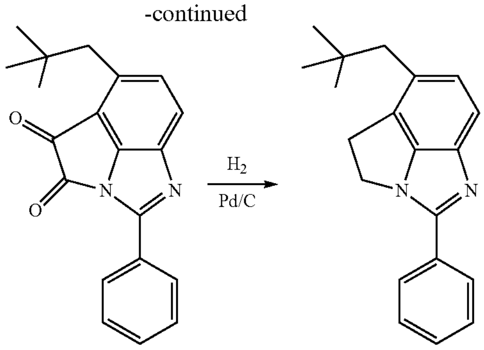

La085-6 La085

Synthesis of a Compound La085-2

A compound La085-1 (25 g, 89.77 mmol, 1.0 eq), isobutaneboronic acid (10.93 g, 94.26 mmol, 1.05 eq), [1,1'-bis(diphenylphosphino)ferrocene]dichloropalladium (1.31 g, 1.8 mmol, 0.02 eq), potassium carbonate (24.81 g, 179.55 mmol, 2.0 eq), toluene (200 ml), ethanol (40 ml) and deionized water (40 ml) were sequentially added into a 500 ml three-necked flask, vacuumization was performed for nitrogen replacement for 3 times, and the above compounds were heated to about 80° C. in an oil bath and stirred for 16 hours. According to monitoring of a sample by TLC, the raw material La085-1 was basically completely reacted. Cooling was performed to room temperature, and deionized water was added for water washing for 3 times (100 ml/time). Then, liquid separation was performed, and an organic phase was concentrated under reduced pressure to obtain a solid. The crude product was separated by column chromatography (with a mixture of EA and Hex at a ratio of 1:30), and a resulting product was dried to obtain 15.1 g of a white-like solid compound La085-2 with a yield of 75.8%. The mass spectrum was: 223.7 (M+H).

Synthesis of a Compound La085-3

The compound La085-2 (15 g, 67.35 mmol, 1.0 eq), isobutaneboronic acid (8.21 g, 67.35 mmol, 1.0 eq), bis(di-tert-butyl(4-dimethylaminophenyl)phosphine)dichloropalladium (II) (0.95 g, 1.35 mmol, 0.02 eq), potassium carbonate (18.62 g, 134.7 mmol, 2.0 eq), toluene (150 ml), ethanol (30 ml) and deionized water (30 ml) were sequentially added into a 500 ml three-necked flask, vacuumization was performed for nitrogen replacement for 3 times, and the above compounds were heated to about 80° C. in an oil bath and stirred for 8 hours. According to monitoring of a sample by TLC, the raw material La085-2 was basically completely reacted. Cooling was performed to room temperature, and deionized water was added for water washing for 3 times (100 ml/time). Then, liquid separation was performed, and an organic phase was concentrated under reduced pressure to obtain a solid. The crude product was separated by column chromatography (with a mixture of EA and Hex at a ratio of 1:20), and a resulting product was dried to obtain 15.44 g of a white-like solid compound La085-3 with a yield of 86.7%. The mass spectrum was: 265.3 (M+H).

Synthesis of a Compound La085-4

The compound La085-3 (15 g, 56.74 mmol, 1.0 eq), tetrabutylammonium hydrogen sulfate (3.85 g, 11.35 mmol, 0.2 eq), sodium hydroxide (4.54 g, 113.48 mmol, 2.0 eq) and dichloromethane (150 ml) were sequentially added into a 500 ml three-necked flask, vacuumization was performed for nitrogen replacement for 3 times, and the system was cooled to 0° C. and stirred for 0.5 hour. Methyl chloroformylformate (13.9 g, 113.48 mmol, 2.0 eq) was slowly added dropwise into a reaction solution, and after the dropping was completed, the above compounds were stirred at room temperature for 2 hours. According to monitoring of a sample by TLC, the raw material La085-3 was basically completely reacted. Cooling was performed to room temperature, the reaction solution was concentrated and dried, dichloromethane (200 ml) was added and stirred for dissolution, and deionized water was added for water washing for 3 times (100 ml/time). Then, liquid separation was performed, and an organic phase was concentrated and dried. A crude product was separated by column chromatography (with a mixture of EA and Hex at a ratio of 1:15), and a resulting product was dried to obtain 13.61 g of a white-like solid compound La085-4 with a yield of 71.3%. The mass spectrum was: 337.3 (M+H).

Synthesis of a Compound La085-5

The compound La085-4 (12 g, 37.45 mmol, 1.0 eq) and dichloromethane (120 ml) were sequentially added into a 500 ml three-necked flask and stirred for dissolved clarification, and a reaction solution was cooled to 0° C. Oxalyl chloride (7.13 g, 56.18 mmol, 1.5 eq) was slowly added dropwise into the reaction solution, and after the dropping was completed, the above compounds were stirred at room temperature for 2 hours. According to monitoring of a sample by TLC, the raw material La085-4 was basically completely reacted. Cooling was performed to room temperature, the reaction solution was concentrated and dried, and a resulting crude product was directly used in a reaction in the next step. 12.06 g of a white-like solid compound La085-5 with a yield of 95.3% was obtained. The mass spectrum was: 355.8 (M+H).

Synthesis of a Compound La085-6

The compound La085-5 (14 g, 39.46 mmol, 1.0 eq), aluminiumtrichloride (13.15 g, 98.64 mmol, 2.5 eq) and dichloromethane (150 ml) were sequentially added into a 500 ml three-necked flask, vacuumization was performed for nitrogen replacement for 3 times, and the above compounds were stirred at room temperature for 2 hours. According to monitoring of a sample by TLC, the raw material La085-5 was basically completely reacted. Cooling was performed to room temperature, and deionized water (300 ml) was slowly added for quenching in an ice bath. Then, water washing and liquid separation were performed, and an organic phase was concentrated under reduced pressure to obtain a solid. The crude product was separated by column chromatography (with a mixture of EA and Hex at a ratio of 1:10), and a resulting product was dried to obtain 9.95 g of a white-like solid compound La085-6 with a yield of 79.2%. The mass spectrum was: 319.3 (M+H).

Synthesis of a Compound La085

With reference to synthesis and purification methods of the compound La001, only the corresponding raw materials were required to be changed. The mass spectrum was: 291.4 (M+H).

Synthesis of a Compound Ir(La085)(Lb005)$_2$

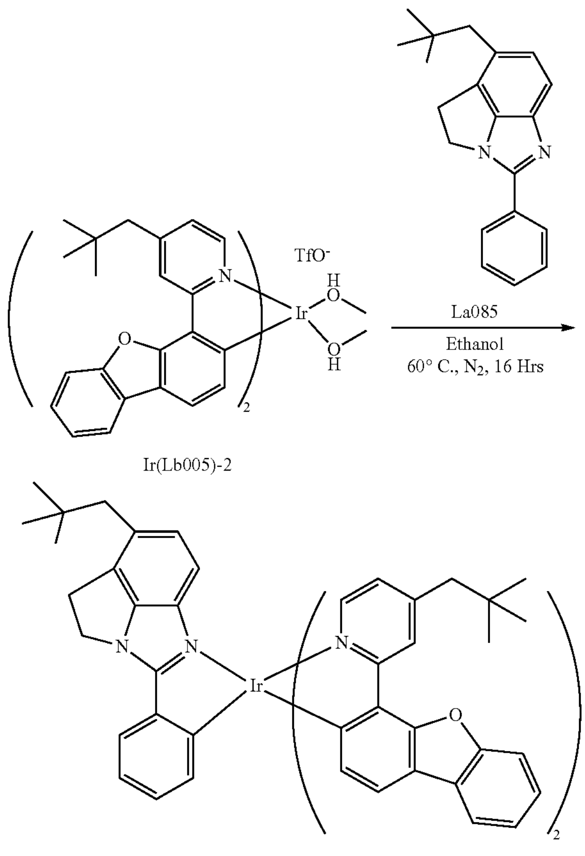

Ir(Lb005)-2

Ir(La085)(Lb005)$_2$

With reference to synthesis and purification methods of the compound Ir(La001)(Lb002)$_2$, only the corresponding raw materials were required to be changed, and 2.37 g of a target compound Ir(La085)(Lb005)$_2$ with a yield of 34.4% was obtained. 2.37 g of the crude product Ir(La085)(Lb005)$_2$ was sublimated and purified to obtain 1.42 g of sublimated and purified Ir(La085)(Lb005)$_2$ with a yield of 59.9%. The mass spectrum was: 1111.41 (M+H). $^1$H NMR (400 MHZ, $CDCl_3$) δ 8.66 (s, 2H), 7.98 (m, 4H), 7.87-7.65 (m, 6H), 7.62-7.45 (m, 4H), 7.45-7.26 (m, 5H), 7.06 (d, J=10.0 Hz, 3H), 4.50 (d, J=20.6 Hz, 2H), 3.33 (t, 2H), 3.21 (s, 4H), 2.65 (s, 2H), 0.87 (s, 27H).

Synthesis of a Ligand La093

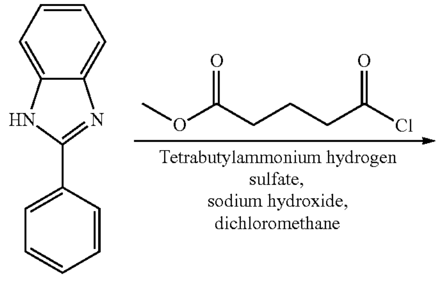

La093-1

-continued

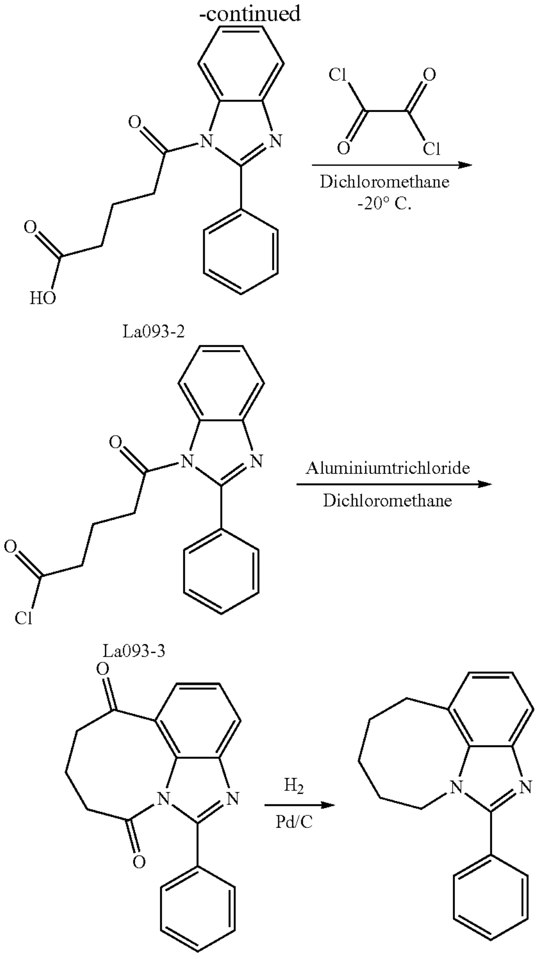

La093-2

La093-3

La093-4

La093

Synthesis of a Compound La093-2

With reference to synthesis and purification methods of the compound La085-4, only the corresponding raw materials were required to be changed. The mass spectrum was: 309.3 (M+H).

Synthesis of a Compound La093-3

With reference to synthesis and purification methods of the compound La085-5, only the corresponding raw materials were required to be changed. The mass spectrum was: 327.7 (M+H).

Synthesis of a Compound La093-4

With reference to synthesis and purification methods of the compound La085-6, only the corresponding raw materials were required to be changed. The mass spectrum was: 291 (M+H).

Synthesis of a Compound La093

With reference to synthesis and purification methods of the compound La085, only the corresponding raw materials were required to be changed. The mass spectrum was: 263.3 (M+H).

Synthesis of a Compound Ir(La093)(Lb005)$_2$

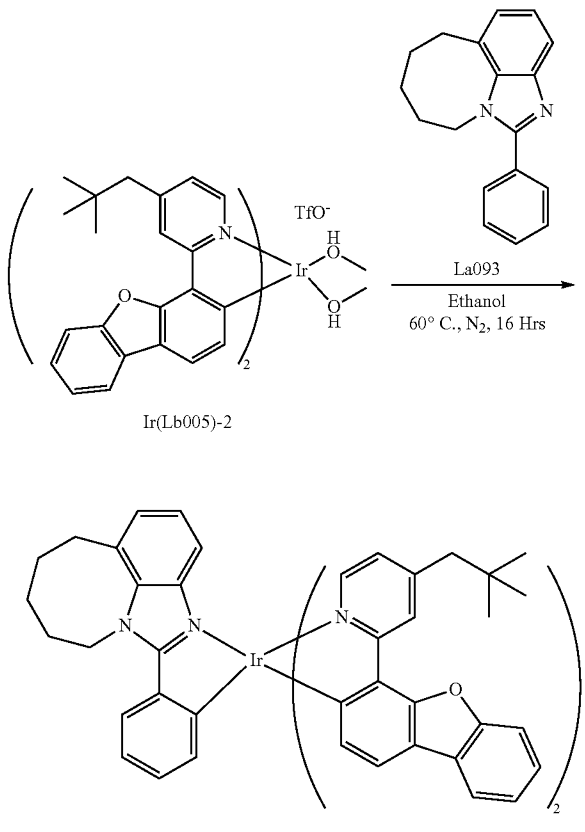

Ir(Lb005)-2

Ir(La093)(Lb005)$_2$

With reference to synthesis and purification methods of the compound Ir(La001)(Lb002)$_2$, only the corresponding raw materials were required to be changed, and 1.87 g of a target compound Ir(La093)(Lb005)$_2$ with a yield of 28.8% was obtained. 1.87 g of the crude product Ir(La093)(Lb005)$_2$ was sublimated and purified to obtain 1.05 g of sublimated and purified Ir(La093)(Lb005)$_2$ with a yield of 56.14%. The mass spectrum was: 1083.3 (M+H). $^1$H NMR (400 MHZ, $CDCl_3$) δ 8.66(s, 2H), 7.98 (s, 2H), 7.84 (m, 3H), 7.77 (m, 2H), 7.69 (m, 3H), 7.61-7.47 (m, 4H), 7.46-7.35 (m, 4H), 7.31 (m, 2H), 7.22 (d, 1H), 7.05 (d, 2H), 5.66 (t, 1H), 5.16 (t, 1H), 3.21 (t, 4H), 2.74 (t, 2H), 1.84 (m, 2H), 1.62 (m, 2H), 1.32 (m, 2H), 0.85 (s, 18H).

Synthesis of a Ligand La097

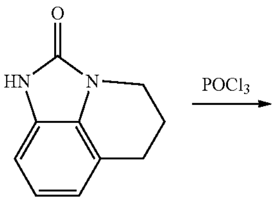

La097-1

-continued

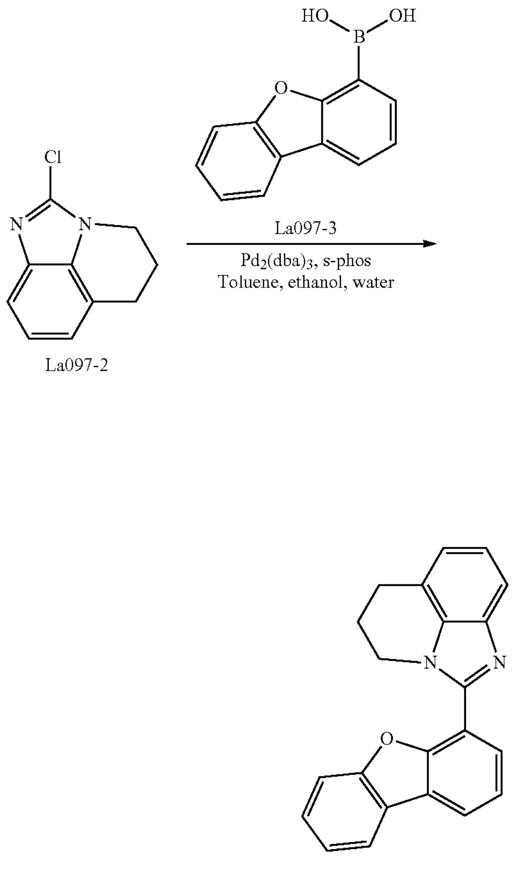

La097-2

La097

Synthesis of a Compound La097-2

A compound La097-1 (8.0 g, 45.92 mmol, 1.0 eq) and phosphorus oxychloride (100 ml) were sequentially added into a 500 ml three-necked flask, vacuumization was performed for nitrogen replacement for 3 times, and the above compounds were stirred at room temperature for 2 hours. According to monitoring of a sample by TLC, the raw material La097-1 was basically completely reacted. Cooling was performed to room temperature, and deionized water (300 ml) was slowly added for quenching in an ice bath. Then, ethyl acetate (100 ml) was added for extraction and liquid separation, and an organic phase was washed with water to neutral, collected and concentrated under reduced pressure to obtain a solid. The crude product was separated by column chromatography (with a mixture of dichloromethane (DCM) and Hex at a ratio of 1:10), and a resulting product was dried to obtain 7.38 g of a white-like solid compound La097-2 with a yield of 83.4%. The mass spectrum was: 193.6 (M+H).

Synthesis of a Compound La097

With reference to synthesis and purification methods of the compound La085-3, only the corresponding raw materials were required to be changed. The mass spectrum was: 325.3 (M+H).

Synthesis of a Compound Ir(La097)(Lb005)$_2$

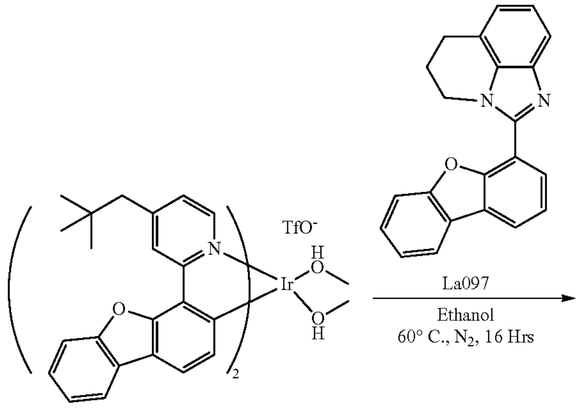

Ir(Lb005)-2

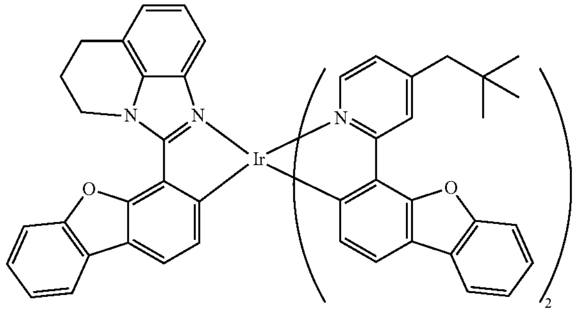

Ir(La097)(Lb005)$_2$

With reference to synthesis and purification methods of the compound Ir(La001)(Lb002)$_2$, only the corresponding raw materials were required to be changed, and 1.87 g of a target compound Ir(La097)(Lb005)$_2$ with a yield of 28.8% was obtained. 1.87 g of the crude product Ir(La097)(Lb005)$_2$ was sublimated and purified to obtain 1.05 g of sublimated and purified Ir(La097)(Lb005)$_2$ with a yield of 56.14%. The mass spectrum was: 1083.3 (M+H). $^1$H NMR (400 MHZ, $CDCl_3$) δ 8.65 (s, 2H), 7.98 (m, 4H), 7.84 (m, 4H), 7.69 (m, 3H), 7.56 (d, J=20.0 Hz, 4H), 7.47-7.17 (m, 8H), 7.05 (m, 2H), 3.99 (t, 2H), 3.21 (s, 4H), 2.97 (t, 3H), 2.26 (m, 2H), 0.88 (s, 18H).

Synthesis of a Ligand La098

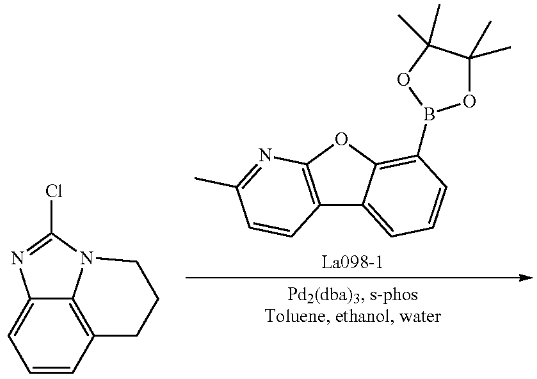

La097-2

-continued

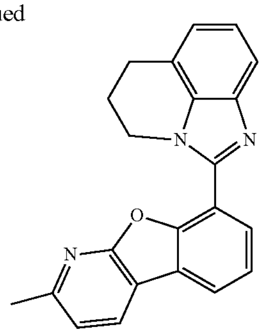

La098

With reference to synthesis and purification methods of the compound La085-3, only the corresponding raw materials were required to be changed. The mass spectrum was: 340.3 (M+H).

Synthesis of a Compound Ir(La098)(Lb005)$_2$

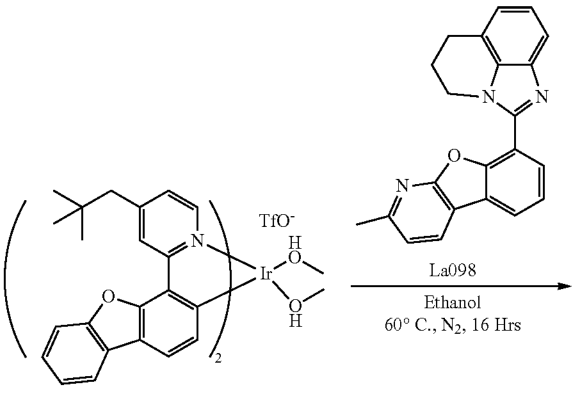

Ir(Lb005)-2

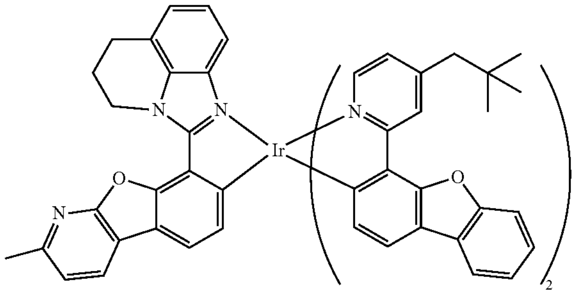

Ir(La098)(Lb005)$_2$

With reference to synthesis and purification methods of the compound Ir(La001)(Lb002)$_2$, only the corresponding raw materials were required to be changed, and 2.02 g of a target compound Ir(La098)(Lb005)$_2$ with a yield of 34.7% was obtained. 2.02 g of the crude product Ir(La098)(Lb005)$_2$ was sublimated and purified to obtain 1.34 g of sublimated and purified Ir(La098)(Lb005)$_2$ with a yield of 66.33%. The mass spectrum was: 1160.4 (M+H). $^1$H NMR (400 MHZ, $CDCl_3$) δ 8.58 (d, J=24.2 Hz, 3H), 7.98 (m, 3H), 7.84 (m, 3H), 7.69 (m, 4H), 7.56 (d, J=20.0 Hz, 3H), 7.48-7.17 (m, 6H), 7.03 (d, J=20.0 Hz, 3H), 3.99 (t, 2H), 3.21 (s, 4H), 2.97 (t, 2H), 2.68 (s, 3H), 2.26 (m, 2H), 0.85 (s, 18H).

Synthesis of a Ligand La099

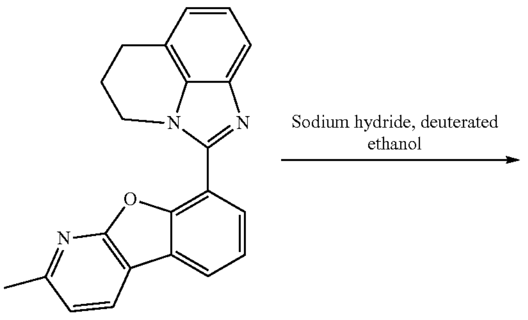

La098

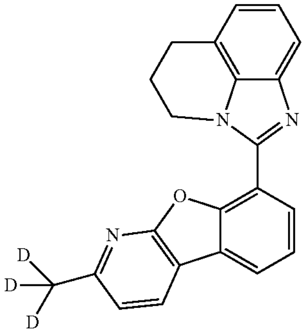

La099

The La098 (6.8 g, 20.04 mmol, 1.0 eq), sodium hydride (1.44 g, 60.11 mmol, 3.0 eq) and deuterated ethanol (102 ml) were put into a 1 L one-necked flask. Vacuumization was performed for nitrogen replacement for 3 times, and the above compounds were heated to 75° C. to carry out a reaction for 16 hours under the protection of nitrogen. A reaction solution was cooled to room temperature. Heavy water (50 ml) was added and stirred to precipitate a solid, and the solid was collected by filtration. The crude product was separated by column chromatography with silica gel (with an eluting agent including dichloromethane and n-hexane at a ratio of 1:15) to obtain a solid, and the solid was recrystallized with dichloromethane (35 ml)/methanol (42 ml) for 2 times to obtain 4.61 g of a compound La099 with a yield of 67.2%. The mass spectrum was: 343.4 (M+H).

Synthesis of a Compound Ir(La099)(Lb005)$_2$

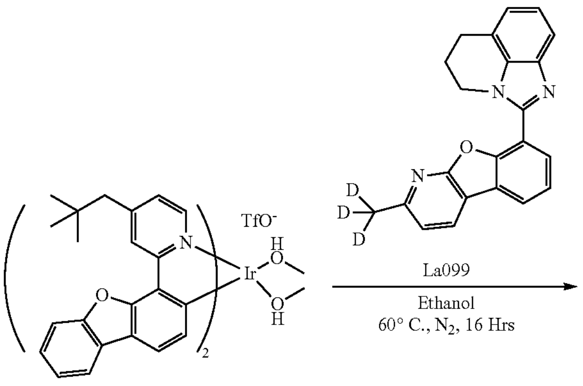

Ir(Lb005)-2

-continued

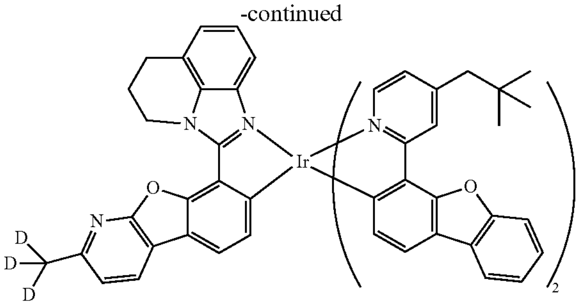

Ir(La099)(Lb005)$_2$

With reference to synthesis and purification methods of the compound Ir(La001)(Lb002)$_2$, only the corresponding raw materials were required to be changed, and 2.07 g of a target compound Ir(La099)(Lb005)$_2$ with a yield of 31.9% was obtained. 2.07 g of the crude product Ir(La099)(Lb005)$_2$ was sublimated and purified to obtain 1.52 g of sublimated and purified Ir(La099)(Lb005)$_2$ with a yield of 73.4%. The mass spectrum was: 1163.4 (M+H). $^1$H NMR (400 MHZ, $CDCl_3$) δ 8.53 (d, J=29.9 Hz, 3H), 7.98 (m, 3H), 7.84 (m, 3H), 7.69 (m, 4H), 7.56 (d, J=20.0 Hz, 3H), 7.48-7.15 (m, 6H), 7.03 (d, J=20.0 Hz, 3H), 3.96 (t, 2H), 3.20 (s, 4H), 2.95 (s, 2H), 2.26 (m, 2H), 0.85 (s, 18H).

Other compounds can be synthesized and sublimated by selecting corresponding materials based on same or similar methods.

Application Example: Manufacturing of an Organic Electroluminescent Device

A glass substrate with a size of 50 mm*50 mm*1.0 mm including an indium tin oxide (ITO, 100 nm) transparent electrode was ultrasonically cleaned in ethanol for 10 minutes, dried at 150° C., and then treated with $N_2$ plasma for 30 minutes. The washed glass substrate was installed on a substrate support of a vacuum evaporation device. At first, a compound HATCN for covering the transparent electrode was evaporated on the surface of the side having a transparent electrode line to form a thin film with a thickness of 5 nm. Then, a layer of HTM1 was evaporated to form a thin film with a thickness of 60 nm. Then, a layer of HTM2 was evaporated on the HTM1 thin film to form a thin film with a thickness of 10 nm. Then, a main material 1, a main material 2 and a doping compound (including a reference compound X and the compound of the present invention) were co-evaporated on the HTM2 film layer to obtain a film with a thickness of 30 nm, wherein the ratio of the main material 1 to the main material 2 to the doping material was 45%:45%:10%. Then, an electron transport layer (ETL) and an electron injection layer (EIL) were sequentially evaporated on a light-emitting layer to obtain a film with a thickness of 35 nm, wherein the ratio of the ETL to the EIL was 10 50%:50%. Finally, a metal Al layer (100 nm) was evaporated to serve as an electrode.

-continued
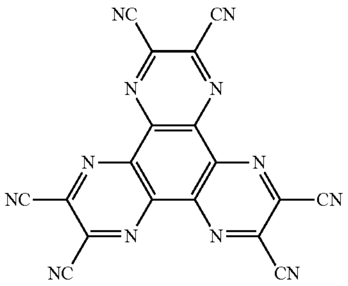
HATCN
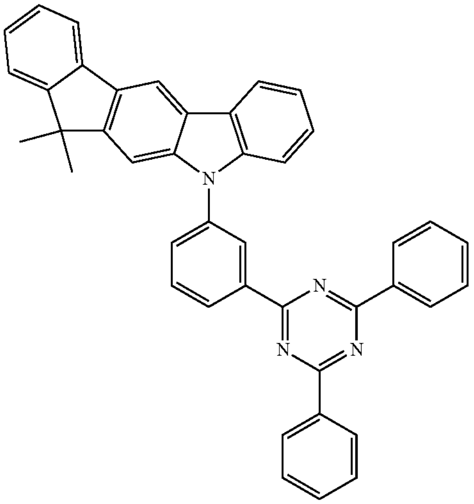
Main material 2
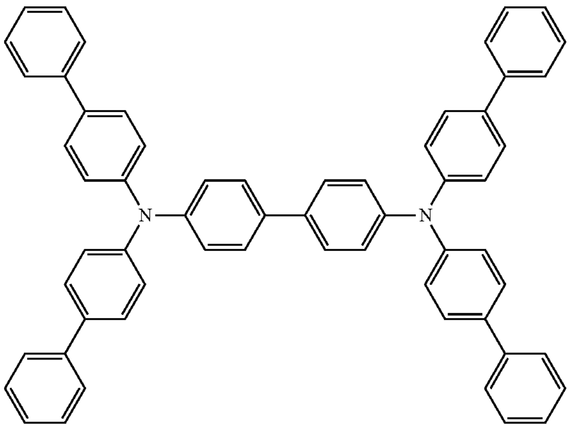
HTM 1
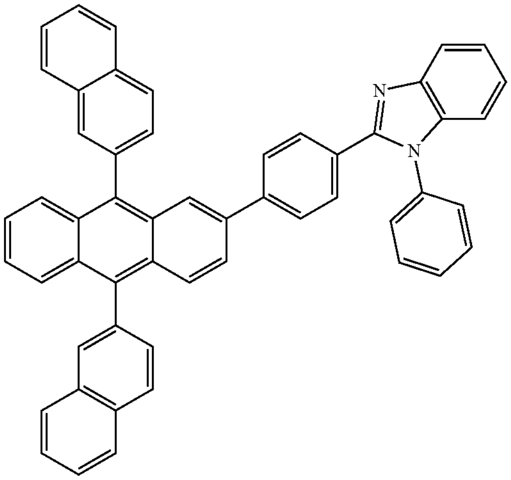
ETL
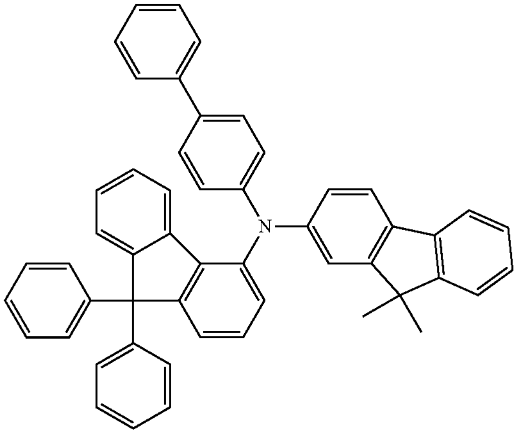
HTM 2
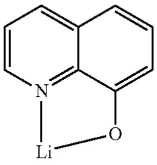
EIL -continued

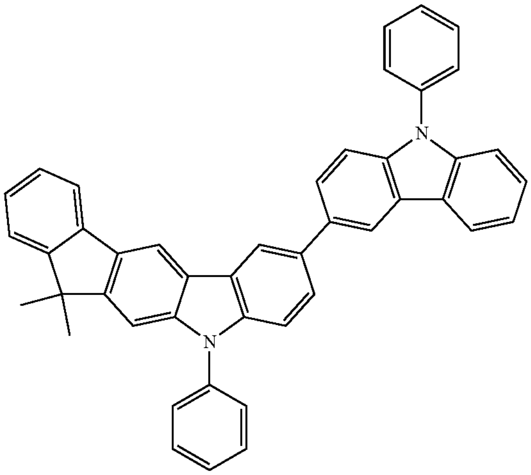

Main material 1

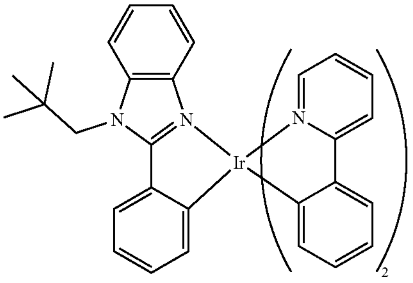

Reference compound 4

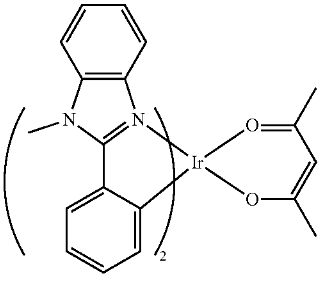

Reference compound 1

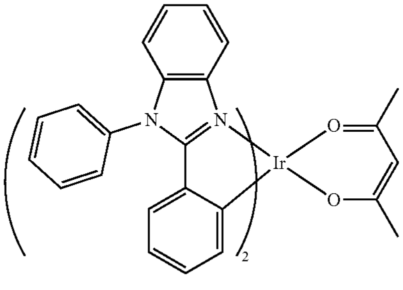

Reference compound 2

-continued

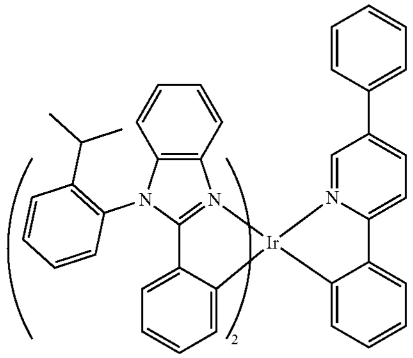

Reference compound 3

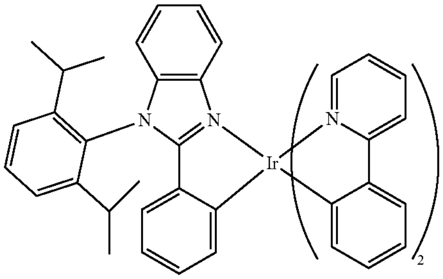

Reference compound 5

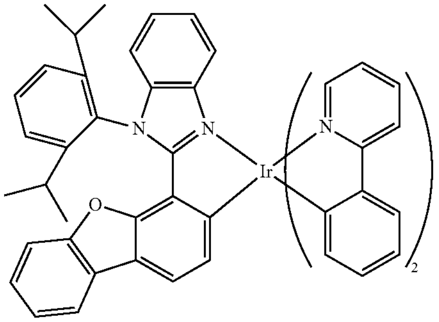

Reference compound 6

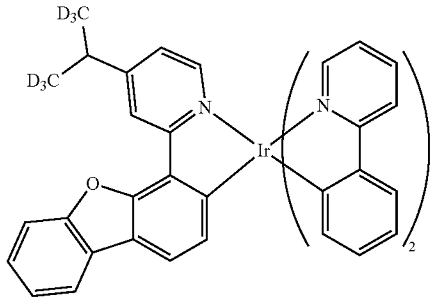

Reference compound 7

Evaluation: Properties of a device obtained above were tested. In various examples and comparative examples, a constant-current power supply (Keithley 2400) was used, a current at a fixed density was used for flowing through light-emitting elements, and a spectroradiometer (CS 2000) was used for testing the light-emitting spectrum. Meanwhile, the voltage value was measured, and the time (LT95) when the brightness was reduced to 95% of the initial brightness was tested. Results are shown as 10 follows.

| | Doping material | Peak wavelength nm | FWHM nm | Starting voltage V | Current efficiency Cd/A | LT95@ 10000 nits |
|---|---|---|---|---|---|---|
| Example 1 | $Ir(La001)(Lb002)_2$ | 521 | 41 | 4.40 | 80 | 330 |
| Example 2 | $Ir(La001)(Lb005)_2$ | 525 | 38 | 4.41 | 82 | 360 |
| Example 3 | $Ir(La001)(Lb012)_2$ | 520 | 35 | 4.37 | 84 | 332 |
| Example 4 | $Ir(La001)_2(Lb012)$ | 529 | 48 | 4.42 | 79 | 316 |
| Example 5 | Ir(La001)(Lb012)(Lc003) | 525 | 46 | 4.39 | 79 | 295 |
| Example 6 | Ir(La001)(Lb012)(Lc008) | 526 | 47 | 4.40 | 80 | 297 |
| Example 7 | Ir(La001)(Lb012)(Lc026) | 528 | 46 | 4.41 | 81 | 300 |
| Example 8 | Ir(La001)(Lb012)(Lc062) | 523 | 42 | 4.38 | 84 | 378 |
| Example 9 | Ir(La001)(Lb001)(Lb012) | 525 | 43 | 4.42 | 82 | 326 |
| Example 10 | Ir(La001)(La033)(Lb012) | 528 | 40 | 4.44 | 82 | 366 |
| Example 11 | $Ir(La005)_2(Lb012)$ | 521 | 37 | 4.36 | 85 | 389 |
| Example 12 | Ir(La033)(Lb012)(Lc008) | 520 | 44 | 4.32 | 79 | 292 |
| Example 13 | Ir(La034)(Lb012)(Lc008) | 521 | 45 | 4.33 | 81 | 296 |
| Example 14 | Ir(La035)(Lb012)(Lc008) | 523 | 47 | 4.36 | 82 | 309 |
| Example 15 | Ir(La036)(Lb012)(Lc008) | 519 | 47 | 4.36 | 80 | 299 |
| Example 16 | Ir(La037)(Lb012)(Lc008) | 526 | 43 | 4.33 | 83 | 318 |
| Example 17 | Ir(La057)(Lb012)(Lc008) | 527 | 42 | 4.32 | 84 | 329 |
| Example 18 | $Ir(La085)(Lb005)_2$ | 524 | 41 | 4.41 | 83 | 332 |
| Example 19 | $Ir(La093)(Lb005)_2$ | 526 | 45 | 4.43 | 80 | 312 |
| Example 20 | $Ir(La097)(Lb005)_2$ | 521 | 45 | 4.38 | 81 | 356 |
| Example 21 | $Ir(La098)(Lb005)_2$ | 519 | 46 | 4.42 | 79 | 329 |
| Example 22 | $Ir(La099)(Lb005)_2$ | 520 | 47 | 4.39 | 80 | 412 |
| Comparative Example 1 | Reference compound 1 | 509 | 73 | 5.01 | 53 | 60 |
| Comparative Example 2 | Reference compound 2 | 530 | 76 | 5.11 | 77 | 152 |
| Comparative Example 3 | Reference compound 3 | 549 | 69 | 4.86 | 76 | 183 |
| Comparative Example 4 | Reference compound 4 | 523 | 75 | 5.06 | 52 | 98 |
| Comparative Example 5 | Reference compound 5 | 519 | 72 | 4.82 | 54 | 121 |
| Comparative Example 6 | Reference compound 6 | 528 | 66 | 4.76 | 72 | 130 |
| Comparative Example 7 | Reference compound 7 | 524 | 68 | 4.92 | 71 | 200 |

Through comparison of the data in the above table, it can be seen that compared with reference compounds, the compound of the present invention used as a dopant in an organic electroluminescent device has more excellent properties, such as driving voltage, luminous efficiency and device service life.

The above results show that the compound of the present invention has the advantages of high optical and electrical stability, narrow emission half-peak width, high color saturation, high luminous efficiency, long device service life and the like, and can be used in organic electroluminescent devices. In particular, the compound has the potential for application in the OLED industry as a green light-emitting dopant.

The invention claimed is:

1. An organometallic compound, having a general formula of Ir(La)(Lb)(Lc), wherein La is a structure represented by Formula (1):

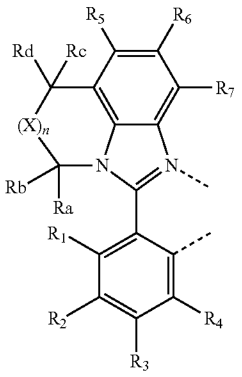

(1)

wherein dotted lines refer to positions connected to the metal Ir;

X is O, S, Se, CRpRq, SiRrRs or NRt;

n is an integer from 0 to 3, and when the n is equal to or greater than 2, multiple X groups are present at the same time and are the same or different;

Ra, Rb, Rc, Rd, Rp, Rq, Rr, Rs and Rt are independently selected from hydrogen, deuterium, halogen, substituted or unsubstituted $C_1$-$C_{10}$ alkyl, substituted or unsubstituted $C_3$-$C_{20}$cycloalkyl, substituted or unsubstituted $C_6$-$C_{18}$ aryl, or substituted or unsubstituted $C_2$-$C_{17}$heteroaryl;

$R_1$-$R_7$ are independently selected from hydrogen, deuterium, halogen, hydroxyl, sulfhydryl, substituted or unsubstituted $C_1$-$C_{10}$ alkyl, substituted or unsubstituted $C_1$-$C_{10}$heteroalkyl, substituted or unsubstituted $C_3$-$C_{20}$cycloalkyl, substituted or unsubstituted $C_2$-$C_{10}$ alkenyl, substituted or unsubstituted $C_2$-$C_{10}$alkynyl, substituted or unsubstituted $C_6$-$C_{18}$ aryl, substituted or unsubstituted $C_2$-$C_{17}$heteroaryl, substituted or unsubstituted tri-$C_1$-$C_{10}$ alkyl silyl, substituted or unsubstituted tri-$C_6$-$C_{12}$ aryl silyl, substituted or unsubstituted di-$C_1$-$C_{10}$ alkyl mono-$C_6$-$C_{30}$ aryl silyl, or substituted or unsubstituted mono-$C_1$-$C_{10}$ alkyl di-$C_6$-$C_{30}$ aryl silyl, or any two adjacent groups of the $R_1$-$R_7$ are connected to each other to form an aliphatic ring structure or an aromatic ring structure;

the heteroalkyl and the heteroaryl at least contain one O, N or S heteroatom;

both Lb and Lc are a monoanionic bidentate ligand, the La, the Lb and the Lc are the same or at least one is different, and the different indicates different parent nuclear structures, a same parent nuclear structure with different substituents, or a same parent nuclear structure with different substituent positions;

and the "substituted" refers to substitution with deuterium, F, Cl, Br, $C_1$-$C_6$ alkyl, $C_3$-$C_6$cycloalkyl, amino substituted with $C_1$-$C_6$ alkyl, cyano, isocyano, or phosphino, and the substitution ranges from a single substitution number to a maximum substitution number.

2. The organometallic compound according to claim 1, wherein the X is CRpRq; the Ra, the Rb, the Rc, the Rd, the Rp and the Rq are independently selected from hydrogen, deuterium, halogen, substituted or unsubstituted $C_1$-$C_{10}$ alkyl, or substituted or unsubstituted $C_3$-$C_{20}$cycloalkyl;

and the "substituted" refers to substitution with deuterium, F, Cl, Br, $C_1$-$C_6$ alkyl, or $C_3$-$C_6$cycloalkyl, and the substitution ranges from a single substitution number to a maximum substitution number.

3. The organometallic compound according to claim 2, wherein the $R_4$ and the $R_7$ are independently selected from hydrogen, the $R_1$-$R_3$ and the $R_5$-$R_6$ are independently selected from hydrogen, deuterium, halogen, hydroxyl, substituted or unsubstituted $C_1$-$C_{10}$ alkyl, substituted or unsubstituted $C_1$-$C_{10}$heteroalkyl, substituted or unsubstituted $C_3$-$C_{20}$cycloalkyl, substituted or unsubstituted $C_6$-$C_{18}$ aryl, or substituted or unsubstituted $C_2$-$C_{17}$heteroaryl, or any two adjacent groups of the $R_1$-$R_2$ are connected to each other to form an aliphatic ring.

4. The organometallic compound according to claim 3, wherein the Ra, the Rb, the Rc, the Rd, the Rp and the Rq are independently selected from hydrogen, deuterium, or substituted or unsubstituted $C_1$-$C_{10}$ alkyl;

the $R_4$ and the $R_7$ are independently selected from hydrogen; the $R_3$, the $R_5$ and the $R_6$ are independently selected from hydrogen, deuterium, halogen, substituted or unsubstituted $C_1$-$C_{10}$ alkyl, substituted or unsubstituted $C_3$-$C_{20}$cycloalkyl, and substituted or unsubstituted $C_6$-$C_{18}$ aryl; and the $R_1$ and the $R_2$ are selected from hydrogen, deuterium, halogen, hydroxyl, substituted or unsubstituted$C_1$-$C_{10}$ alkyl, substituted or unsubstituted$C_1$-$C_{10}$heteroalkyl, substituted or unsubstituted $C_6$-$C_{18}$ aryl, or substituted or unsubstituted $C_2$-$C_{17}$heteroaryl, or any two adjacent groups are connected to each other to form an aliphatic ring.

5. The organometallic compound according to claim 1, wherein the Lb is a structure represented by Formula (2):

(2)

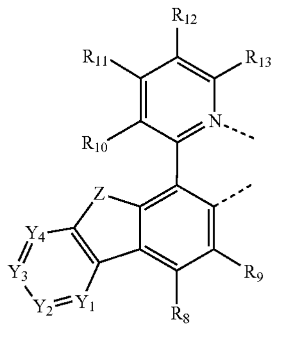

wherein dotted lines refer to positions connected to the metal Ir;

$Y_1$-$Y_4$ are independently selected from $CR_0$ or N;

Z is O, S, Se, CRpRq, SiRrRs or NRt;

$R_0$ and $R_8$-$R_{13}$ are independently selected from hydrogen, deuterium, halogen, hydroxyl, sulfhydryl, substituted or unsubstituted $C_1$-$C_{10}$ alkyl, substituted or unsubstituted $C_1$-$C_{10}$heteroalkyl, substituted or unsubstituted $C_3$-$C_{20}$cycloalkyl, substituted or unsubstituted $C_2$-$C_{10}$ alkenyl, substituted or unsubstituted $C_2$-$C_{10}$alkynyl, substituted or unsubstituted $C_6$-$C_{18}$ aryl, substituted or unsubstituted $C_2$-$C_{17}$heteroaryl, substituted or unsubstituted tri-$C_1$-$C_{10}$ alkyl silyl, substituted or unsubstituted tri-$C_6$-$C_{12}$ aryl silyl, substituted or unsubstituted di-$C_1$-$C_{10}$ alkyl mono-$C_6$-$C_{30}$ aryl silyl, or substituted or unsubstituted mono-$C_1$-$C_{10}$ alkyl di-$C_6$-$C_{30}$ aryl silyl, or any two adjacent groups of the $R_8$-$R_{13}$ are connected to each other to form an aliphatic ring structure or an aromatic ring structure;

the heteroalkyl and the heteroaryl at least contain one O, N or S heteroatom;

Rp, Rq, Rr, Rs and Rt are defined the same as claim 1;

and the "substituted" refers to substitution with deuterium, F, Cl, Br, $C_1$-$C_6$ alkyl, $C_3$-$C_6$cycloalkyl, amino substituted with $C_1$-$C_6$ alkyl, cyano, isocyano, or phosphino, and the substitution ranges from a single substitution number to a maximum substitution number.

6. The organometallic compound according to claim 5, wherein the $Y_1$-$Y_3$ are independently selected from $CR_0$; the $Y_4$ is independently selected from $CR_0$ or N; the Z is O;

the $R_0$ and the $R_8$-$R_{13}$ are independently selected from hydrogen, deuterium, halogen, substituted or unsubstituted $C_1$-$C_{10}$ alkyl, substituted or unsubstituted $C_1$-$C_{10}$heteroalkyl, substituted or unsubstituted $C_3$-$C_{20}$cycloalkyl, substituted or unsubstituted $C_6$-$C_{18}$ aryl, or substituted or unsubstituted $C_2$-$C_{17}$heteroaryl, or any two adjacent groups of the $R_8$-$R_{13}$ are connected to each other to form an aliphatic ring structure or an aromatic ring structure;

and the "substituted" refers to substitution with deuterium, F, Cl, Br, $C_1$-$C_6$ alkyl, or $C_3$-$C_6$cycloalkyl, and the substitution ranges from a single substitution number to a maximum substitution number.

7. The organometallic compound according to claim 6, wherein the $R_0$, the $R_9$ and the $R_{10}$ are independently selected from hydrogen, the $R_{11}$-$R_{13}$ are independently selected from hydrogen, deuterium, halogen, substituted or unsubstituted $C_1$-$C_{10}$ alkyl, substituted or unsubstituted $C_1$-$C_{10}$heteroalkyl, or substituted or unsubstituted $C_3$-$C_{20}$cycloalkyl, or any two adjacent groups of the $R_8$-$R_{13}$ are connected to each other to form an aliphatic ring structure or an aromatic ring structure.

8. The organometallic compound according to claim 1, wherein the Lc is the same as the La or the Lb, and the La is different from the Lb.

9. The organometallic compound according to claim 1, wherein the Lc is a structure represented by Formula (3):

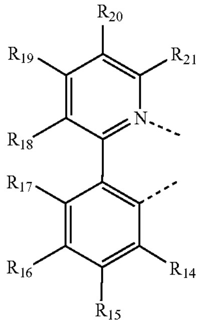

(3)

wherein dotted lines refer to positions connected to the metal Ir;

$R_{14}$-$R_{21}$ are independently selected from hydrogen, deuterium, halogen, hydroxyl, sulfhydryl, substituted or unsubstituted $C_1$-$C_{10}$ alkyl, substituted or unsubstituted $C_1$-$C_{10}$heteroalkyl, substituted or unsubstituted $C_3$-$C_{20}$cycloalkyl, substituted or unsubstituted $C_2$-$C_{10}$ alkenyl, substituted or unsubstituted $C_2$-$C_{10}$alkynyl, substituted or unsubstituted $C_6$-$C_{18}$ aryl, substituted or unsubstituted $C_2$-$C_{17}$heteroaryl, substituted or unsubstituted tri-$C_1$-$C_{10}$ alkyl silyl, substituted or unsubstituted tri-$C_6$-$C_{12}$ aryl silyl, substituted or unsubstituted di-$C_1$-$C_{10}$ alkyl mono-$C_6$-$C_{30}$ aryl silyl, or substituted or unsubstituted mono-$C_1$-$C_{10}$ alkyl di-$C_6$-$C_{30}$ aryl silyl, or any two adjacent groups of the $R_{14}$-$R_{21}$ are connected to each other to form an aliphatic ring structure or an aromatic ring structure;

the heteroalkyl and the heteroaryl at least contain one O, N or S heteroatom;

and the "substituted" refers to substitution with deuterium, F, Cl, Br, $C_1$-$C_6$ alkyl, $C_3$-$C_6$cycloalkyl, amino substituted with $C_1$-$C_6$ alkyl, cyano, isocyano, or phosphino, and the substitution ranges from a single substitution number to a maximum substitution number.

10. The organometallic compound according to claim 9, wherein the $R_{14}$-$R_{21}$ are independently selected from hydrogen, deuterium, halogen, hydroxyl, sulfhydryl, substituted or unsubstituted $C_1$-$C_{10}$ alkyl, substituted or unsubstituted $C_1$-$C_{10}$heteroalkyl, substituted or unsubstituted $C_3$-$C_{20}$cycloalkyl, substituted or unsubstituted $C_6$-$C_{18}$ aryl, or substituted or unsubstituted $C_2$-$C_{17}$heteroaryl, or any two adjacent groups of the $R_{14}$-$R_{21}$ are connected to each other to form an aliphatic ring structure or an aromatic ring structure;

the heteroalkyl and the heteroaryl at least contain one O, N or S heteroatom;

and the "substituted" refers to substitution with deuterium, F, Cl, Br, $C_1$-$C_6$ alkyl, or $C_3$-$C_6$cycloalkyl, and the substitution ranges from a single substitution number to a maximum substitution number.

11. The organometallic compound according to claim 10, wherein the $R_{17}$ and the $R_{18}$ are connected to each other to form a five-membered or six-membered aliphatic ring or aromatic ring structure.

12. The organometallic compound according to claim 1, wherein the La has one of the following structural formulas, or one of the following structural formulas in which the hydrogen atom(s) is/are partially or completely deuterated, or one of the following structural formulas in which the hydrogen atom(s) is/are partially or completely fluorinated, La001

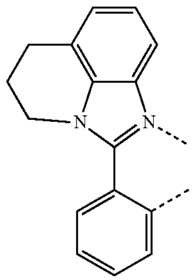

La002

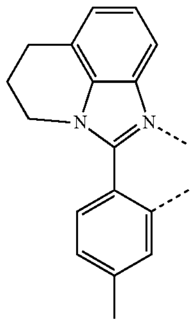

La003

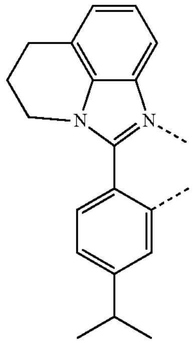

La004

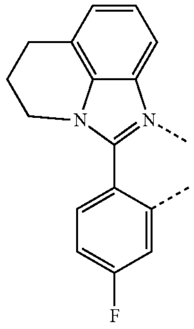

-continued
La005
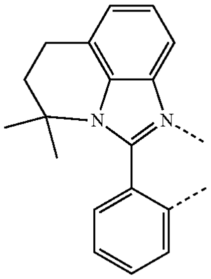
La006
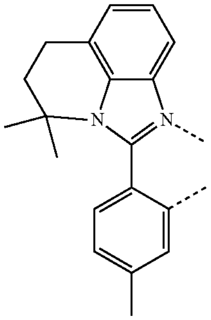
La007
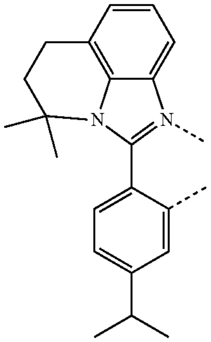
La008
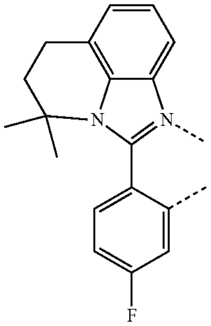
La009
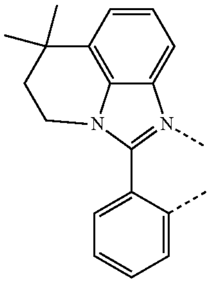
-continued
La010
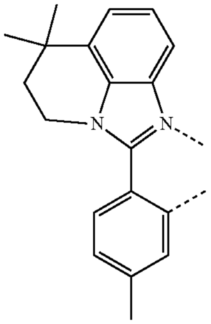
La011
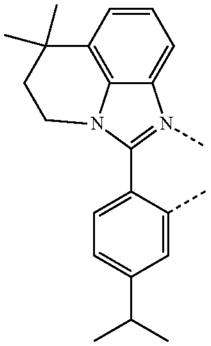
La012
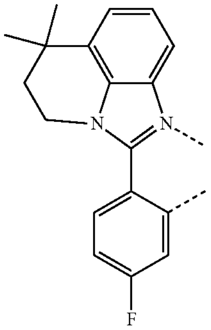
La013
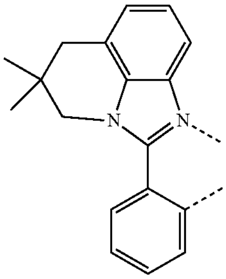
La014
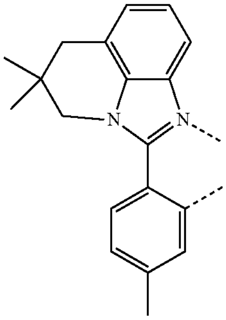

-continued
La015
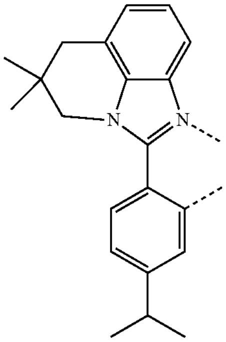
La016
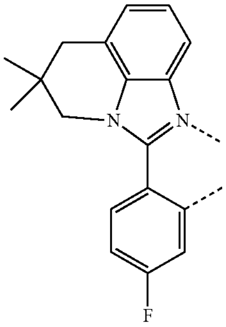
La017
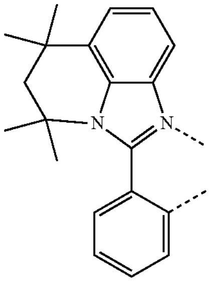
La018
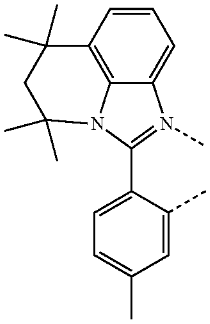
La019
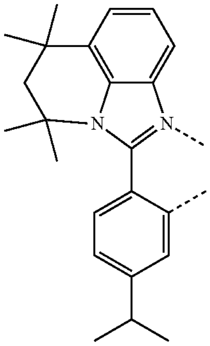
-continued
La020
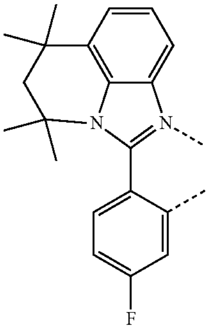
La021
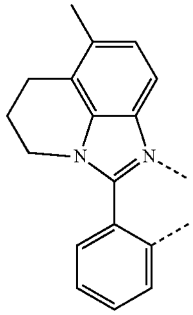
La022
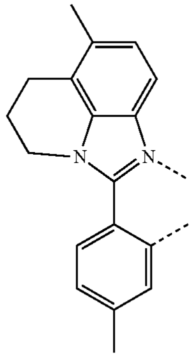
La023
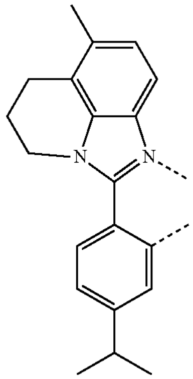

-continued
La024
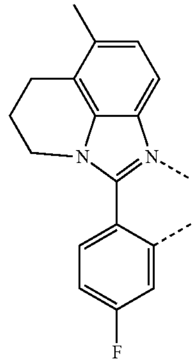
La025
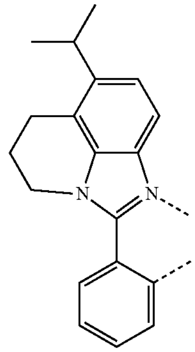
La026
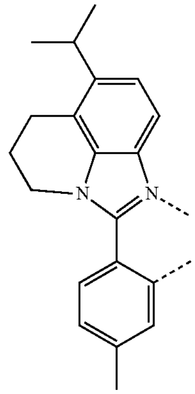
La027
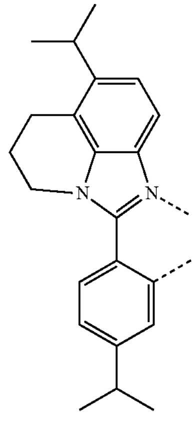
-continued
La028
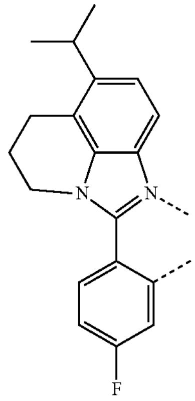
La029
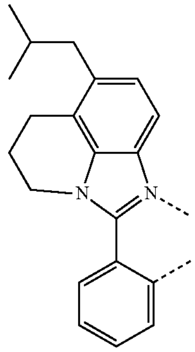
La030
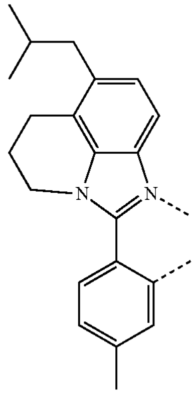
La031
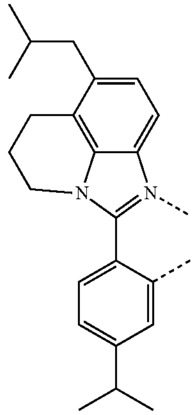

-continued
La032
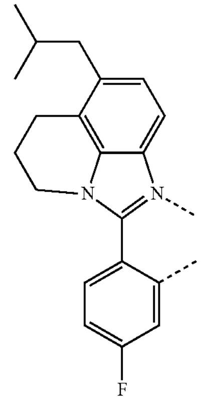
La033
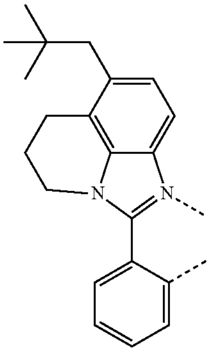
La034
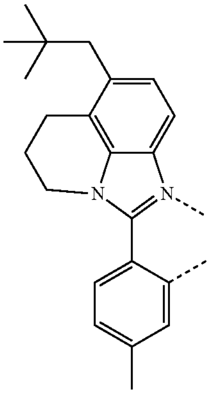
La035
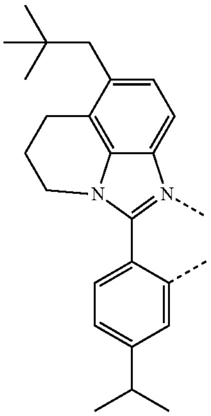
-continued
La036
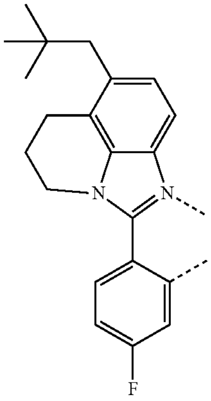
La037
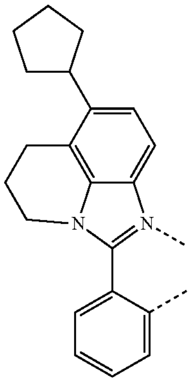
La038
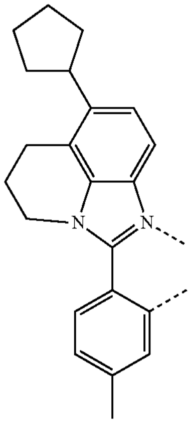
La039
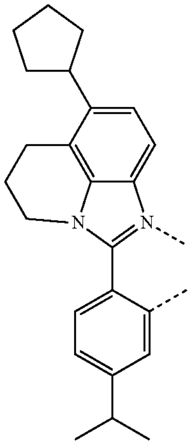

-continued
La040
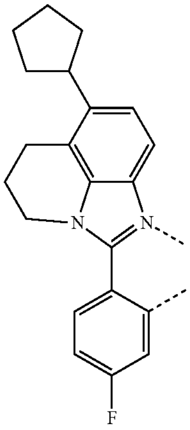
La041
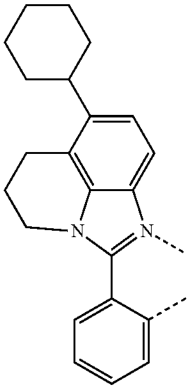
La042
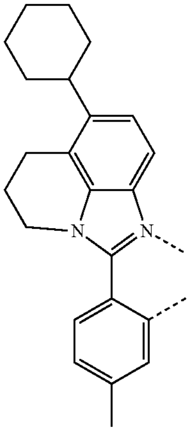
-continued
La043
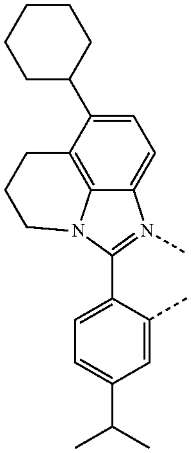
La044
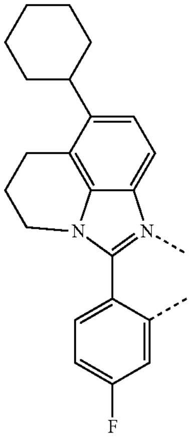
La045
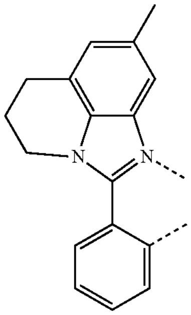
La046
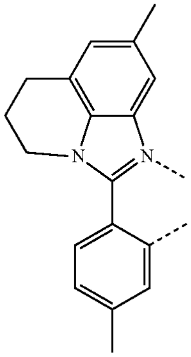

-continued
La047
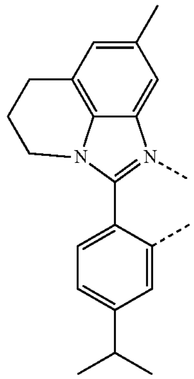
La048
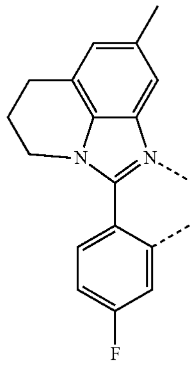
La049
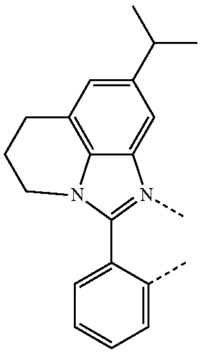
La050
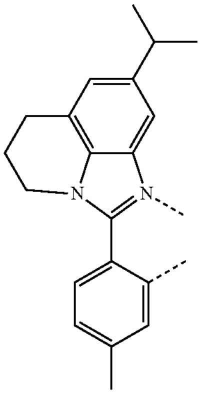
-continued
La051
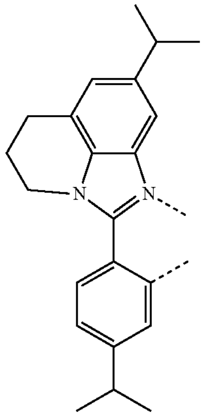
La052
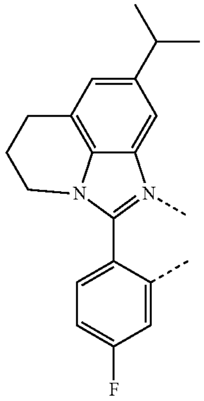
La053
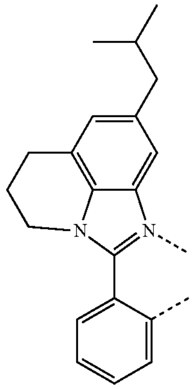
La054
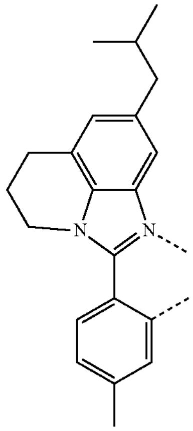

La055
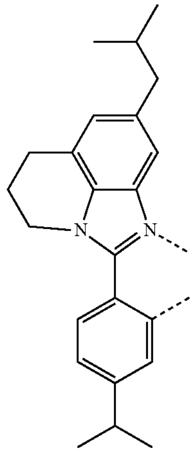
La056
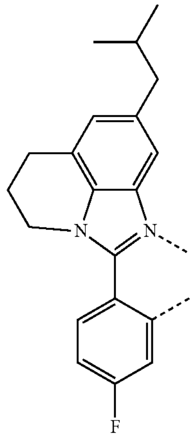
La057
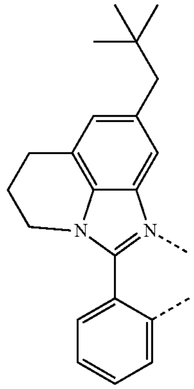
La058
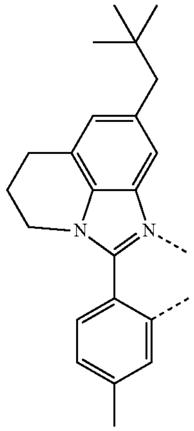
La059
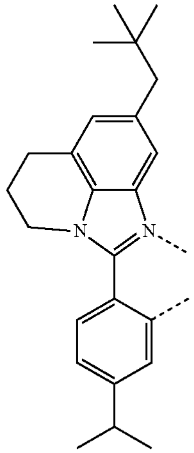
La060
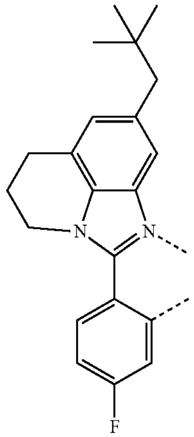

-continued
La061
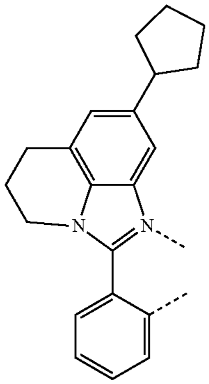
La062
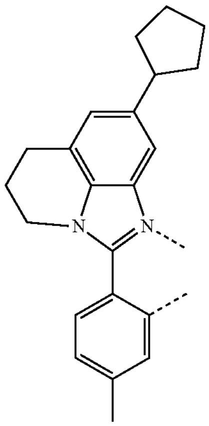
La063
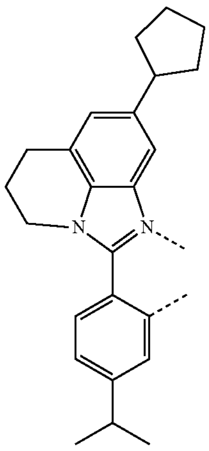
-continued
La064
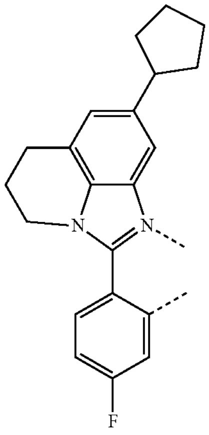
La065
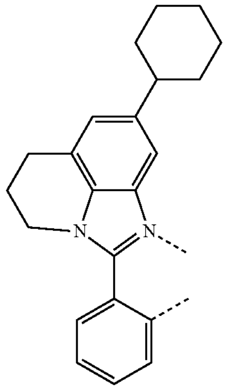
La066
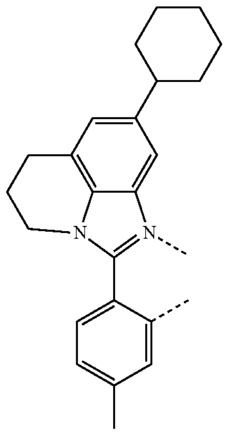

-continued
La067
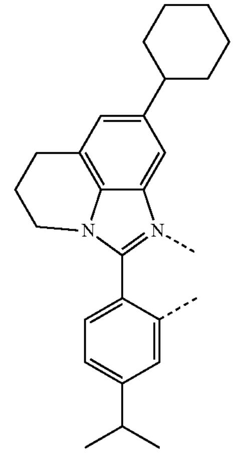
La068
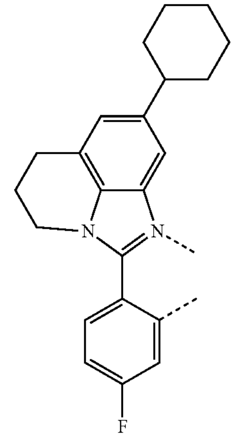
La069
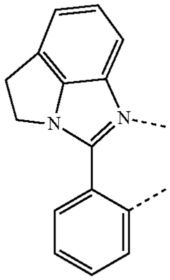
La070
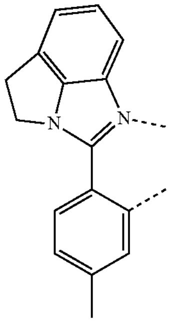
-continued
La071
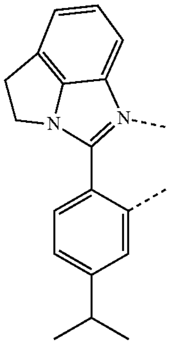
La072
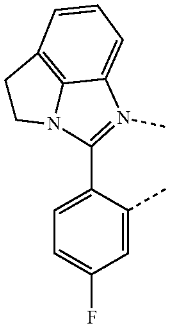
La073
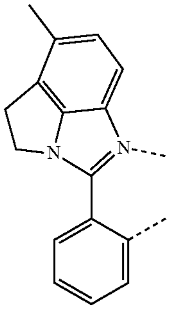
La074
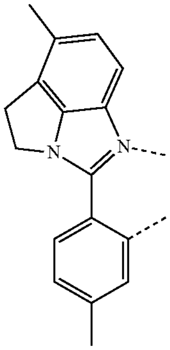

-continued
La075
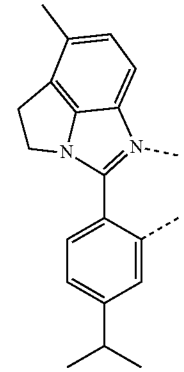
La076
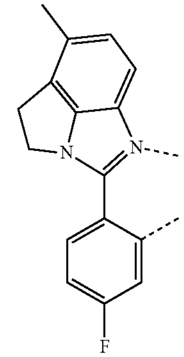
La077
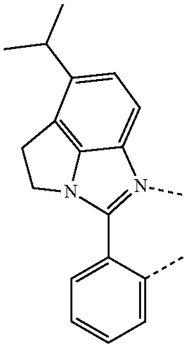
La078
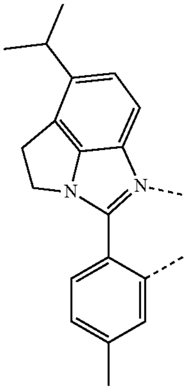
-continued
La079
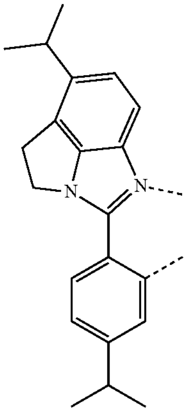
La080
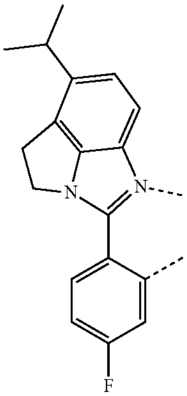
La081
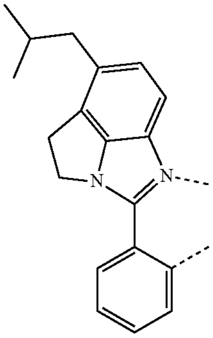
La082
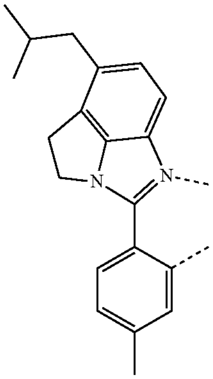

-continued
La083
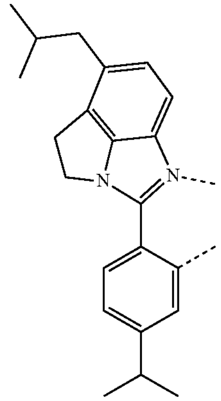
La084
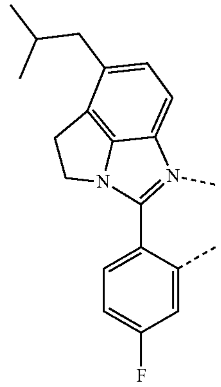
La085
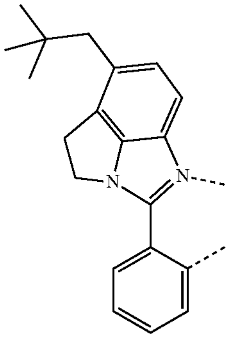
La086
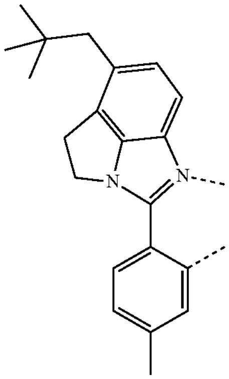
-continued
La087
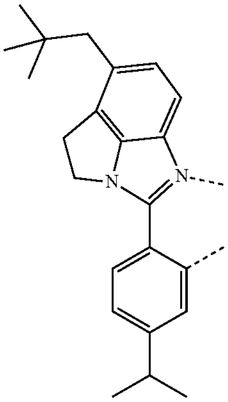
La088
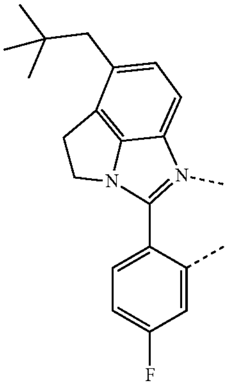
La089
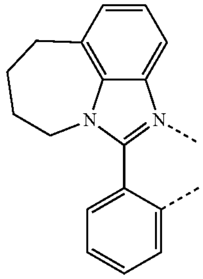
La090
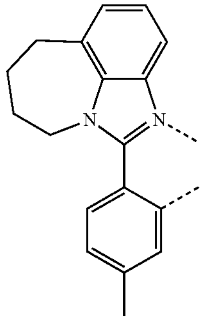

-continued
La091
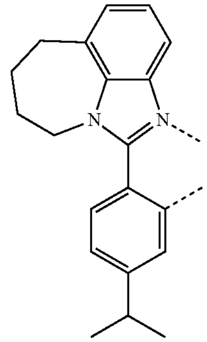
La092
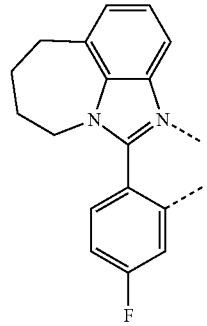
La093
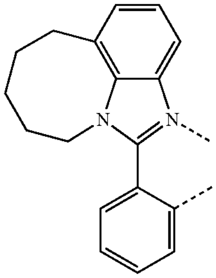
La094
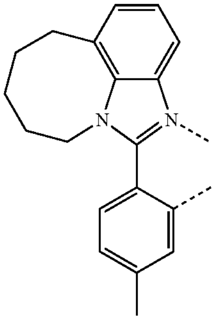
La095
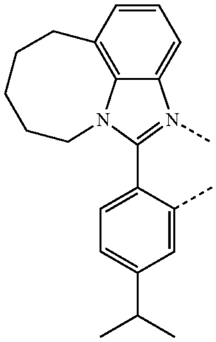
-continued
La096
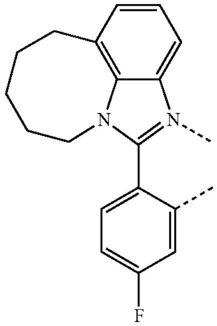
La097
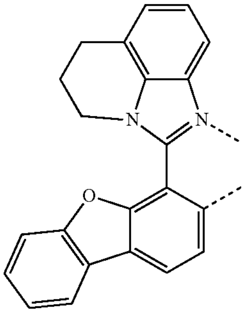
La098
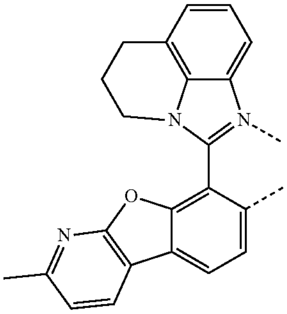
La099
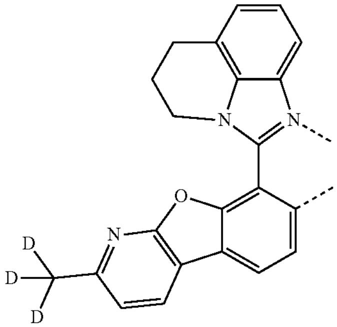

-continued
La100
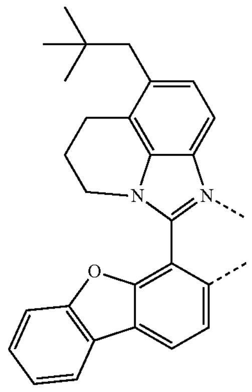
La101
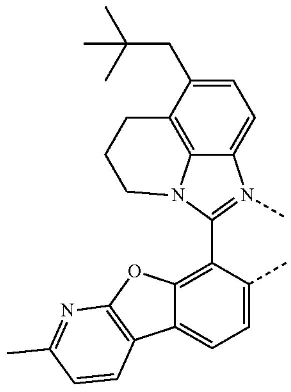
La102
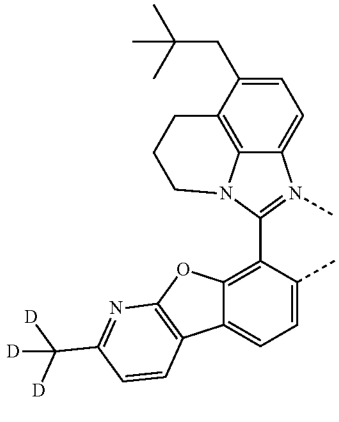
La103
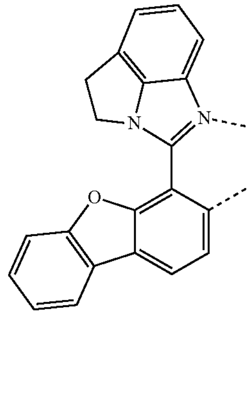
La104
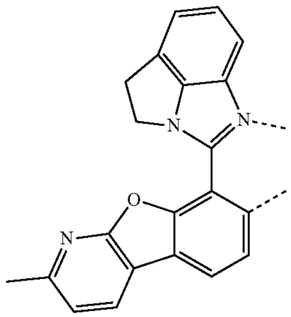
La105
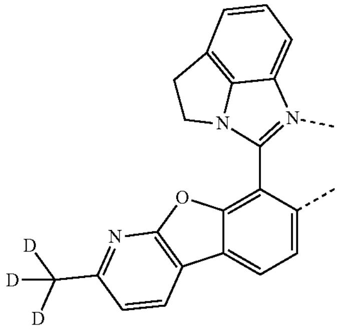
La106
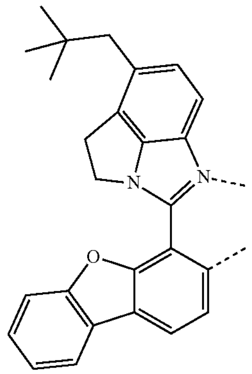
La107
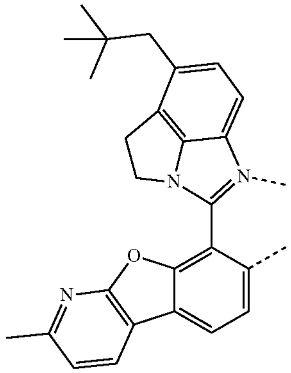

-continued
La108
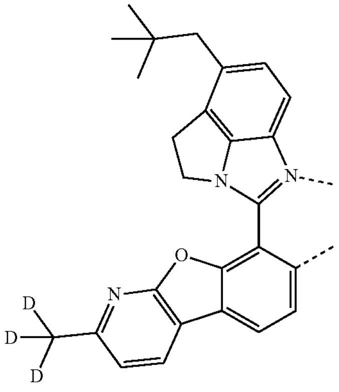
La109
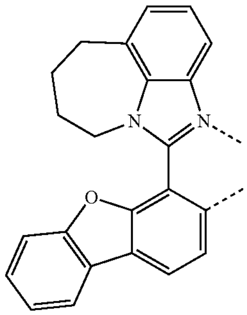
La110
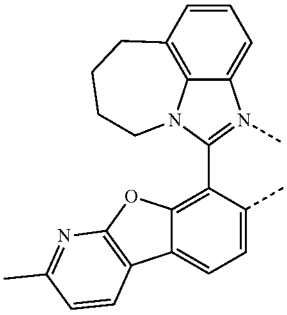
La111
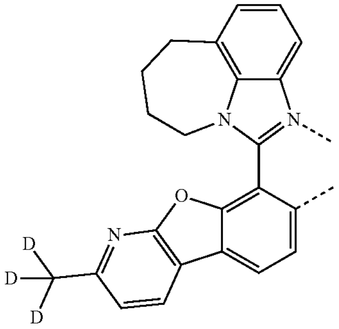
-continued
La112
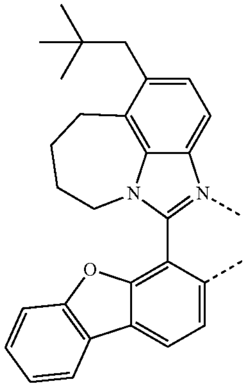
La113
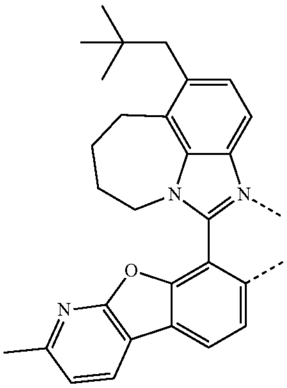
La114
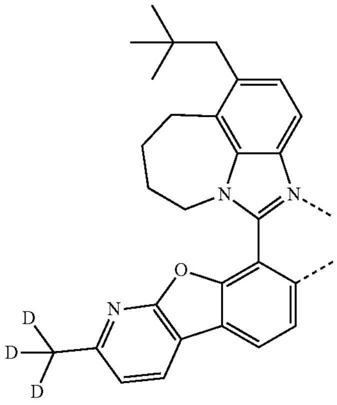
La115
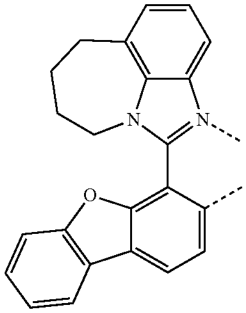

La116

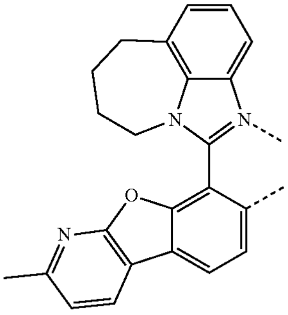

La117

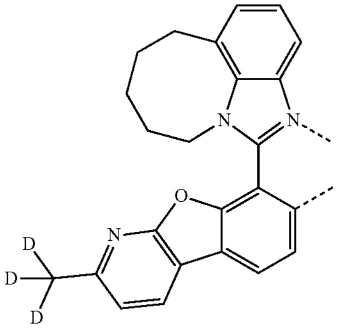

La118

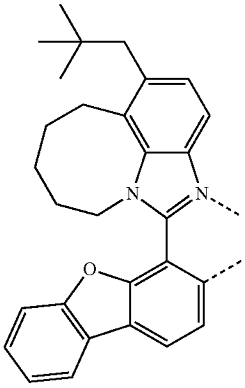

La119

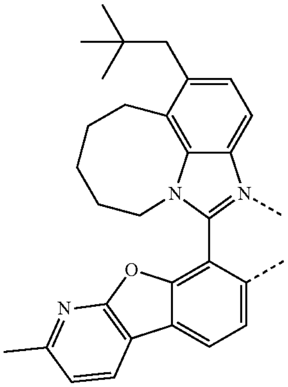

La120

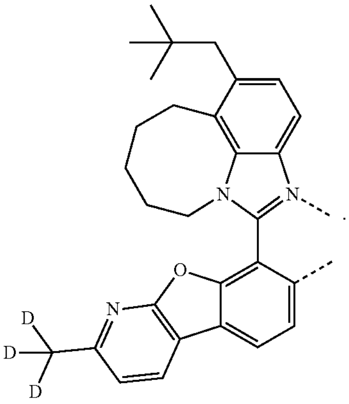

13. The organometallic compound according to claim 5, wherein the Lb has one of the following structural formulas, or one of the following structural formulas in which the hydrogen atom(s) is/are partially or completely deuterated, or one of the following structural formulas in which the hydrogen atom(s) is/are partially or completely fluorinated, Lb001

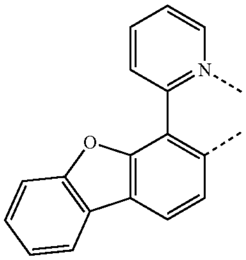

Lb002

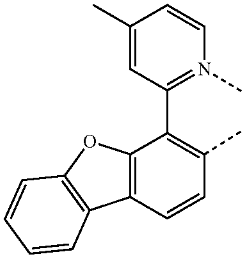

Lb003

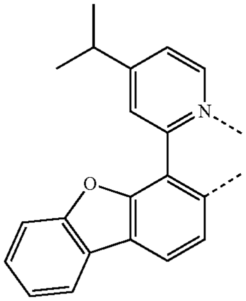

Lb004
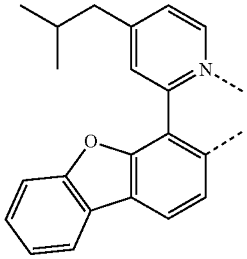
Lb005
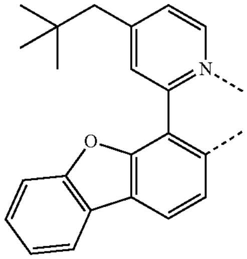
Lb006
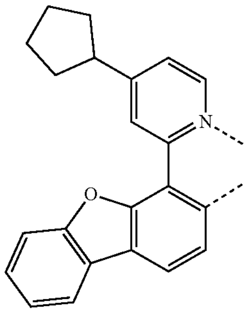
Lb007
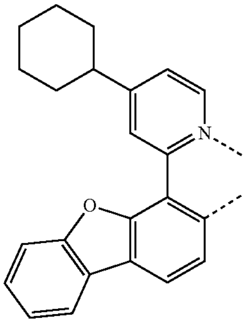
Lb008
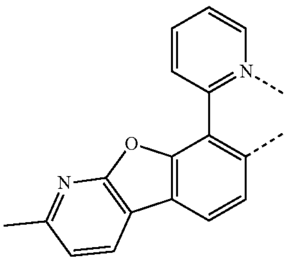
Lb009
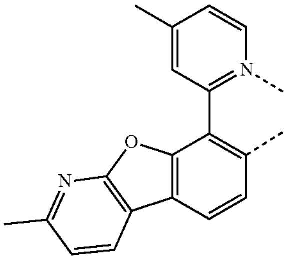
Lb010
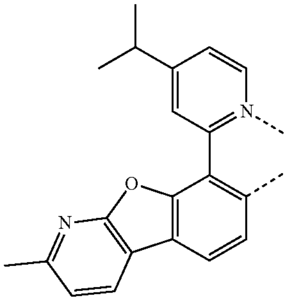
Lb011
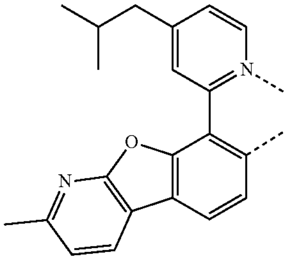
Lb012
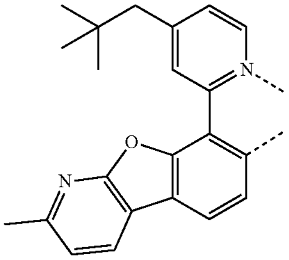
Lb013
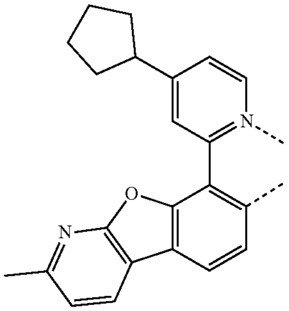

-continued
Lb014
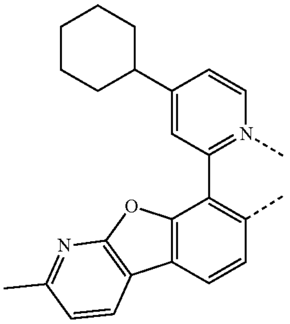
Lb015
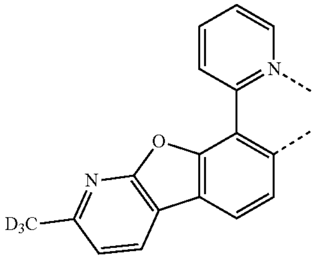
Lb016
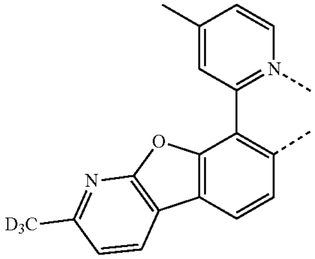
Lb017
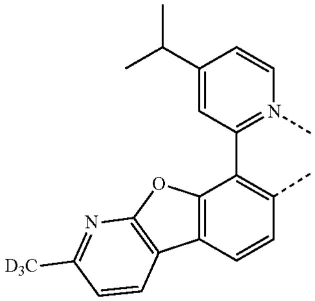
Lb018
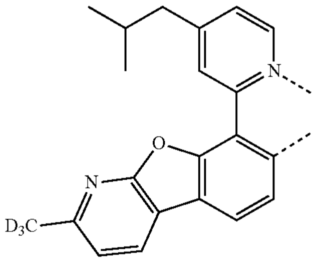
-continued
Lb019
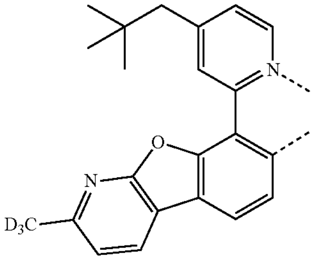
Lb020
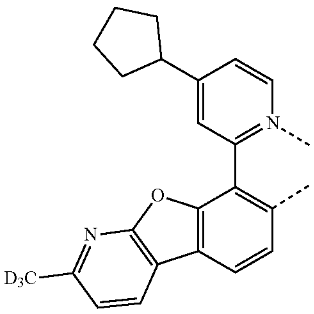
Lb021
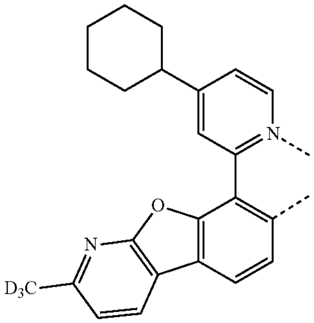
Lb022
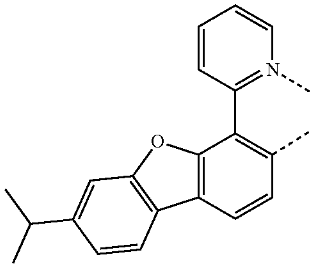
Lb023
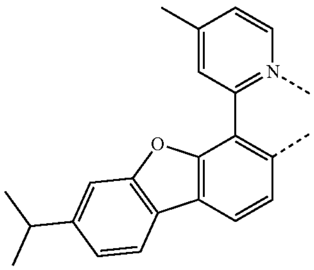

Lb024
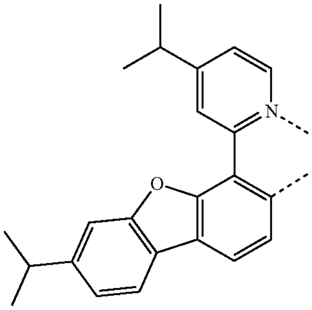
Lb025
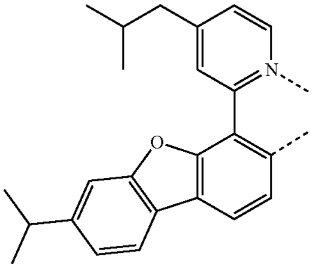
Lb026
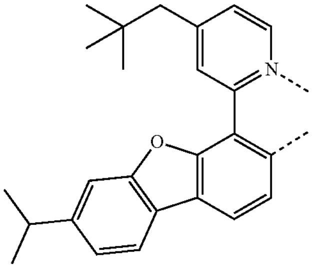
Lb027
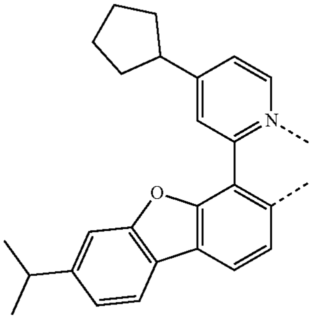
Lb028
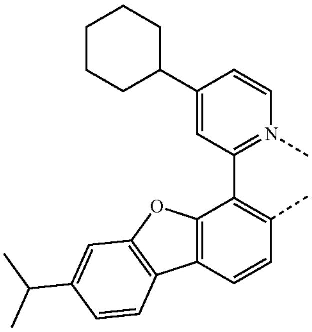
Lb029
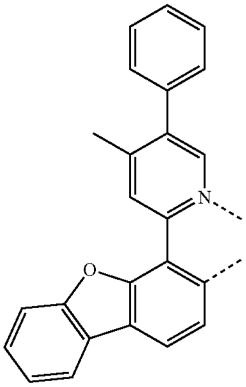
Lb030
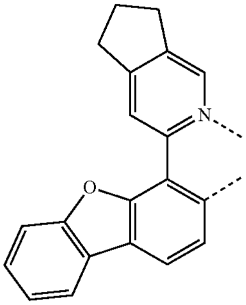
Lb031
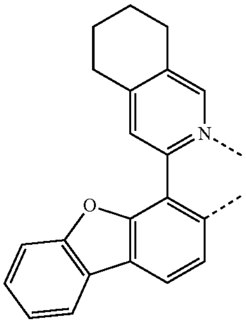
Lb032
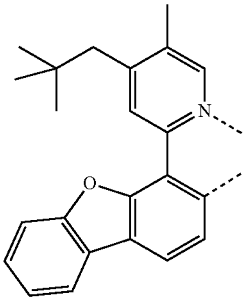
Lb033
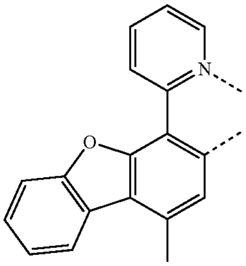

-continued
Lb034
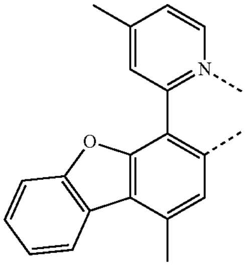
Lb035
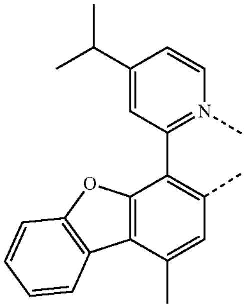
Lb036
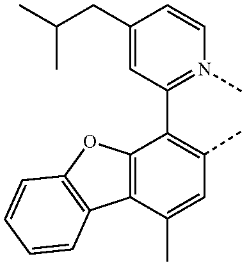
Lb037
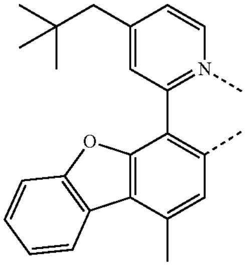
Lb038
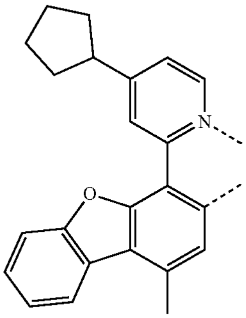
-continued
Lb039
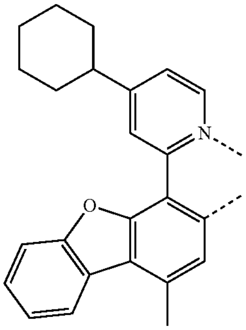
Lb040
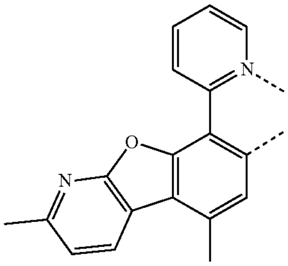
Lb041
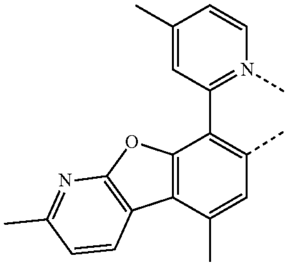
Lb042
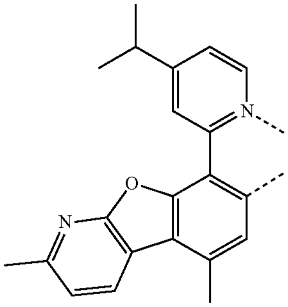
Lb043
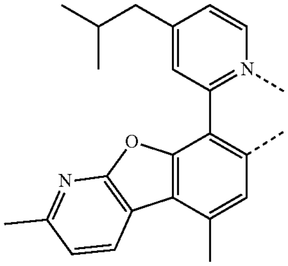

-continued
Lb044
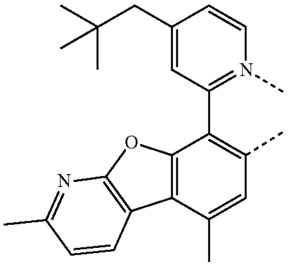
Lb045
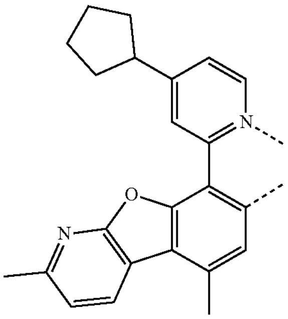
Lb046
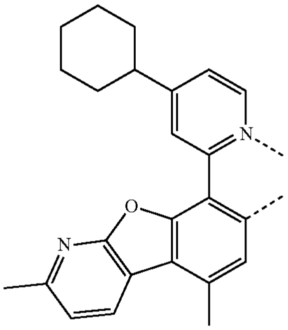
Lb047
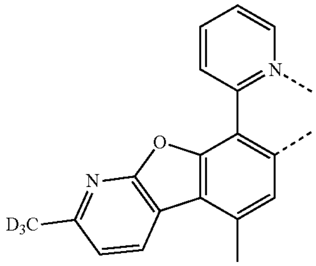
Lb048
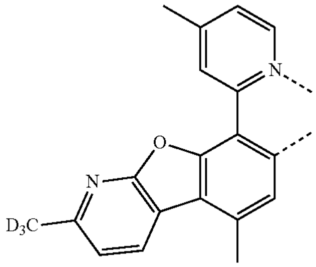
-continued
Lb049
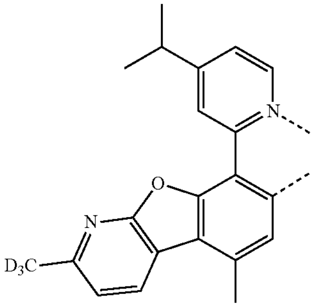
Lb050
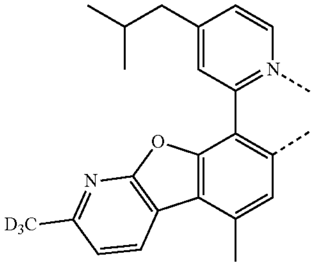
Lb051
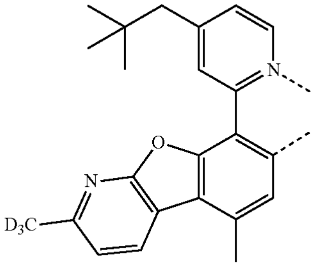
Lb052
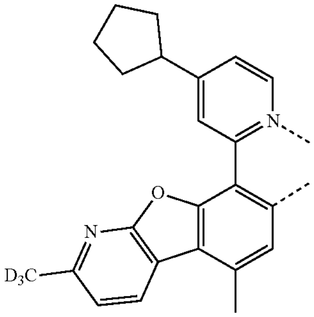
Lb053
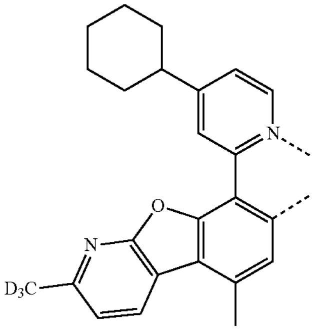

-continued
Lb054
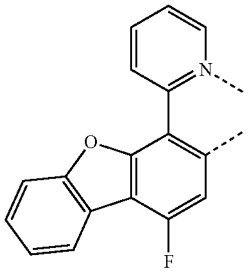
Lb055
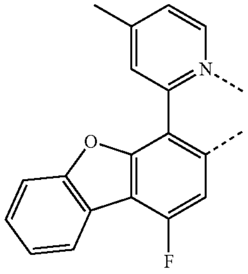
Lb056
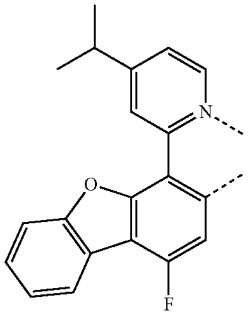
Lb057
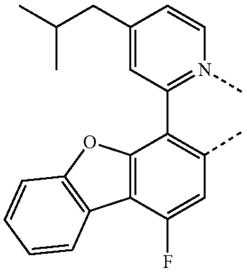
Lb058
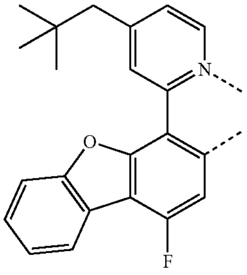
-continued
Lb059
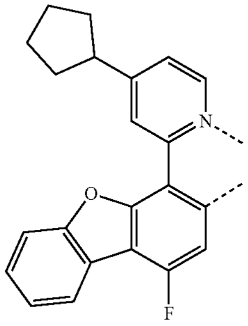
Lb060
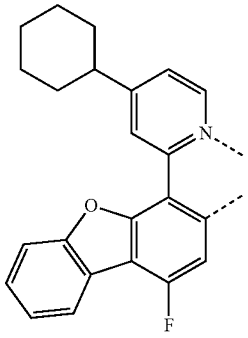
Lb061
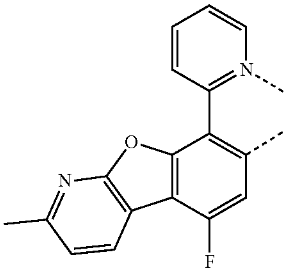
Lb062
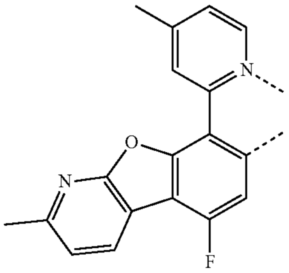
Lb063
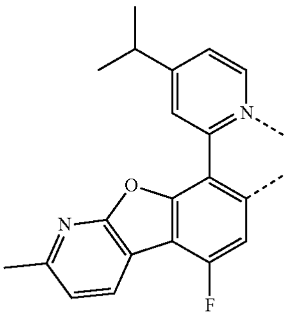

-continued
Lb064
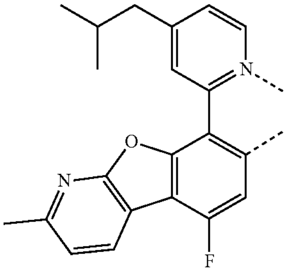
Lb065
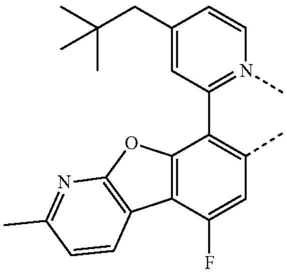
Lb066
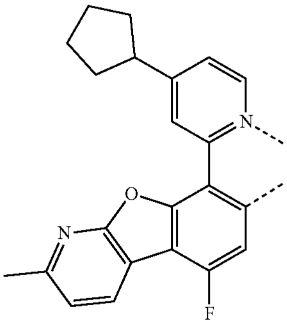
Lb067
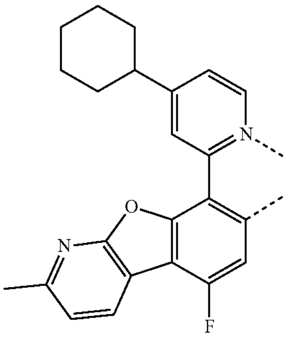
Lb068
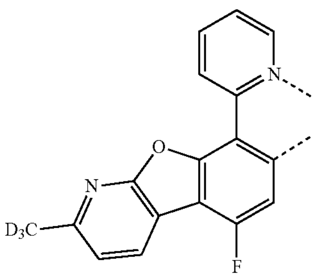
-continued
Lb069
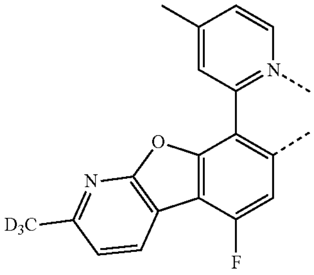
Lb070
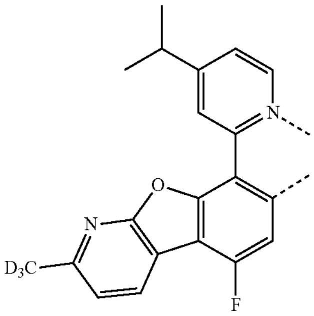
Lb071
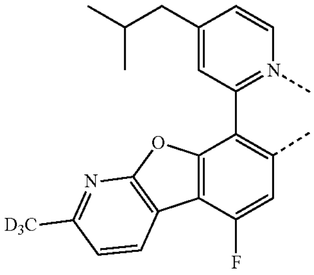
Lb072
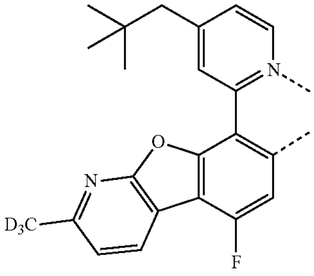
Lb073
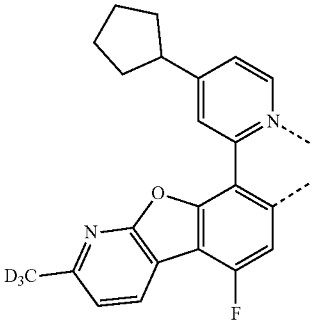

-continued
Lb074
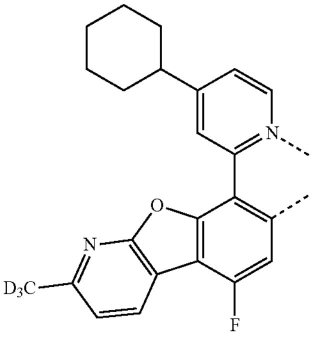
Lb075
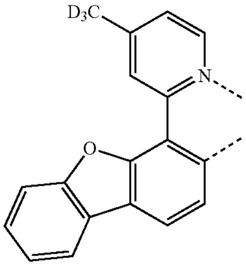
Lb076
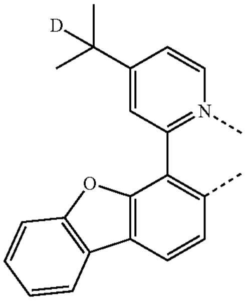
Lb077
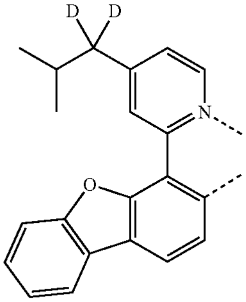
Lb078
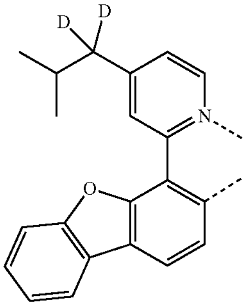
-continued
Lb079
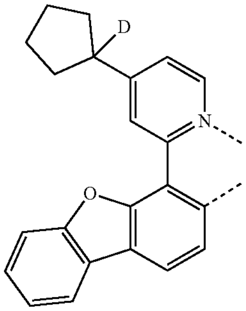
Lb080
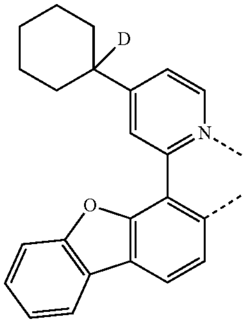
Lb081
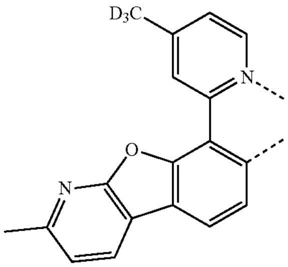
Lb082
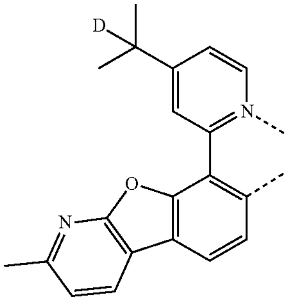
Lb083
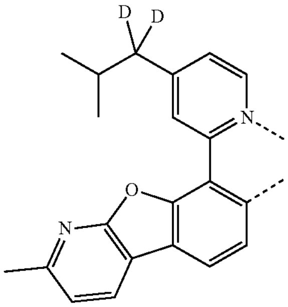

-continued

Lb084

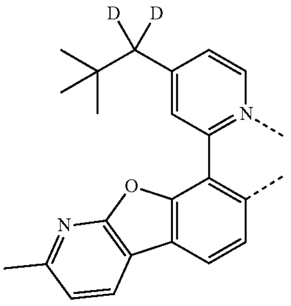

Lb085

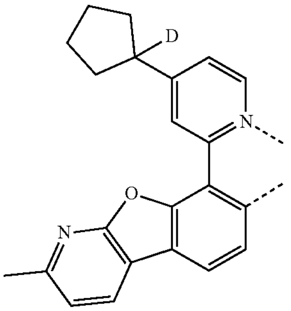

Lb086

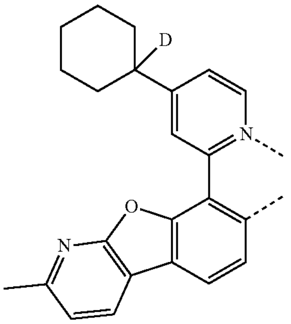

Lb087

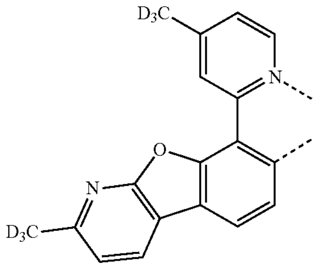

Lb088

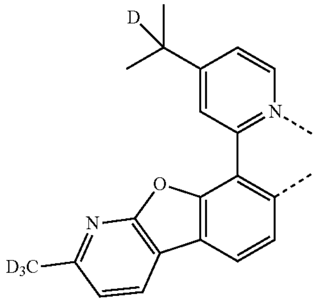

-continued

Lb089

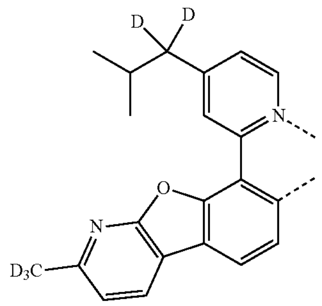

Lb090

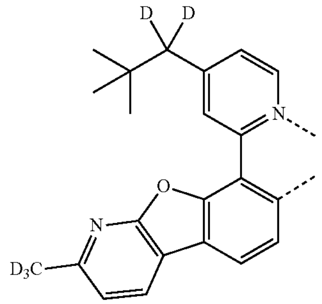

Lb091

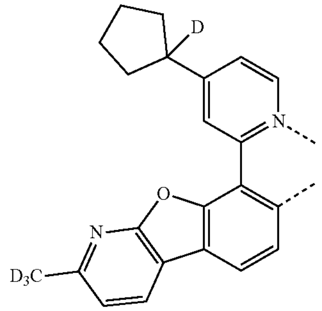

Lb092

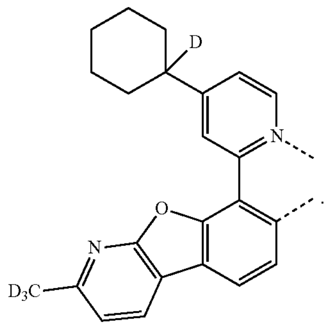

14. The organometallic compound according to claim 9, wherein the Lc has one of the following structural formulas, or one of the following structural formulas in which the hydrogen atom(s) is/are partially or completely deuterated, or one of the following structural formulas in which the hydrogen atom(s) is/are partially or completely fluorinated, -continued
Lc001
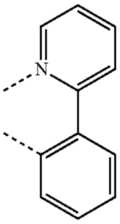
Lc002
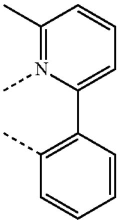
Lc003
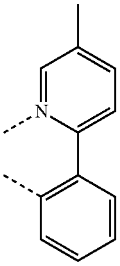
Lc004
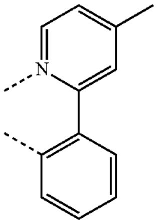
Lc005
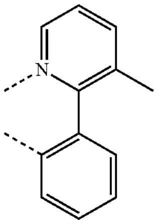
Lc006
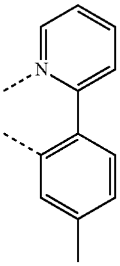
Lc007
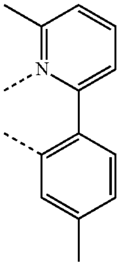
Lc008
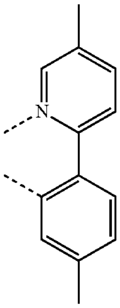
Lc009
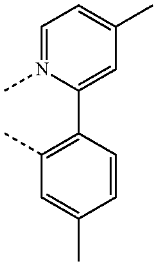
Lc010
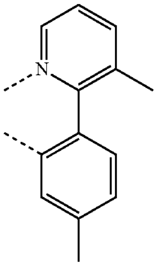
Lc011
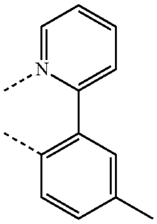
Lc012
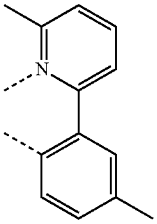

-continued
Lc013
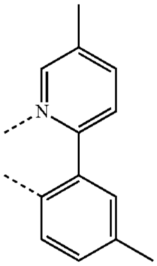
Lc014
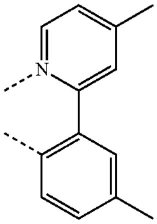
Lc015
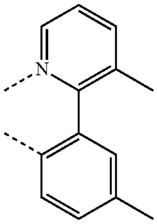
Lc016
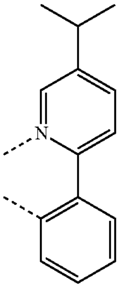
Lc017
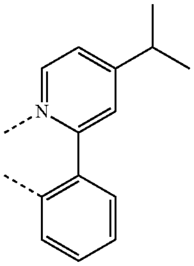
Lc018
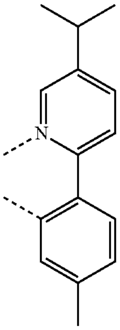
-continued
Lc019
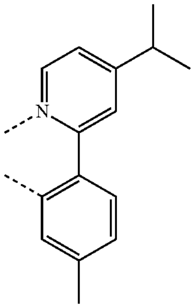
Lc020
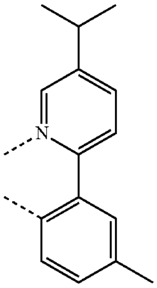
Lc021
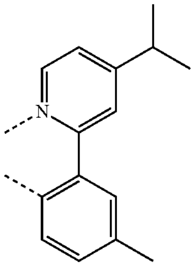
Lc022
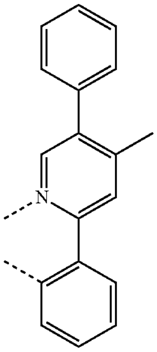
Lc023
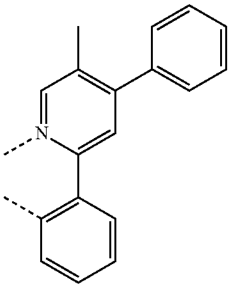

Lc024
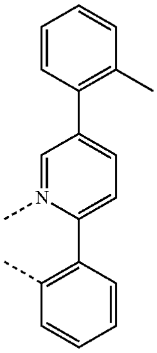
Lc025
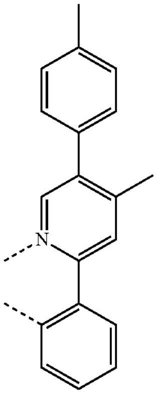
Lc026
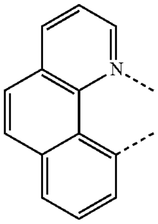
Lc027
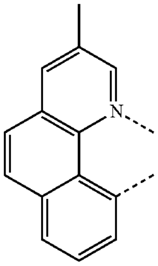
Lc028
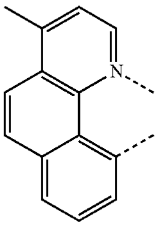
Lc029
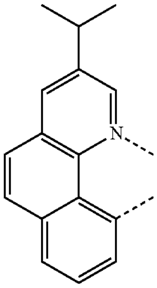
Lc030
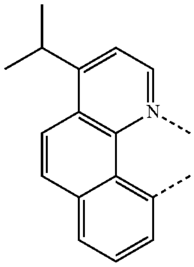
Lc031
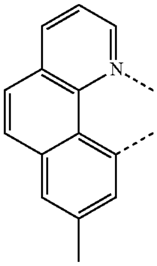
Lc032
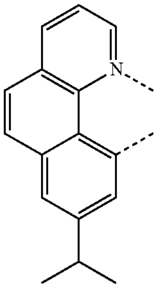
Lc033
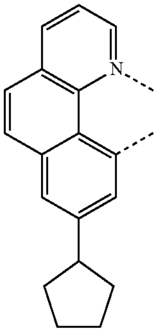

-continued
Lc034
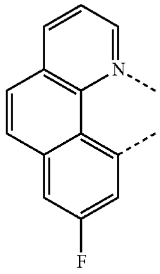
Lc035
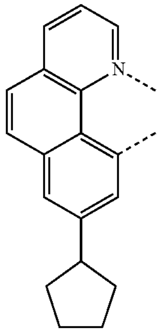
Lc036
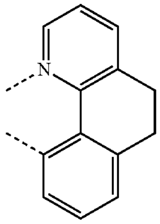
Lc037
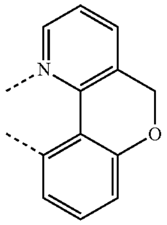
Lc038
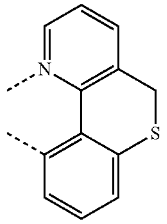
Lc039
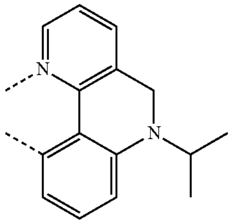
-continued
Lc040
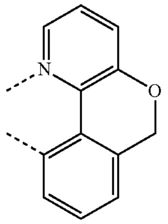
Lc041
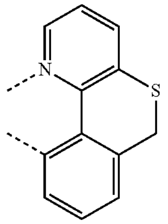
Lc042
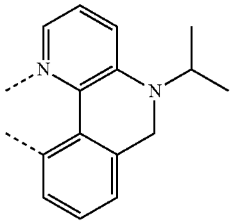
Lc043
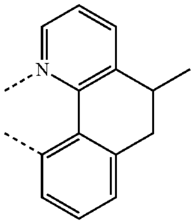
Lc044
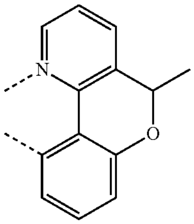
Lc045
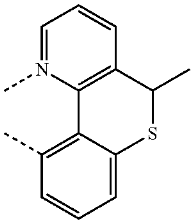
Lc046
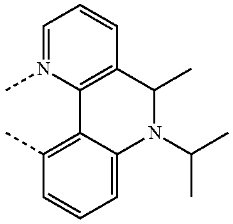

-continued
Lc047
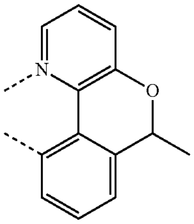
Lc048
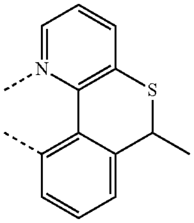
Lc049
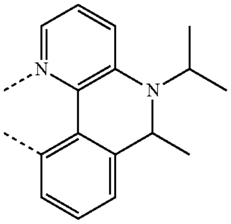
Lc050
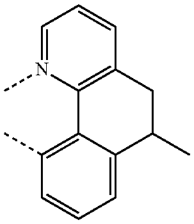
Lc051
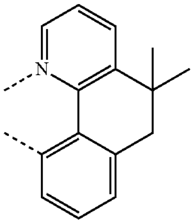
Lc052
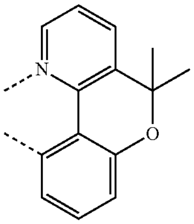
Lc053
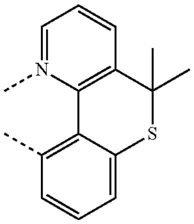
-continued
Lc054
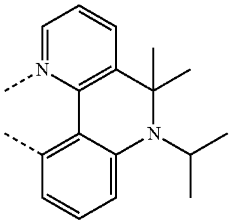
Lc055
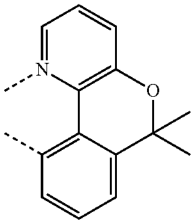
Lc056
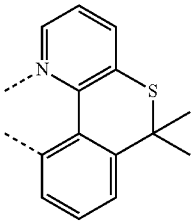
Lc057
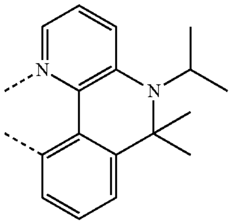
Lc058
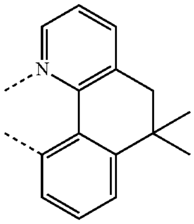
Lc059
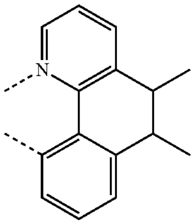
Lc060
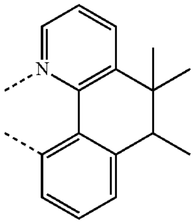

-continued
Lc061
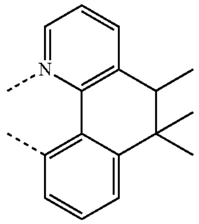
Lc062
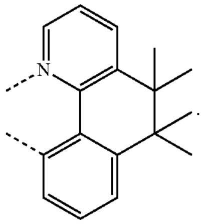
15. An organic electroluminescent device, wherein the device comprises the organometallic compound of claim 1.
16. The organicelectroluminescent device of claim 15, comprising a light-emitting layer, wherein the light-emitting layer comprises the organometallic compound of claim 1.
* * * * *